(12) United States Patent
Barbour

(10) Patent No.: US 11,907,029 B2
(45) Date of Patent: Feb. 20, 2024

(54) PORTABLE BLOCKCHAIN MINING SYSTEM AND METHODS OF USE

(71) Applicant: Upstream Data Inc., Lloydminster (CA)

(72) Inventor: Stephen Barbour, Lloydminster (CA)

(73) Assignee: Upstream Data Inc., Lloydminster (CA)

( * ) Notice: Subject to any disclaimer, the term of this patent is extended or adjusted under 35 U.S.C. 154(b) by 319 days.

(21) Appl. No.: 17/100,740

(22) PCT Filed: Mar. 31, 2020

(86) PCT No.: PCT/CA2020/050426
§ 371 (c)(1),
(2) Date: Nov. 20, 2020

(87) PCT Pub. No.: WO2020/227811
PCT Pub. Date: Nov. 19, 2020

(65) Prior Publication Data
US 2021/0318735 A1 Oct. 14, 2021

Related U.S. Application Data

(60) Provisional application No. 62/848,573, filed on May 15, 2019.

(51) Int. Cl.
*H05K 7/14* (2006.01)
*H05K 7/20* (2006.01)
(Continued)

(52) U.S. Cl.
CPC ............... *G06F 1/20* (2013.01); *G05B 15/02* (2013.01); *H05K 7/1497* (2013.01);
(Continued)

(58) Field of Classification Search
CPC ........ G06F 1/20; G05B 15/02; H05K 7/1497; H05K 7/20145; H05K 7/20181; H05K 7/20745
See application file for complete search history.

(56) References Cited

U.S. PATENT DOCUMENTS 3,486,530 A 12/1969 Mercier
3,941,144 A 3/1976 Cornil
(Continued)

FOREIGN PATENT DOCUMENTS

AU 2009203009 A1 2/2010
AU 2014101324 A4 12/2014
(Continued)

OTHER PUBLICATIONS

Albert Szmigielski, Bitcoin Essentials, published Feb. 2016, 130 pages.
(Continued)

*Primary Examiner* — Robert J Hoffberg
(74) *Attorney, Agent, or Firm* — Robert A. Nissen

(57) ABSTRACT

A portable blockchain mining system is disclosed comprising: a portable building; a plurality of blockchain mining processors mounted within, or a plurality of blockchain mining processor mounts located within, an interior of the portable building; an air inlet defined in the portable building; an air outlet defined in the portable building above the air inlet and oriented to direct exhaust air out of the portable building; and a cooling fan connected to convey air through the air inlet, across the plurality of blockchain mining processors and out the air outlet.

35 Claims, 14 Drawing Sheets

(51) Int. Cl.
*G06F 1/20* (2006.01)
*G05B 15/02* (2006.01)
(52) U.S. Cl.
CPC ..... *H05K 7/20145* (2013.01); *H05K 7/20181* (2013.01); *H05K 7/20745* (2013.01)

(56) References Cited

U.S. PATENT DOCUMENTS

| | | | |
|---|---|---|---|
| 4,088,154 A | 5/1978 | Patton |
| 4,106,097 A | 8/1978 | Fox |
| 4,245,319 A | 1/1981 | Hedges |
| 4,247,786 A | 1/1981 | Hedges |
| 4,333,496 A | 6/1982 | Chow |
| 4,371,779 A | 2/1983 | Maynard |
| 4,551,812 A | 11/1985 | Gurr |
| 4,574,959 A | 3/1986 | Hollett |
| 5,142,672 A | 8/1992 | Johnson |
| 5,209,317 A | 5/1993 | Schnelle |
| 5,355,676 A | 10/1994 | Inokuchi |
| 5,367,669 A | 11/1994 | Holland |
| 5,396,923 A | 3/1995 | Allen |
| 5,509,434 A | 4/1996 | Boyd |
| 5,544,012 A | 8/1996 | Koike |
| 5,544,046 A | 8/1996 | Niwa |
| 5,586,574 A | 12/1996 | Smith |
| 5,653,070 A | 8/1997 | Seguin |
| 5,748,914 A | 5/1998 | Barth |
| 5,761,083 A | 6/1998 | Brown |
| 5,913,046 A | 6/1999 | Barth |
| 5,943,221 A | 8/1999 | Asai |
| 6,042,791 A | 3/2000 | Johnson |
| 6,115,698 A | 9/2000 | Tuck |
| 6,161,386 A | 12/2000 | Lokhandwala |
| 6,244,516 B1 | 6/2001 | Langervik |
| 6,288,456 B1 | 9/2001 | Cratty |
| 6,304,459 B1 | 10/2001 | Toyosato |
| 6,437,692 B1 | 8/2002 | Petite |
| 6,473,744 B1 | 10/2002 | Tuck |
| 6,519,509 B1 | 2/2003 | Nierlich |
| 6,521,020 B2 | 2/2003 | Butwell |
| 6,585,784 B1 | 7/2003 | Mittricker |
| 6,618,709 B1 | 9/2003 | Sneeringer |
| 6,633,823 B2 | 10/2003 | Bartone |
| 6,643,567 B2 | 11/2003 | Kolk |
| 6,665,582 B1 | 12/2003 | Moritz |
| 6,672,955 B2 | 1/2004 | Charron |
| 6,681,154 B2 | 1/2004 | Nierlich |
| 6,745,105 B1 | 6/2004 | Fairlie |
| 6,748,932 B1 | 6/2004 | Sorter |
| 6,775,595 B1 | 8/2004 | Yabutani |
| 6,785,592 B1 | 8/2004 | Smith |
| 6,853,930 B2 | 2/2005 | Hayashi |
| 6,868,293 B1 | 3/2005 | Schurr |
| 6,912,450 B2 | 6/2005 | Fairlie |
| 6,930,410 B2 | 8/2005 | Ikeda |
| 6,990,593 B2 | 1/2006 | Nakagawa |
| 7,010,363 B2 | 3/2006 | Donnelly |
| 7,027,992 B2 | 4/2006 | Zaccaria |
| 7,035,179 B2 | 4/2006 | Chen |
| 7,042,726 B2 | 5/2006 | Cader |
| 7,053,767 B2 | 5/2006 | Petite |
| 7,054,271 B2 | 5/2006 | Brownrigg |
| 7,062,360 B2 | 6/2006 | Fairlie |
| 7,076,339 B2 | 7/2006 | Yabutani |
| 7,085,133 B2 | 8/2006 | Hall |
| 7,088,014 B2 | 8/2006 | Nierlich |
| 7,093,256 B2 | 8/2006 | Bloks |
| 7,127,328 B2 | 10/2006 | Ransom |
| 7,130,832 B2 | 10/2006 | Bannai |
| 7,135,956 B2 | 11/2006 | Bartone |
| 7,143,300 B2 | 11/2006 | Potter |
| 7,149,605 B2 | 12/2006 | Chassin |
| 7,181,316 B2 | 2/2007 | Fairlie |
| 7,188,003 B2 | 3/2007 | Ransom |
| 7,196,900 B2 | 3/2007 | Ewing |
| 7,206,670 B2 | 4/2007 | Pimputkar |
| 7,269,723 B2 | 9/2007 | Cromer |
| 7,278,273 B1 | 10/2007 | Whitted |
| 7,305,282 B2 | 12/2007 | Chen |
| 7,333,880 B2 | 2/2008 | Brewster |
| 7,369,968 B2 | 5/2008 | Johnson |
| 7,370,666 B2 | 5/2008 | Willets |
| 7,376,851 B2 | 5/2008 | Kim |
| 7,386,744 B2 | 6/2008 | Barr |
| 7,396,388 B2 | 7/2008 | Mitariten |
| 7,420,293 B2 | 9/2008 | Donnelly |
| 7,460,930 B1 | 12/2008 | Howell |
| 7,468,661 B2 | 12/2008 | Petite |
| 7,484,521 B2 | 2/2009 | Kimbara |
| 7,500,911 B2 | 3/2009 | Johnson |
| 7,508,663 B2 | 3/2009 | Coglitore |
| 7,516,106 B2 | 4/2009 | Ehlers |
| 7,519,453 B2 | 4/2009 | Fairlie |
| 7,525,207 B2 | 4/2009 | Clidaras |
| 7,542,947 B2 | 6/2009 | Guyon et al. |
| 7,560,831 B2 | 7/2009 | Whitted |
| 7,561,977 B2 | 7/2009 | Horst |
| 7,565,224 B2 | 7/2009 | Fairlie |
| 7,633,955 B1 | 12/2009 | Saraiya |
| 7,647,516 B2 | 1/2010 | Ranganathan |
| 7,702,931 B2 | 4/2010 | Goodrum |
| 7,724,513 B2 | 5/2010 | Coglitore |
| 7,738,251 B2 | 6/2010 | Clidaras |
| 7,779,276 B2 | 8/2010 | Bolan |
| 7,783,907 B2 | 8/2010 | Dubinsky |
| 7,800,900 B1 | 9/2010 | Noteboom |
| 7,854,652 B2 | 12/2010 | Yates |
| 7,861,102 B1 | 12/2010 | Ranganathan |
| 7,862,410 B2 | 1/2011 | McMahan |
| 7,921,315 B2 | 4/2011 | Langgood |
| 7,925,911 B2 | 4/2011 | Brey |
| 7,944,692 B2 | 5/2011 | Grantham |
| 7,957,142 B2 | 6/2011 | Noteboom |
| 7,961,463 B2 | 6/2011 | Belady |
| 7,970,561 B2 | 6/2011 | Pfeiffer |
| 7,971,446 B2 | 7/2011 | Clidaras |
| 7,990,710 B2 | 8/2011 | Hellriegel |
| 7,998,227 B2 | 8/2011 | Mittricker |
| 8,001,403 B2 | 8/2011 | Hamilton |
| 8,006,108 B2 | 8/2011 | Brey |
| 8,031,468 B2 | 10/2011 | Bean |
| 8,047,904 B2 | 11/2011 | Yates |
| 8,051,672 B2 | 11/2011 | Mallia |
| 8,070,863 B2 | 12/2011 | Tsangaris |
| 8,080,900 B2 | 12/2011 | Corhodzic |
| 8,094,436 B2 | 1/2012 | Mills |
| 8,113,010 B2 | 2/2012 | Carlson |
| 8,156,206 B2 | 4/2012 | Kiley et al. |
| 8,180,501 B2 | 5/2012 | Lewis |
| 8,184,435 B2 | 5/2012 | Bean |
| 8,203,837 B2 | 6/2012 | Zeighami |
| 8,203,841 B2 | 6/2012 | Chang |
| 8,214,843 B2 | 7/2012 | Boss |
| 8,233,270 B2 | 7/2012 | Pierson |
| 8,248,795 B2 | 8/2012 | Chang |
| 8,248,799 B2 | 8/2012 | Chang |
| 8,250,382 B2 | 8/2012 | Maglione |
| 8,251,785 B2 | 8/2012 | Schmitt |
| 8,254,122 B2 | 8/2012 | Chang |
| 8,254,124 B2 | 8/2012 | Keisling |
| 8,260,913 B2 | 9/2012 | Knapp |
| 8,261,275 B2 | 9/2012 | Johnson |
| 8,264,840 B2 | 9/2012 | Bergthold |
| 8,286,442 B2 | 10/2012 | Carlson |
| 8,297,067 B2 | 10/2012 | Keisling |
| 8,300,402 B2 | 10/2012 | Wei |
| 8,305,737 B2 | 11/2012 | Ewing |
| 8,305,757 B2 | 11/2012 | Keisling |
| 8,312,229 B2 | 11/2012 | Bloks |
| 8,315,054 B2 | 11/2012 | Chen |
| 8,320,128 B2 | 11/2012 | Wei |
| 8,322,155 B2 | 12/2012 | Tutunoglu |
| 8,327,123 B2 | 12/2012 | Juffa |
| 8,331,086 B1 | 12/2012 | Meissner |

(56) References Cited

U.S. PATENT DOCUMENTS

| | | | |
|---|---|---|---|
| 8,331,087 B2 | 12/2012 | Wei | |
| 8,332,670 B2 | 12/2012 | Kato | |
| 8,360,833 B2 | 1/2013 | Grantham | |
| 8,370,517 B2 | 2/2013 | Bohrer | |
| 8,374,928 B2 | 2/2013 | Gopisetty | |
| 8,405,977 B2 | 3/2013 | Lin | |
| 8,422,223 B2 | 4/2013 | Su | |
| 8,432,700 B2 | 4/2013 | Katakura | |
| 8,447,993 B2 | 5/2013 | Greene | |
| 8,457,796 B2 | 6/2013 | Thind | |
| 8,462,496 B2 | 6/2013 | Schmitt | |
| 8,467,050 B2 | 6/2013 | Dutel | |
| 8,483,715 B2 | 7/2013 | Chen | |
| 8,498,110 B2 | 7/2013 | Wei | |
| 8,498,114 B2 | 7/2013 | Martini | |
| 8,571,820 B2 | 10/2013 | Pfeiffer | |
| 8,577,509 B2 | 11/2013 | Ong | |
| 8,595,094 B1 | 11/2013 | Forbes | |
| 8,595,515 B1 | 11/2013 | Weber | |
| 8,600,556 B2 | 12/2013 | Nesler | |
| 8,601,287 B1 | 12/2013 | Weber | |
| 8,601,827 B2 | 12/2013 | Keisling | |
| 8,627,123 B2 | 1/2014 | Jain | |
| 8,639,392 B2 | 1/2014 | Chassin | |
| 8,659,895 B1 | 2/2014 | Carlson | |
| 8,665,591 B2 | 3/2014 | Bourgeois | |
| 8,683,823 B1 | 4/2014 | Shivers | |
| 8,694,810 B2 | 4/2014 | Ahluwalia | |
| 8,700,929 B1 | 4/2014 | Weber | |
| 8,706,914 B2 | 4/2014 | Duchesneau | |
| 8,706,915 B2 | 4/2014 | Duchesneau | |
| 8,719,223 B2 | 5/2014 | Knapp | |
| 8,734,212 B2 | 5/2014 | Peng | |
| 8,755,184 B2 | 6/2014 | Peng | |
| 8,768,799 B1 | 7/2014 | Forbes | |
| 8,789,061 B2 | 7/2014 | Pavel | |
| 8,799,690 B2 | 8/2014 | Dawson | |
| 8,812,674 B2 | 8/2014 | Guenter | |
| 8,839,254 B2 | 9/2014 | Horvitz | |
| 8,839,551 B2 | 9/2014 | Swann | |
| 8,848,727 B2 | 9/2014 | Saraiya | |
| 8,849,469 B2 | 9/2014 | Belady | |
| 8,849,715 B2 | 9/2014 | Forbes | |
| 8,887,498 B2 | 11/2014 | Frerichs | |
| 8,917,502 B1 | 12/2014 | Gardner | |
| 8,924,781 B2 | 12/2014 | Shaw | |
| 8,930,299 B2 | 1/2015 | Pyle | |
| 8,931,221 B2 | 1/2015 | Somani | |
| 8,941,256 B1 | 1/2015 | Czamara | |
| 8,964,374 B1 | 2/2015 | Sheng | |
| 8,965,594 B2 | 2/2015 | Marcus | |
| 9,003,211 B2 | 4/2015 | Pfeiffer | |
| 9,003,216 B2 | 4/2015 | Sankar | |
| 9,026,814 B2 | 5/2015 | Aasheim | |
| 9,027,024 B2 | 5/2015 | Mick | |
| 9,041,235 B1 | 5/2015 | Hunter | |
| 9,059,604 B2 | 6/2015 | Johnson | |
| 9,063,738 B2 | 6/2015 | Jain | |
| 9,065,582 B2 | 6/2015 | Barry | |
| 9,072,200 B2 | 6/2015 | Dersch | |
| 9,089,078 B2 | 7/2015 | Branton | |
| 9,091,496 B2 | 7/2015 | Imwalle | |
| 9,110,641 B2 | 8/2015 | Wu | |
| 9,124,099 B2 | 9/2015 | Kuriyama | |
| 9,141,155 B2 | 9/2015 | Wiley | |
| 9,143,392 B2 | 9/2015 | Duchesneau | |
| 9,144,181 B2 | 9/2015 | Wiley | |
| 9,155,230 B2 | 10/2015 | Eriksen | |
| 9,207,993 B2 | 12/2015 | Jain | |
| 9,218,035 B2 | 12/2015 | Li | |
| 9,232,024 B2 | 1/2016 | Suffling | |
| 9,252,598 B2 | 2/2016 | Belady | |
| 9,268,613 B2 | 2/2016 | Barham | |
| 9,271,429 B2 | 2/2016 | Mashiko | |
| 9,282,022 B2 | 3/2016 | Matthews | |
| 9,282,684 B2 | 3/2016 | Keisling | |
| 9,284,850 B1 | 3/2016 | Gardner | |
| 9,320,177 B2 | 4/2016 | Levesque | |
| 9,337,704 B1 | 5/2016 | Leslie | |
| 9,342,375 B2 | 5/2016 | Hyser | |
| 9,345,167 B2 | 5/2016 | Hwang | |
| 9,348,381 B2 | 5/2016 | Khoo | |
| 9,357,681 B2 | 5/2016 | Ross | |
| 9,363,928 B2 | 6/2016 | Kondo | |
| 9,365,127 B2 | 6/2016 | Olsson | |
| 9,380,734 B2 | 6/2016 | Chang | |
| 9,389,632 B2 | 7/2016 | Km | |
| 9,394,770 B2 | 7/2016 | Boot | |
| 9,395,208 B2 | 7/2016 | Sobotka | |
| 9,414,531 B1 | 8/2016 | Towner | |
| 9,416,904 B2 | 8/2016 | Belady | |
| 9,439,328 B2 * | 9/2016 | Bailey | H05K 7/20745 |
| 9,444,367 B2 | 9/2016 | Fornage | |
| 9,447,992 B2 | 9/2016 | Johnson | |
| 9,450,838 B2 | 9/2016 | Jain | |
| 9,477,279 B1 | 10/2016 | Piszczek | |
| 9,493,216 B2 | 11/2016 | Scott | |
| 9,495,668 B1 | 11/2016 | Juels | |
| 9,497,892 B2 | 11/2016 | Klaba | |
| 9,542,231 B2 | 1/2017 | Khan | |
| 9,552,234 B2 | 1/2017 | Boldyrev | |
| 9,557,792 B1 | 1/2017 | Potlapally | |
| 9,559,520 B2 | 1/2017 | Shelton | |
| 9,568,975 B2 | 2/2017 | Sehgal | |
| 9,585,291 B2 | 2/2017 | Belady | |
| 9,588,558 B2 | 3/2017 | McKknight | |
| 9,595,054 B2 | 3/2017 | Jain | |
| 9,606,571 B2 | 3/2017 | Shows | |
| 9,618,991 B1 | 4/2017 | Clidaras | |
| 9,622,387 B1 | 4/2017 | Czamara | |
| 9,630,614 B1 | 4/2017 | Hill | |
| 9,634,508 B2 | 4/2017 | Kearns | |
| 9,637,433 B2 | 5/2017 | Zubrin | |
| 9,645,596 B1 | 5/2017 | Lee | |
| 9,654,414 B2 | 5/2017 | Chatterjee | |
| 9,673,632 B1 | 6/2017 | Ramesh | |
| 9,692,259 B2 | 6/2017 | Boss | |
| 9,719,024 B2 | 8/2017 | Young | |
| 9,763,366 B2 | 9/2017 | Keisling | |
| 9,769,948 B2 | 9/2017 | Welch | |
| 9,769,953 B2 | 9/2017 | Malone | |
| 9,769,960 B2 | 9/2017 | LeFebvre | |
| 9,774,190 B2 | 9/2017 | Mondal | |
| 9,778,718 B2 | 10/2017 | Zacho | |
| 9,795,062 B1 | 10/2017 | Ross | |
| 9,800,052 B2 | 10/2017 | Li | |
| 9,800,167 B2 | 10/2017 | Aeloiza | |
| 9,839,163 B2 | 12/2017 | Keisling | |
| 9,843,470 B1 | 12/2017 | Gartrell | |
| 9,886,316 B2 | 2/2018 | Belady | |
| 9,929,591 B2 | 3/2018 | Cheng | |
| 9,933,804 B2 | 4/2018 | Janous | |
| 9,939,834 B2 | 4/2018 | Bodas | |
| 9,946,815 B1 | 4/2018 | Weber | |
| 9,967,333 B2 | 5/2018 | Chen | |
| 9,982,516 B2 | 5/2018 | Ricotta | |
| 9,985,842 B2 | 5/2018 | White | |
| 9,994,118 B2 | 6/2018 | Williams | |
| 9,995,218 B2 | 6/2018 | Oehring | |
| 10,003,200 B2 | 6/2018 | Budde | |
| 10,009,232 B2 | 6/2018 | Duncan | |
| 10,013,037 B1 | 7/2018 | Clidaras | |
| 10,033,210 B2 | 7/2018 | Peterson | |
| 10,037,061 B1 | 7/2018 | Panchapakesan | |
| 10,039,211 B2 | 7/2018 | Crawford | |
| 10,063,629 B2 | 8/2018 | Duncan | |
| 10,067,547 B2 | 9/2018 | Castro-Leon | |
| 10,078,353 B2 | 9/2018 | Klaba | |
| 10,101,731 B2 | 10/2018 | Asmus | |
| 10,103,574 B2 | 10/2018 | Siegler | |
| 10,107,518 B2 * | 10/2018 | Bailey | F24F 11/76 |
| 10,111,275 B2 | 10/2018 | Norton | |
| 10,128,684 B2 | 11/2018 | Ramamurthy | |
| 10,199,669 B2 | 2/2019 | Wang | |

(56) References Cited

U.S. PATENT DOCUMENTS

| | | |
|---|---|---|
| 10,234,835 B2 | 3/2019 | Liu |
| 10,250,039 B2 | 4/2019 | Wenzel |
| 10,257,268 B2 | 4/2019 | Cencini |
| 10,271,486 B2 | 4/2019 | McNamara |
| 10,275,842 B2 | 4/2019 | Lee |
| 10,283,968 B2 | 5/2019 | ElBsat |
| 10,289,190 B2 | 5/2019 | Boss |
| 10,291,627 B2 | 5/2019 | Gleichauf |
| 10,299,412 B1 | 5/2019 | Papen |
| 10,326,661 B2 | 6/2019 | Munjal |
| 10,339,227 B1 | 7/2019 | Carlson |
| 10,340,696 B2 | 7/2019 | Paine |
| 10,356,954 B2 | 7/2019 | Bao |
| 10,360,077 B2 | 7/2019 | Mahindru |
| 10,367,335 B2 | 7/2019 | Kawashima |
| 10,367,353 B1 | 7/2019 | McNamara |
| 10,367,535 B2 | 7/2019 | Corse |
| 10,368,467 B2 | 7/2019 | Gold |
| 10,404,523 B2 | 9/2019 | Cencini |
| 10,444,818 B1 | 10/2019 | McNamara |
| 10,452,041 B2 | 10/2019 | Menon |
| 10,452,127 B1 | 10/2019 | McNamara |
| 10,452,532 B2 | 10/2019 | McVay |
| 10,454,772 B2 | 10/2019 | White |
| 10,465,492 B2 | 11/2019 | Ricotta |
| 10,476,386 B2 | 11/2019 | Goto |
| 10,488,061 B2 | 11/2019 | Costakis |
| 10,497,072 B2 | 12/2019 | Hooshmand |
| 10,511,175 B2 | 12/2019 | Kogo |
| 10,523,449 B2 | 12/2019 | Montalvo |
| 10,545,560 B2 | 1/2020 | Mahindru |
| 10,545,796 B2 | 1/2020 | Bahramshahry |
| 10,582,635 B1 | 3/2020 | Ross |
| 10,608,433 B1 | 3/2020 | McNamara |
| 10,618,427 B1 | 4/2020 | McNamara |
| 10,637,250 B2 | 4/2020 | Paine |
| 10,637,353 B2 | 4/2020 | Ohyama |
| 10,709,076 B2 | 7/2020 | Pham |
| 10,721,240 B2 | 7/2020 | Gleichauf |
| 10,739,042 B2 | 8/2020 | Zhang |
| 10,754,494 B2 | 8/2020 | Duncan |
| 10,756,546 B2 | 8/2020 | Pmsvvsv |
| 10,756,570 B2 | 8/2020 | Lundstrom |
| 10,757,840 B2 | 8/2020 | Johnson |
| 10,762,476 B2 | 9/2020 | Son |
| 10,779,441 B2 | 9/2020 | Martini |
| 10,795,428 B2 | 10/2020 | Walsh |
| 10,819,599 B2 | 10/2020 | Mahindru |
| 10,822,992 B2 | 11/2020 | Spears |
| 10,831,555 B2 | 11/2020 | Krishnan |
| 10,833,940 B2 | 11/2020 | Cencini |
| 10,834,838 B1 | 11/2020 | Ross |
| 10,838,482 B2 | 11/2020 | Mahindru |
| 10,857,299 B2 | 12/2020 | Creaturo |
| 10,857,899 B1 | 12/2020 | McNamara |
| 10,861,112 B2 | 12/2020 | Forbes |
| 10,862,307 B2 | 12/2020 | Cavness |
| 10,862,309 B2 | 12/2020 | Cavness |
| 10,873,211 B2 | 12/2020 | McNamara |
| 10,882,412 B2 | 1/2021 | Mrlik |
| 10,892,622 B2 | 1/2021 | Guruprasad |
| 10,916,967 B2 | 2/2021 | Peloso |
| 10,931,117 B2 | 2/2021 | Shoemaker |
| 10,974,194 B2 | 4/2021 | Al Muhsen |
| 10,993,353 B2 | 4/2021 | Rau |
| 11,009,836 B2 | 5/2021 | Hoffmann |
| 11,016,456 B2 | 5/2021 | Henson |
| 11,016,458 B2 | 5/2021 | McNamara |
| 11,016,553 B2 | 5/2021 | McNamara |
| 11,025,060 B2 | 6/2021 | McNamara |
| 11,031,783 B2 | 6/2021 | McNamara |
| 11,031,787 B2 | 6/2021 | McNamara |
| 11,031,813 B2 | 6/2021 | McNamara |
| 11,042,948 B1 | 6/2021 | McNamara |
| 11,056,913 B2 | 7/2021 | Matan |
| 11,076,509 B2 | 7/2021 | Alissa |
| 11,108,237 B2 | 8/2021 | Clifton |
| 11,126,242 B2 | 9/2021 | Shaikh |
| 11,128,165 B2 | 9/2021 | McNamara |
| 11,162,696 B2 | 11/2021 | Klaba |
| 11,163,280 B2 | 11/2021 | Henson |
| 11,169,592 B2 | 11/2021 | Mahindru |
| 11,182,781 B2 | 11/2021 | Castinado |
| 11,194,150 B2 | 12/2021 | Baba |
| 11,196,255 B2 | 12/2021 | Torvund |
| 11,256,320 B2 | 2/2022 | McNamara |
| 11,268,715 B2 | 3/2022 | Park |
| 11,275,427 B2 | 3/2022 | McNamara |
| 11,283,261 B2 | 3/2022 | McNamara |
| 11,289,914 B2 | 3/2022 | Walsh |
| 11,306,970 B2 | 4/2022 | Klaba |
| 11,310,944 B2 | 4/2022 | Martini |
| 11,327,473 B2 | 5/2022 | Sayyarrodsari |
| 11,337,339 B2 | 5/2022 | Pichai |
| 11,342,746 B2 | 5/2022 | McNamara |
| 11,359,865 B2 | 6/2022 | Stone |
| 11,397,999 B2 | 7/2022 | McNamara |
| 11,418,037 B2 | 8/2022 | Cavness |
| 11,431,195 B2 | 8/2022 | McNamara |
| 11,451,059 B2 | 9/2022 | Cavness |
| 11,537,183 B2 | 12/2022 | Lewis |
| 11,574,372 B2 * | 2/2023 | Barbour .................. E21B 41/00 |
| 11,647,605 B2 | 5/2023 | Johnson |
| 11,650,639 B2 | 5/2023 | McNamara |
| 11,669,144 B2 | 6/2023 | McNamara |
| 11,669,920 B2 | 6/2023 | McNamara |
| 2002/0072868 A1 | 6/2002 | Bartone |
| 2002/0120412 A1 | 8/2002 | Hayashi |
| 2002/0158749 A1 | 10/2002 | Ikeda |
| 2002/0196124 A1 | 12/2002 | Howard |
| 2003/0023885 A1 | 1/2003 | Potter |
| 2003/0037150 A1 | 2/2003 | Nakagawa |
| 2003/0050003 A1 | 3/2003 | Charron |
| 2003/0056839 A1 | 3/2003 | Kroupa |
| 2003/0074464 A1 | 4/2003 | Bohrer |
| 2003/0171851 A1 | 9/2003 | Brickfield |
| 2003/0196798 A1 | 10/2003 | Newman |
| 2004/0000815 A1 | 1/2004 | Pereira |
| 2004/0027004 A1 | 2/2004 | Bayoumi |
| 2004/0117330 A1 | 6/2004 | Ehlers |
| 2004/0239499 A1 | 12/2004 | Crook |
| 2005/0005528 A1 | 1/2005 | Brault |
| 2005/0022967 A1 | 2/2005 | Hall |
| 2005/0034128 A1 | 2/2005 | Nagashima |
| 2005/0102068 A1 | 5/2005 | Pimputkar |
| 2005/0102539 A1 | 5/2005 | Hepner |
| 2005/0154499 A1 | 7/2005 | Aldridge |
| 2005/0165512 A1 | 7/2005 | Peljto |
| 2005/0168945 A1 | 8/2005 | Coglitore |
| 2005/0179263 A1 | 8/2005 | Johansen et al. |
| 2005/0200205 A1 | 9/2005 | Winn |
| 2005/0203761 A1 | 9/2005 | Barr |
| 2005/0259383 A1 | 11/2005 | Ewing |
| 2006/0031180 A1 | 2/2006 | Tamarkin |
| 2006/0059772 A1 | 3/2006 | Brault |
| 2006/0140747 A1 | 6/2006 | Vandervort |
| 2006/0161765 A1 | 7/2006 | Cromer |
| 2006/0253675 A1 | 11/2006 | Johannes Bloks |
| 2007/0067657 A1 | 3/2007 | Ranganathan |
| 2007/0171613 A1 | 7/2007 | McMahan |
| 2007/0228837 A1 | 10/2007 | Nielsen |
| 2007/0278860 A1 | 12/2007 | Krieger |
| 2008/0000151 A1 | 1/2008 | Houweling |
| 2008/0013596 A1 | 1/2008 | Dunne |
| 2008/0030078 A1 | 2/2008 | Whitted |
| 2008/0064317 A1 | 3/2008 | Yates |
| 2008/0082844 A1 | 4/2008 | Ghiasi |
| 2008/0094797 A1 | 4/2008 | Coglitore |
| 2008/0135238 A1 | 6/2008 | Cugnet et al. |
| 2008/0238195 A1 | 10/2008 | Shaver |
| 2008/0244052 A1 | 10/2008 | Bradicich |
| 2008/0245083 A1 | 10/2008 | Tutunoglu |
| 2008/0276628 A1 | 11/2008 | Lee |
| 2009/0012523 A1 | 1/2009 | Ruuttu |

(56) References Cited

U.S. PATENT DOCUMENTS

| | | |
|---|---|---|
| 2009/0055665 A1 | 2/2009 | Maglione |
| 2009/0070611 A1 | 3/2009 | Bower |
| 2009/0078401 A1 | 3/2009 | Cichanowicz |
| 2009/0089595 A1 | 4/2009 | Brey |
| 2009/0107671 A1 | 4/2009 | Waters et al. |
| 2009/0144566 A1 | 6/2009 | Bletsch |
| 2009/0216910 A1 | 8/2009 | Duchesneau |
| 2009/0235097 A1 | 9/2009 | Hamilton |
| 2009/0251860 A1 | 10/2009 | Belady |
| 2009/0254660 A1 | 10/2009 | Hanson |
| 2009/0255653 A1 | 10/2009 | Mills |
| 2009/0282274 A1 | 11/2009 | Langgood |
| 2010/0024445 A1 | 2/2010 | Cichanowicz |
| 2010/0038907 A1 | 2/2010 | Hunt et al. |
| 2010/0051563 A1* | 3/2010 | Schreiber ........... H05K 7/20745 211/26 |
| 2010/0057271 A1 | 3/2010 | Lewis |
| 2010/0058350 A1 | 3/2010 | Boss |
| 2010/0088261 A1 | 4/2010 | Montalvo |
| 2010/0130117 A1 | 5/2010 | Larsen |
| 2010/0170277 A1 | 7/2010 | Schmitt |
| 2010/0211810 A1 | 8/2010 | Zacho |
| 2010/0235004 A1 | 9/2010 | Thind |
| 2010/0280675 A1 | 11/2010 | Tate |
| 2010/0290197 A1 | 11/2010 | Bergthold |
| 2010/0313203 A1 | 12/2010 | Dawson |
| 2010/0319747 A1 | 12/2010 | Wong |
| 2010/0324962 A1 | 12/2010 | Nesler |
| 2010/0328849 A1 | 12/2010 | Ewing |
| 2010/0332272 A1 | 12/2010 | Ong |
| 2010/0333113 A1 | 12/2010 | Johnson |
| 2011/0009047 A1 | 1/2011 | Noteboom |
| 2011/0072289 A1 | 3/2011 | Kato |
| 2011/0099043 A1 | 4/2011 | Sharma |
| 2011/0115425 A1 | 5/2011 | Olsson |
| 2011/0123036 A1 | 5/2011 | Barath |
| 2011/0151765 A1* | 6/2011 | Chen ................. H05K 7/20745 454/184 |
| 2011/0189936 A1 | 8/2011 | Haspers |
| 2011/0199862 A1 | 8/2011 | Pop |
| 2011/0235244 A1 | 9/2011 | Mills |
| 2011/0238342 A1 | 9/2011 | Pfeiffer |
| 2011/0239015 A1 | 9/2011 | Boyd |
| 2011/0242755 A1 | 10/2011 | Zeighami |
| 2011/0247348 A1 | 10/2011 | Mashiko |
| 2011/0273835 A1 | 11/2011 | Katakura |
| 2011/0276194 A1 | 11/2011 | Emalfarb |
| 2011/0278928 A1 | 11/2011 | Burger |
| 2011/0282982 A1 | 11/2011 | Jain |
| 2011/0316337 A1 | 12/2011 | Pelio |
| 2012/0000121 A1 | 1/2012 | Swann |
| 2012/0006507 A1 | 1/2012 | Su |
| 2012/0020014 A1 | 1/2012 | Chang |
| 2012/0024515 A1 | 2/2012 | Wei |
| 2012/0026679 A1 | 2/2012 | Chang |
| 2012/0032665 A1 | 2/2012 | Shaver |
| 2012/0044631 A1 | 2/2012 | Wei |
| 2012/0044632 A1 | 2/2012 | Wei |
| 2012/0063082 A1 | 3/2012 | Chang |
| 2012/0072745 A1 | 3/2012 | Ahluwalia |
| 2012/0075794 A1 | 3/2012 | Wei |
| 2012/0077427 A1 | 3/2012 | Wei |
| 2012/0078430 A1 | 3/2012 | Fan |
| 2012/0103558 A1 | 5/2012 | Fernandez |
| 2012/0103843 A1 | 5/2012 | Wei |
| 2012/0108157 A1 | 5/2012 | Chan |
| 2012/0109705 A1 | 5/2012 | Belady |
| 2012/0127653 A1 | 5/2012 | Keisling |
| 2012/0129442 A1 | 5/2012 | Wei |
| 2012/0132554 A1 | 5/2012 | Wei |
| 2012/0134105 A1 | 5/2012 | Chang |
| 2012/0134107 A1 | 5/2012 | Peng |
| 2012/0142265 A1 | 6/2012 | Wei |
| 2012/0150679 A1 | 6/2012 | Lazaris |
| 2012/0162886 A1 | 6/2012 | Chen |
| 2012/0168141 A1 | 7/2012 | Lin |
| 2012/0185414 A1 | 7/2012 | Pyle |
| 2012/0201003 A1 | 8/2012 | Shimasaki |
| 2012/0212901 A1 | 8/2012 | Schmitt |
| 2012/0244793 A1 | 9/2012 | Lin |
| 2012/0276834 A1 | 11/2012 | Peng |
| 2012/0290865 A1 | 11/2012 | Kansal |
| 2012/0300291 A1 | 11/2012 | Abbott |
| 2012/0300391 A1 | 11/2012 | Kiesling |
| 2012/0300524 A1 | 11/2012 | Fornage |
| 2012/0306271 A1 | 12/2012 | Kuriyama |
| 2012/0321309 A1 | 12/2012 | Barry |
| 2012/0323382 A1 | 12/2012 | Kamel |
| 2012/0323396 A1 | 12/2012 | Shelton |
| 2012/0324245 A1 | 12/2012 | Sinha |
| 2012/0324259 A1 | 12/2012 | Aasheim |
| 2012/0326511 A1 | 12/2012 | Johnson |
| 2013/0002443 A1 | 1/2013 | Breed et al. |
| 2013/0006401 A1 | 1/2013 | Shan |
| 2013/0007515 A1 | 1/2013 | Shaw |
| 2013/0050923 A1 | 2/2013 | Wei |
| 2013/0054987 A1 | 2/2013 | Pfeiffer |
| 2013/0063991 A1 | 3/2013 | Xiao |
| 2013/0065669 A1 | 3/2013 | Michaelson et al. |
| 2013/0078901 A1 | 3/2013 | Curtin |
| 2013/0086404 A1 | 4/2013 | Sankar |
| 2013/0110296 A1 | 5/2013 | Khoo |
| 2013/0111494 A1 | 5/2013 | Hyser |
| 2013/0112419 A1 | 5/2013 | DeFosse et al. |
| 2013/0117621 A1 | 5/2013 | Saraiya |
| 2013/0138468 A1 | 5/2013 | Oe |
| 2013/0148291 A1 | 6/2013 | Slessman |
| 2013/0166455 A1 | 6/2013 | Feigelson |
| 2013/0187464 A1 | 7/2013 | Smith |
| 2013/0190936 A1 | 7/2013 | Belady |
| 2013/0199629 A1 | 8/2013 | Hemsley |
| 2013/0213038 A1 | 8/2013 | Lazaris |
| 2013/0227139 A1 | 8/2013 | Suffling |
| 2013/0245947 A1 | 9/2013 | Samsom et al. |
| 2013/0252536 A1 | 9/2013 | Chang |
| 2013/0304903 A1 | 11/2013 | Mick |
| 2013/0306276 A1 | 11/2013 | Duchesneau |
| 2013/0328395 A1 | 12/2013 | Krizman |
| 2013/0333405 A1 | 12/2013 | Belady |
| 2013/0340994 A1 | 12/2013 | David |
| 2013/0344794 A1 | 12/2013 | Shaw |
| 2014/0004785 A1* | 1/2014 | Wei ................. H05K 7/20745 454/253 |
| 2014/0016256 A1 | 1/2014 | Lin |
| 2014/0036442 A1 | 2/2014 | Giannoglou |
| 2014/0049898 A1 | 2/2014 | Wu |
| 2014/0070756 A1 | 3/2014 | Kearns |
| 2014/0096837 A1 | 4/2014 | Belady |
| 2014/0101462 A1 | 4/2014 | Rose |
| 2014/0114829 A1 | 4/2014 | Forbes |
| 2014/0137468 A1 | 5/2014 | Ching |
| 2014/0149761 A1 | 5/2014 | Allen-Ware |
| 2014/0150336 A1 | 6/2014 | Houweling |
| 2014/0167504 A1 | 6/2014 | Harris |
| 2014/0180886 A1 | 6/2014 | Forbes |
| 2014/0185225 A1 | 7/2014 | Wineland |
| 2014/0202678 A1 | 7/2014 | Goth |
| 2014/0222225 A1 | 8/2014 | Rouse |
| 2014/0230401 A1 | 8/2014 | Dunn |
| 2014/0237611 A1 | 8/2014 | Dent |
| 2014/0237614 A1 | 8/2014 | Irvine |
| 2014/0316984 A1 | 10/2014 | Schwartz |
| 2014/0324237 A1 | 10/2014 | Oe |
| 2014/0331582 A1 | 11/2014 | Klaba |
| 2014/0332088 A1 | 11/2014 | Senesh |
| 2014/0365402 A1 | 12/2014 | Belady |
| 2014/0365795 A1 | 12/2014 | Nielsen |
| 2014/0366577 A1 | 12/2014 | Zubrin |
| 2014/0372772 A1 | 12/2014 | McKnight |
| 2014/0379156 A1 | 12/2014 | Kamel |
| 2015/0006940 A1 | 1/2015 | Kim |
| 2015/0012113 A1 | 1/2015 | Celebi |
| 2015/0012622 A1 | 1/2015 | Omatsu |
| 2015/0058845 A1 | 2/2015 | Song |

(56) References Cited

U.S. PATENT DOCUMENTS

| | | |
|---|---|---|
| 2015/0106811 A1 | 4/2015 | Holler |
| 2015/0121113 A1 | 4/2015 | Ramamurthy |
| 2015/0155712 A1 | 6/2015 | Mondal |
| 2015/0167550 A1 | 6/2015 | Vandervort |
| 2015/0212122 A1 | 7/2015 | Sobotka |
| 2015/0229227 A1 | 8/2015 | Aeloiza |
| 2015/0261269 A1 | 9/2015 | Bruscoe |
| 2015/0262139 A1 | 9/2015 | Shtylman |
| 2015/0276253 A1 | 10/2015 | Montalvo |
| 2015/0277410 A1 | 10/2015 | Gupta |
| 2015/0278968 A1 | 10/2015 | Steven |
| 2015/0278969 A1 | 10/2015 | Benoy |
| 2015/0280492 A1 | 10/2015 | Narita |
| 2015/0288183 A1 | 10/2015 | Villanueva |
| 2015/0292303 A1 | 10/2015 | Dusseault et al. |
| 2015/0294308 A1 | 10/2015 | Pauker et al. |
| 2015/0310424 A1 | 10/2015 | Myers |
| 2015/0310476 A1 | 10/2015 | Gadwa |
| 2015/0316903 A1 | 11/2015 | Asmus |
| 2015/0321739 A1 | 11/2015 | Dehlsen |
| 2015/0327406 A1 | 11/2015 | Gallefoss |
| 2015/0337218 A1 | 11/2015 | Ricotta |
| 2015/0356524 A1 | 12/2015 | Pennanen |
| 2015/0358943 A1 | 12/2015 | Zawodniok et al. |
| 2015/0363132 A1 | 12/2015 | Uehara |
| 2015/0368566 A1 | 12/2015 | Young |
| 2015/0369013 A1 | 12/2015 | Weatherhead et al. |
| 2015/0372538 A1 | 12/2015 | Siegler |
| 2016/0006066 A1 | 1/2016 | Robertson |
| 2016/0010445 A1 | 1/2016 | Harrison et al. |
| 2016/0011617 A1 | 1/2016 | Liu |
| 2016/0013652 A1 | 1/2016 | Li |
| 2016/0021793 A1 | 1/2016 | Chen |
| 2016/0043552 A1 | 2/2016 | Villanueva |
| 2016/0052814 A1 | 2/2016 | Leyendecker et al. |
| 2016/0054774 A1 | 2/2016 | Song |
| 2016/0087909 A1 | 3/2016 | Chatterjee |
| 2016/0091948 A1 | 3/2016 | Mitchell |
| 2016/0109122 A1 | 4/2016 | Malm et al. |
| 2016/0109916 A1 | 4/2016 | Li |
| 2016/0112200 A1 | 4/2016 | Kheterpal et al. |
| 2016/0113157 A1 | 4/2016 | Bao |
| 2016/0125040 A1 | 5/2016 | Kheterpal et al. |
| 2016/0126783 A1 | 5/2016 | Cheng |
| 2016/0128238 A1 | 5/2016 | Shedd |
| 2016/0149484 A1 | 5/2016 | Wu |
| 2016/0164672 A1 | 6/2016 | Karighattam et al. |
| 2016/0170469 A1 | 6/2016 | Sehgal |
| 2016/0172900 A1 | 6/2016 | Welch |
| 2016/0187906 A1 | 6/2016 | Bodas |
| 2016/0198656 A1 | 7/2016 | McNamara |
| 2016/0202744 A1 | 7/2016 | Castro-Leon |
| 2016/0212954 A1 | 7/2016 | Argento |
| 2016/0214715 A1 | 7/2016 | Meffert |
| 2016/0218879 A1 | 7/2016 | Ferrin |
| 2016/0248631 A1 | 8/2016 | Duchesneau |
| 2016/0249484 A1 | 8/2016 | Parizeau |
| 2016/0261226 A1 | 9/2016 | Hamilton |
| 2016/0261404 A1 | 9/2016 | Ford et al. |
| 2016/0261685 A1 | 9/2016 | Chen et al. |
| 2016/0283920 A1 | 9/2016 | Fisher et al. |
| 2016/0300234 A1 | 10/2016 | Moss-Pultz et al. |
| 2016/0319653 A1 | 11/2016 | Reeves et al. |
| 2016/0324077 A1 | 11/2016 | Frantzen |
| 2016/0328713 A1 | 11/2016 | Ebrahimi |
| 2016/0330031 A1 | 11/2016 | Drego et al. |
| 2016/0330035 A1 | 11/2016 | Ebrahimi et al. |
| 2016/0342977 A1 | 11/2016 | Lam |
| 2016/0362954 A1 | 12/2016 | Hansen et al. |
| 2016/0377306 A1 | 12/2016 | Drees |
| 2017/0013746 A1 | 1/2017 | Campbell |
| 2017/0018467 A1 | 1/2017 | Walker |
| 2017/0023969 A1 | 1/2017 | Shows |
| 2017/0027086 A1 | 1/2017 | Noteboom |
| 2017/0104332 A1 | 4/2017 | Wenzel |
| 2017/0104336 A1 | 4/2017 | ElBsat |
| 2017/0104337 A1 | 4/2017 | Drees |
| 2017/0104342 A1 | 4/2017 | ElBsat |
| 2017/0104343 A1 | 4/2017 | ElBsat |
| 2017/0112023 A1 | 4/2017 | Mao |
| 2017/0169344 A1 | 6/2017 | Mangharam |
| 2017/0185132 A1 | 6/2017 | Bodas |
| 2017/0192483 A1 | 7/2017 | Boss |
| 2017/0194791 A1 | 7/2017 | Budde |
| 2017/0201098 A1 | 7/2017 | Carpenter |
| 2017/0207629 A1 | 7/2017 | Seki |
| 2017/0209822 A1 | 7/2017 | Lopez |
| 2017/0214070 A1 | 7/2017 | Wang |
| 2017/0218843 A1 | 8/2017 | Oehring |
| 2017/0237261 A1 | 8/2017 | Maug |
| 2017/0243290 A1 | 8/2017 | Brown |
| 2017/0249606 A1 | 8/2017 | Pirooz |
| 2017/0261949 A1 | 9/2017 | Hoffmann |
| 2017/0265326 A1 | 9/2017 | Totani |
| 2017/0271701 A1 | 9/2017 | Berlowitz |
| 2017/0280594 A1 | 9/2017 | Sato |
| 2017/0300359 A1 | 10/2017 | Kollur |
| 2017/0302077 A1 | 10/2017 | Yabe |
| 2017/0302171 A1 | 10/2017 | Goto |
| 2017/0311487 A1 | 10/2017 | Rau |
| 2017/0329908 A1 | 11/2017 | Braswell |
| 2017/0349058 A1 | 12/2017 | Bernier |
| 2017/0352010 A1 | 12/2017 | Son |
| 2017/0358041 A1 | 12/2017 | Forbes |
| 2017/0366412 A1 | 12/2017 | Piga |
| 2017/0373500 A1 | 12/2017 | Shafi |
| 2018/0026478 A1 | 1/2018 | Peloso |
| 2018/0042064 A1 | 2/2018 | Norton |
| 2018/0052431 A1 | 2/2018 | Shaikh |
| 2018/0101220 A1 | 4/2018 | Mahindru |
| 2018/0109112 A1 | 4/2018 | Paine |
| 2018/0109162 A1 | 4/2018 | Paine |
| 2018/0109163 A1 | 4/2018 | Paine |
| 2018/0109541 A1 | 4/2018 | Gleichauf |
| 2018/0116070 A1 | 4/2018 | Broadbent |
| 2018/0124955 A1 | 5/2018 | Rogers |
| 2018/0144414 A1 | 5/2018 | Lee |
| 2018/0152023 A1 | 5/2018 | Guruprasad |
| 2018/0175666 A1 | 6/2018 | Ayer |
| 2018/0181153 A1 | 6/2018 | Takahashi |
| 2018/0192538 A1 | 7/2018 | Sakalkar |
| 2018/0202825 A1 | 7/2018 | You |
| 2018/0240112 A1 | 8/2018 | Castinado |
| 2018/0267839 A1 | 9/2018 | Maisuria |
| 2018/0284707 A1 | 10/2018 | Menon |
| 2018/0294649 A1 | 10/2018 | Bright |
| 2018/0351367 A1 | 12/2018 | Kogo |
| 2018/0366978 A1 | 12/2018 | Matan |
| 2018/0367320 A1 | 12/2018 | Montalvo |
| 2019/0018394 A1 | 1/2019 | Sayyarrodsari |
| 2019/0022580 A1 | 1/2019 | Al Muhsen |
| 2019/0042990 A1 | 2/2019 | Paul |
| 2019/0044412 A1 | 2/2019 | Halbert |
| 2019/0052094 A1 | 2/2019 | Pmsvvsv |
| 2019/0063252 A1 | 2/2019 | Spears |
| 2019/0082618 A1 | 3/2019 | Lopez |
| 2019/0122132 A1 | 4/2019 | Rimini |
| 2019/0148819 A1 | 5/2019 | Dominguez |
| 2019/0168630 A1 | 6/2019 | Mrlik |
| 2019/0173283 A1 | 6/2019 | Epel |
| 2019/0258307 A1 | 8/2019 | Shaikh |
| 2019/0261589 A1 | 8/2019 | Pham |
| 2019/0267644 A1 | 8/2019 | Berntsen |
| 2019/0280521 A1 | 9/2019 | Lundstrom |
| 2019/0306176 A1 | 10/2019 | Gleichauf |
| 2019/0318327 A1 | 10/2019 | Sowell |
| 2019/0324820 A1 | 10/2019 | Krishnan |
| 2019/0332149 A1 | 10/2019 | Shelnutt |
| 2019/0335625 A1 | 10/2019 | Shelnutt |
| 2019/0335626 A1 | 10/2019 | Shelnutt |
| 2019/0339756 A1 | 11/2019 | Lewis |
| 2019/0354076 A1 | 11/2019 | Henson |
| 2019/0357390 A1 | 11/2019 | Preuss |
| 2020/0006938 A1 | 1/2020 | Torvund |

(56) References Cited

U.S. PATENT DOCUMENTS

| | | | |
|---|---|---|---|
| 2020/0008320 A1 | 1/2020 | Yu |
| 2020/0033837 A1 | 1/2020 | Simmons |
| 2020/0040272 A1 | 2/2020 | Cavness |
| 2020/0051184 A1 | 2/2020 | Barbour |
| 2020/0073466 A1 | 3/2020 | Walsh |
| 2020/0089307 A1 | 3/2020 | McNamara |
| 2020/0091717 A1 | 3/2020 | McNamara |
| 2020/0091727 A1 | 3/2020 | McNamara |
| 2020/0091766 A1 | 3/2020 | McNamara |
| 2020/0103958 A1 | 4/2020 | Chen |
| 2020/0107475 A1 | 4/2020 | Keisling |
| 2020/0136387 A1 | 4/2020 | McNamara |
| 2020/0136388 A1 | 4/2020 | McNamara |
| 2020/0154596 A1 | 5/2020 | Roy |
| 2020/0161865 A1 | 5/2020 | Clifton |
| 2020/0167197 A1 | 5/2020 | Bahramshahry |
| 2020/0177100 A1 | 6/2020 | Wang |
| 2020/0318843 A1 | 10/2020 | Wenzel |
| 2020/0319700 A1 | 10/2020 | Wu |
| 2020/0321776 A1 | 10/2020 | Shaver |
| 2020/0341439 A1 | 10/2020 | Valin |
| 2020/0359572 A1 | 11/2020 | Henson |
| 2020/0379537 A1 | 12/2020 | Henson |
| 2020/0395761 A1 | 12/2020 | Walsh |
| 2021/0014997 A1 | 1/2021 | Johnson |
| 2021/0021135 A1 | 1/2021 | ElBsat |
| 2021/0035242 A1 | 2/2021 | McNamara |
| 2021/0036547 A1 | 2/2021 | McNamara |
| 2021/0057913 A1 | 2/2021 | Cavness |
| 2021/0092875 A1 | 3/2021 | Hellmann-Regen |
| 2021/0101499 A1 | 4/2021 | McNamara |
| 2021/0111585 A1 | 4/2021 | McNamara |
| 2021/0124322 A1 | 4/2021 | McNamara |
| 2021/0126456 A1 | 4/2021 | McNamara |
| 2021/0175710 A1 | 6/2021 | Campbell |
| 2021/0287309 A1 | 9/2021 | Gebhardt |
| 2021/0288495 A1 | 9/2021 | McNamara |
| 2021/0288496 A1 | 9/2021 | McNamara |
| 2021/0294267 A1 | 9/2021 | Constancias |
| 2021/0294287 A1 | 9/2021 | Valin |
| 2021/0294405 A1 | 9/2021 | McNamara |
| 2021/0296893 A1 | 9/2021 | McNamara |
| 2021/0296928 A1 | 9/2021 | McNamara |
| 2021/0298195 A1 | 9/2021 | Barbour |
| 2021/0312574 A1 | 10/2021 | McNamara |
| 2021/0325955 A1 | 10/2021 | McNamara |
| 2021/0345526 A1 | 11/2021 | Thornton |
| 2021/0378131 A1 | 12/2021 | Johnson |
| 2022/0033517 A1 | 2/2022 | Hendry |
| 2022/0039333 A1 | 2/2022 | Avila |
| 2022/0085603 A1 | 3/2022 | McNamara |
| 2022/0197363 A1 | 6/2022 | McNamara |
| 2022/0294219 A1 | 9/2022 | McNamara |
| 2022/0352720 A1 | 11/2022 | Cavness |
| 2022/0366517 A1 | 11/2022 | McNamara |
| 2022/0407350 A1 | 12/2022 | McNamara |
| 2023/0121669 A1 | 4/2023 | McNamara |

FOREIGN PATENT DOCUMENTS

| | | |
|---|---|---|
| AU | 2016100178 A4 | 3/2016 |
| AU | 2016100394 A4 | 5/2016 |
| CA | 2332840 A1 | 11/1999 |
| CA | 2522428 A1 | 4/2007 |
| CA | 2653778 A1 | 12/2007 |
| CA | 2793537 A1 | 10/2011 |
| CA | 2758681 A1 | 5/2012 |
| CA | 2758725 A1 | 5/2012 |
| CA | 2752594 A1 | 12/2012 |
| CA | 2914797 A1 | 11/2014 |
| CA | 3090944 A1 | 8/2018 |
| CA | 3105380 A1 | 2/2020 |
| CA | 3111583 A1 | 3/2020 |
| CA | 3111830 A1 | 3/2020 |
| CA | 3112037 A1 | 3/2020 |
| CA | 3118128 A1 | 5/2020 |
| CA | 3126390 A1 | 7/2020 |
| CA | 3048706 A1 | 8/2020 |
| CA | 3128478 A1 | 9/2020 |
| CA | 3139776 A1 | 11/2020 |
| CA | 3050389 A1 | 1/2021 |
| CA | 3076653 A1 | 9/2021 |
| CN | 1656661 A | 8/2005 |
| CN | 1847626 A | 10/2006 |
| CN | 101501596 A | 8/2009 |
| CN | 101803148 A | 8/2010 |
| CN | 102185382 A | 9/2011 |
| CN | 102541219 A | 7/2012 |
| CN | 102591921 A | 7/2012 |
| CN | 102762409 A | 10/2012 |
| CN | 202503827 U | 10/2012 |
| CN | 103163904 A | 6/2013 |
| CN | 103327785 A | 9/2013 |
| CN | 103440028 A | 12/2013 |
| CN | 103443550 A | 12/2013 |
| CN | 103562817 A | 2/2014 |
| CN | 103748757 A | 4/2014 |
| CN | 104144183 A | 11/2014 |
| CN | 104715340 A | 6/2015 |
| CN | 104969434 A | 10/2015 |
| CN | 105451504 A | 3/2016 |
| CN | 105814543 A | 7/2016 |
| CN | 106226718 A | 12/2016 |
| CN | 106659054 A | 5/2017 |
| CN | 107257608 A | 10/2017 |
| CN | 107967536 A | 4/2018 |
| CN | 110083212 A | 8/2019 |
| CN | 111522652 A | 8/2020 |
| CN | 112106051 A | 12/2020 |
| CN | 112438006 A | 3/2021 |
| DE | 738523 C | 8/1943 |
| EP | 1167861 A1 | 1/2002 |
| EP | 1490941 A1 | 12/2004 |
| EP | 1993774 A2 | 11/2008 |
| EP | 2036189 A2 | 3/2009 |
| EP | 2074337 A2 | 7/2009 |
| EP | 2354378 A1 | 8/2011 |
| EP | 2446516 A2 | 5/2012 |
| EP | 2634956 A2 | 9/2013 |
| EP | 2721710 A2 | 4/2014 |
| EP | 2900045 A1 | 7/2015 |
| EP | 3035480 A1 | 6/2016 |
| EP | 3054405 | 10/2016 |
| EP | 3266087 A1 | 1/2018 |
| EP | 3465865 A1 | 4/2019 |
| EP | 2648496 B1 | 5/2019 |
| EP | 3807972 A1 | 4/2021 |
| EP | 3850462 A1 | 7/2021 |
| ES | 2765100 T3 | 6/2020 |
| FR | 2954670 A1 | 6/2011 |
| FR | 2954671 A1 | 6/2011 |
| FR | 2957163 A1 | 9/2011 |
| FR | 2960662 A1 | 12/2011 |
| FR | 2999819 A1 | 6/2014 |
| FR | 3017024 A1 | 7/2015 |
| GB | 2560378 A | 9/2018 |
| KR | 20090012523 A | 2/2009 |
| KR | 100907946 B1 | 7/2009 |
| KR | 101399235 B1 | 5/2014 |
| KR | 20180084285 A | 7/2018 |
| NL | 2004277 C2 | 8/2011 |
| RU | 2012138911 A | 5/2014 |
| RU | 2642422 C2 | 1/2018 |
| TW | 201214093 A | 4/2012 |
| TW | 201526774 A | 7/2015 |
| WO | 99/60687 A1 | 11/1999 |
| WO | 02/07365 A2 | 1/2002 |
| WO | 2006/058341 A2 | 6/2006 |
| WO | 2008/039773 A2 | 4/2008 |
| WO | 2009/113824 A2 | 9/2009 |
| WO | 2010/050249 A1 | 5/2010 |
| WO | 2011/130406 A1 | 10/2011 |
| WO | 2012/014093 A2 | 2/2012 |
| WO | 2012/177769 A1 | 12/2012 |

(56) References Cited

FOREIGN PATENT DOCUMENTS

| | | |
|---|---|---|
| WO | 2013/022501 A1 | 2/2013 |
| WO | 2013/066602 A1 | 5/2013 |
| WO | 2013/066604 A1 | 5/2013 |
| WO | 2014/005156 A2 | 1/2014 |
| WO | 2014/130972 A1 | 8/2014 |
| WO | 2014/185311 A1 | 11/2014 |
| WO | 2015/039122 A1 | 3/2015 |
| WO | 2015/072989 A1 | 5/2015 |
| WO | 2015077378 | 5/2015 |
| WO | 2015/123257 A1 | 8/2015 |
| WO | 2015/175693 A1 | 11/2015 |
| WO | 2015/199629 A1 | 12/2015 |
| WO | 2015199629 A1 | 12/2015 |
| WO | 2016/064342 A1 | 4/2016 |
| WO | 2016/067295 A1 | 5/2016 |
| WO | 2016/106373 A1 | 6/2016 |
| WO | 2016/145052 A1 | 9/2016 |
| WO | 2017/074513 A1 | 5/2017 |
| WO | 2017/163126 A1 | 9/2017 |
| WO | 2017/214210 A1 | 12/2017 |
| WO | 2018/068042 A1 | 4/2018 |
| WO | 2018145201 A1 | 8/2018 |
| WO | 2019/060180 A2 | 3/2019 |
| WO | 2019/113136 A1 | 6/2019 |
| WO | 2019/116375 A1 | 6/2019 |
| WO | 2019/139632 A1 | 7/2019 |
| WO | 2019/139633 A1 | 7/2019 |
| WO | 2020/007435 A1 | 1/2020 |
| WO | 2020/056322 A1 | 3/2020 |
| WO | 2020/163939 A1 | 8/2020 |
| WO | 2020/163968 A2 | 8/2020 |
| WO | 2020/176486 A1 | 9/2020 |
| WO | 2020/227811 A1 | 11/2020 |
| WO | 2021/022174 A1 | 2/2021 |
| WO | 2021/022175 A1 | 2/2021 |
| WO | 2021/086930 A1 | 5/2021 |
| WO | 2021/129692 A1 | 7/2021 |
| WO | 2021/173973 A1 | 9/2021 |
| WO | 2022/031836 A1 | 2/2022 |

OTHER PUBLICATIONS

Alex Lielacher, Crypto you can mine from a home computer in 2023, Jul. 18, 2023, obtained Jul. 20, 2023, 11 pages.
Amanda Stephenson, Genalta Power earns carbon offsets for turning flare gas into electricity, Calgary Herald, posted Sep. 30, 2014, 6 pages.
An Innovative Solution to Flaring, Crusoe Energy, available as early as Dec. 9, 2019, 2 pgs, screenshots taken from Wayback Machine internet archive, URL=https://web.archive.org/web/20191209224205/https://www.crusoeenergy.com/.
Aprice44, Mining with Free Natural Gas, Reddit posting, allegedly available as early as Jul. 3, 2016, 1 page.
Complaint for Patent Infringement, *Upstream Data Inc.* v. *Crusoe Energy Systems LLC*, Case No. 1:23-cv-01252, D. Colo. May 18, 2023, 13 pages.
Cryptocurrency investors eye provinces with low electricity rates, The Fraser Institute Blog, posted Jan. 31, 2018, 3 pages.
CryptoKube, CryptoKube Brochure, obtained Jul. 17, 2023 from the WaybackMachine dated Mar. 5, 2016, 5 pages.
CryptoKube, Screenshots and transcript from CryptoKube, available as early as 2014, 22 pages.
Gerald Sanders and Johnson Space Center, Gas Conversion Systems Reclaim Fuel for Industry, published in 2015, 4 pages.
JCHI2210, Free natural gas, is it worth it to use a Natural gas generator?, Bitcoin Forum, posted Aug. 27, 2017, 7 pages.
June Ann Munford, Declaration of June Ann Munford, Jul. 19, 2023, 225 pages.
Kenyn, Saving the environment through bitcoin; one transaction equals 117 recycled bottles, Reddit, posted Feb. 26, 2017, 17 pages.
Kinolva, Shower Thought: Mining Bitcoin for Heat / Hot Water?, Reddit, posted Jan. 28, 2017, 14 pages.
Mia Bennett, Blog—Bitcoin mining: The next rush to hit the Arctic?, posted Feb. 6, 2018, 14 pages.
Michael Nikolaou, Declaration of Michael Nikolaou, Jul. 20, 2023, 157 pages.
Youtube, Horizontal Container Twist Lock/Connector, Aug. 10, 2020, MYTEE Products, retrieved online Nov. 22, 2022, https://www.youtube.com/watch?v=c1unwiisykc.
Office Action issued on Canadian patent application 3090944, dated Jan. 28, 2022, 3 pages.
Polivka GmbH, Mining Container ~100KW by Polivka GmbH, ontained Jun. 29, 2023 from the WaybackMachine dated May 20, 2015, 36 pages.
Polivka GmbH, Screenshots of Mining Container Setup on Vimeo, available as early as Feb. 9, 2015, 1 page.
Pymnts, China Moves to Squeeze Out Bitcoin Mining, posted Jan. 10, 2018, 7 pages.
The Best Places in the World to Mine Bitcoin, PRNewswire, posted Jan. 18, 2018, 8 pages.
Theselfgoverned, Electricity Consumption: Bitcoin mining vs The current global financial system, Reddit, posted Jun. 5, 2014, 15 pages.
Vernon Kasdorf, Declaration of Vernon Kasdorf, Jul. 20, 2023, 116 pages.
WayBack Machine, New Century Exploration (2022) Retrieved online Apr. 16, 2022, https://web.archive.org/web/20220401000000*/https://www.newcenturyexp.com/.
WayBack Machine, New Century Exploration—What We Do (2022) Retrieved online Apr. 16, 2022, https://web.archive.org/web/20220330234542/https://www.newcenturyexp.com/.
Machine generated transcript, Using Natural Gas to Mine Bitcoin With Matthew Lohstroh, Sep. 18, 2018, retrieved online Aug. 18, 2023, https://www.youtube.com/watch?v=TYpsZzlevow, 17 pages.
Youtube, Why is natural gas flared? What is the solution?, Jun. 23, 2015, Retrieved online Aug. 18, 2023, https://www.youtube.com/watch?v=4_vEUnIOAs8, 3 pages.
Machine generated translation of Foreign Patent submission #25 (CN101501596), retrieved online Aug. 11, 2023, 20 pages.
Machine generated translation of Foreign Patent submission #26 (CN101803148), retrieved online Aug. 11, 2023, 29 pages.
Machine generated translation of Foreign Patent submission #27 (CN102185382), retrieved online Aug. 11, 2023, 14 pages.
Machine generated translation of Foreign Patent submission #28 (CN102541219), retrieved online Aug. 11, 2023, 7 pages.
Machine generated translation of Foreign Patent submission #29 (CN102591921), retrieved online Aug. 11, 2023, 15 pages.
Machine generated translation of Foreign Patent submission #30 (CN102762409), retrieved online Aug. 11, 2023, 24 pages.
Machine generated translation of Foreign Patent submission #31 (CN103163904), retrieved online Aug. 11, 2023, 33 pages.
Machine generated translation of Foreign Patent submission #32 (CN103327785), retrieved online Aug. 11, 2023, 6 pages.
Machine generated translation of Foreign Patent submission #33 (CN103440028), retrieved online Aug. 11, 2023, 19 pages.
Machine generated translation of Foreign Patent submission #34 (CN103443550), retrieved online Aug. 11, 2023, 11 pages.
Machine generated translation of Foreign Patent submission #35 (CN103562817), retrieved online Aug. 11, 2023, 15 pages.
Machine generated translation of Foreign Patent submission #36 (CN103748757), retrieved online Aug. 11, 2023, 26 pages.
Machine generated translation of Foreign Patent submission #37 (CN104144183), retrieved online Aug. 11, 2023, 52 pages.
Machine generated translation of Foreign Patent submission #38 (CN104715340), retrieved online Aug. 11, 2023, 8 pages.
Machine generated translation of Foreign Patent submission #39 (CN104969434), retrieved online Aug. 11, 2023, 27 pages.
Machine generated translation of Foreign Patent submission #40 (CN105451504), retrieved online Aug. 11, 2023, 16 pages.
Machine generated translation of Foreign Patent submission #41 (CN105814543), retrieved online Aug. 11, 2023, 19 pages.
Machine generated translation of Foreign Patent submission #42 (CN106226718), retrieved online Aug. 11, 2023, 13 pages.
Machine generated translation of Foreign Patent submission #43 (CN106659054), retrieved online Aug. 11, 2023, 4 pages.

(56) References Cited

OTHER PUBLICATIONS

Machine generated translation of Foreign Patent submission #44 (CN107257608), retrieved online Aug. 11, 2023, 11 pages.
Machine generated translation of Foreign Patent submission #45 (CN107967536), retrieved online Aug. 11, 2023, 20 pages.
Machine generated translation of Foreign Patent submission #46 (CN110083212), retrieved online Aug. 11, 2023, 19 pages.
Machine generated translation of Foreign Patent submission #47 (CN111522652), retrieved online Aug. 11, 2023, 16 pages.
Machine generated translation of Foreign Patent submission #48 (CN112106051), retrieved online Aug. 11, 2023, 22 pages.
Machine generated translation of Foreign Patent submission #49 (CN112438006), retrieved online Aug. 11, 2023, 34 pages.
Machine generated translation of Foreign Patent submission #50 (CN1656661), retrieved online Aug. 11, 2023, 56 pages.
Machine generated translation of Foreign Patent submission #51 (CN1847626), retrieved online Aug. 11, 2023, 11 pages.
Machine generated translation of Foreign Patent submission #52 (CN202503827), retrieved online Aug. 11, 2023, 7 pages.
Machine generated translation of Foreign Patent submission #53 (DE738523), retrieved online Aug. 11, 2023, 5 pages.
Machine generated translation of Foreign Patent submission #63 (EP2900045), retrieved online Aug. 11, 2023, 10 pages.
Machine generated translation of Foreign Patent submission #69 (ES2765100), retrieved online Aug. 11, 2023, 15 pages.
Machine generated translation of Foreign Patent submission #70 (FR2954670), retrieved online Aug. 11, 2023, 27 pages.
Machine generated translation of Foreign Patent submission #71 (FR2954671), retrieved online Aug. 11, 2023, 20 pages.
Machine generated translation of Foreign Patent submission #72 (FR2957163), retrieved online Aug. 11, 2023, 8 pages.
Machine generated translation of Foreign Patent submission #73 (FR2960662), retrieved online Aug. 11, 2023, 10 pages.
Machine generated translation of Foreign Patent submission #74 (FR2999819), retrieved online Aug. 11, 2023, 10 pages.
Machine generated translation of Foreign Patent submission #75 (FR3017024), retrieved online Aug. 11, 2023, 8 pages.
Machine generated translation of Foreign Patent submission #77 (JP2005056196), retrieved online Aug. 11, 2023, 10 pages.
Machine generated translation of Foreign Patent submission #78 (JP2005353497), retrieved online Aug. 11, 2023, 14 pages.
Machine generated translation of Foreign Patent submission #79 (JP2011123873), retrieved online Aug. 11, 2023, 10 pages.
Machine generated translation of Foreign Patent submission #80 (JP2012032107), retrieved online Aug. 11, 2023, 7 pages.
Machine generated translation of Foreign Patent submission #81 (JP2013524317), retrieved online Aug. 11, 2023, 10 pages.
Machine generated translation of Foreign Patent submission #82 (JP2014518060), retrieved online Aug. 11, 2023, 18 pages.
Machine generated translation of Foreign Patent submission #83 (JP2015528266), retrieved online Aug. 11, 2023, 9 pages.
Machine generated translation of Foreign Patent submission #84 (JP2017530449), retrieved online Aug. 11, 2023, 23 pages.
Machine generated translation of Foreign Patent submission #85 (JP3717420), retrieved online Aug. 11, 2023, 22 pages.
Machine generated translation of Foreign Patent submission #86 (JP5662877), retrieved online Aug. 11, 2023, 13 pages.
Machine generated translation of Foreign Patent submission #87 (KR100907946), retrieved online Aug. 11, 2023, 15 pages.
Machine generated translation of Foreign Patent submission #88 (KR101399235), retrieved online Aug. 11, 2023, 19 pages.
Machine generated translation of Foreign Patent submission #89 (KR20090012523), retrieved online Aug. 11, 2023, 16 pages.
Machine generated translation of Foreign Patent submission #90 (KR20180084285), retrieved online Aug. 11, 2023, 19 pages.
Machine generated translation of Foreign Patent submission #93 (RU2642422), retrieved online Aug. 11, 2023, 27 pages.
Machine generated translation of Foreign Patent submission #95 (TW201214093), retrieved online Aug. 11, 2023, 6 pages.
Machine generated translation of Foreign Patent submission #96 (TW201526774), retrieved online Aug. 11, 2023, 6 pages.
Machine generated translation of Foreign Patent submission #101 (WO2010050249), retrieved online Aug. 11, 2023, 23 pages.
Machine generated translation of Foreign Patent submission #110 (WO2014185311), retrieved online Aug. 11, 2023, 13 pages.
Wiki, Mining, accessed Jan. 19, 2017, 4 pages, URL=https://en.bitcoin.it/wiki/Mining.
Wiki, Google Modular Data Center, accessed Oct. 5, 2019 but available at least as early as Feb. 8, 2017, 2 pages, URL=https://en.wikipedia.org/wiki/Google_Modular_Data_Center.
Bitfury, Block Box AC Mobile Datacenter, available at least as early as Feb. 8, 2017, 3 pages, screenshots taken from Wayback machine Internet archive, URL=https://web.archive.org/web/20170130043612/http:/bitfury.com/products#blockbox-ac.
Wiki, Intermodal Container, accessed Oct. 5, 2019 but available at least as early as Feb. 8, 2017, 24 pages, URL=https://en.wikipedia.org/wiki/Intermodal_container 6/.
Wiki, Sun Modular Datacenter, accessed Oct. 5, 2019 but available at least as early as Feb. 8, 2017, 3 pages, URL=https://en.wikipedia.org/wiki/Sun_Modular_Datacenter.
Bitcoin Container, 10ft Bitcoin Mining Container, accessed Sep. 5, 2019 available at least as early as May 14, 2019, 5 pages, URL=https://bitcoincontainer.com/products/10ft-bitcoin-mining-container.
Bitfury, BlockBox AC, available at least as early as May 9, 2019, 7 pages, URL=https://bitfury.com/content/downloads/blockboxacbrochure176v2.pdf.
Iwando Blockchain, Crypto Mining Container, available at least as early as May 9, 2019, 9 pages, URL=https://blockchain.iwando.com/en/crypto-mining-container/.
EZ Blockchain, EZ Smartbox, available at least as May 9, 2019, 5 pages, URL=https://www.ezblockchain.net/smart-box.html.
Miningstore, BitCave, accessed May 9, 2019 but available at least as early as Mar. 27, 2019, 4 pages, URL=https://miningstore.com/bitcoin-mining-containers/bitcave/.
SOLminer, SOLminer Cube, accessed May 9, 2019 but available at least as early as Sep. 16, 2018, 7 pages, URL=https://solminer.io/mobile-mining-system/.
Nordcoin Mining, Mobile Mining Container, accessed May 9, 2019 but available as early as Feb. 6, 2019, 7 pages, URL=https://www.nordcoinmining.com/.
Power Mining, Mobile Mining Unit ASIC-184, accessed May 9, 2019 but available as early as Dec. 27, 2018, 8 pages, URL=https://www.powerminingshop.com/pdf/Power_Mining_Crpyo_Container_ASIC_184.pdf.
Bitmain, Antminer T9+, accessed Apr. 24, 2019 but available as early as Feb. 3, 2018, 3 pages, Screenshots taken from Wayback machine Internet archive, URL=https://web.archive.org/web/20180217221522/http://shop.bitmain.com/productDetail.htm?pid=0002018013013021285 06gKIcpoR06AA.
Sea-Can Containers LTD, Shipping Containers, accessed Jan. 17, 2020 but available as early as Jul. 3, 2018, 3 pages, Screenshots taken from Wayback machine Internet archive, URL=https://web.archive.org/web/20180703184711/http://seacan.com/shipping-containers/.
International Search report and written opinion for PCT/CA2020/050426, dated Jun. 25, 2020, 14 pages.

* cited by examiner

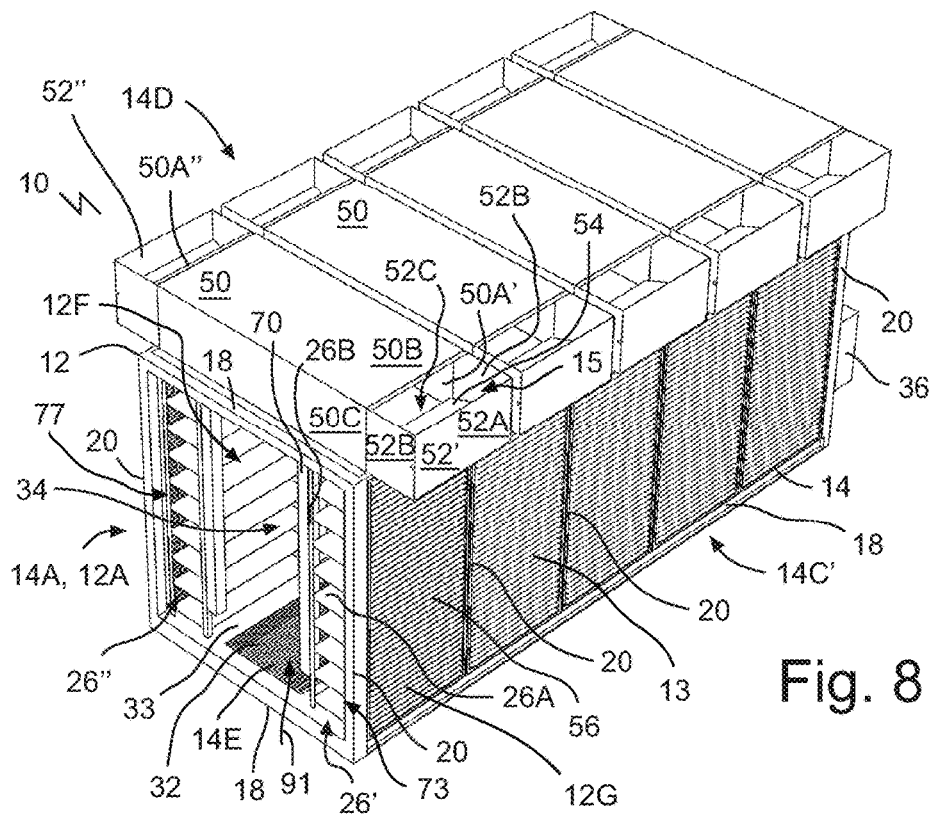
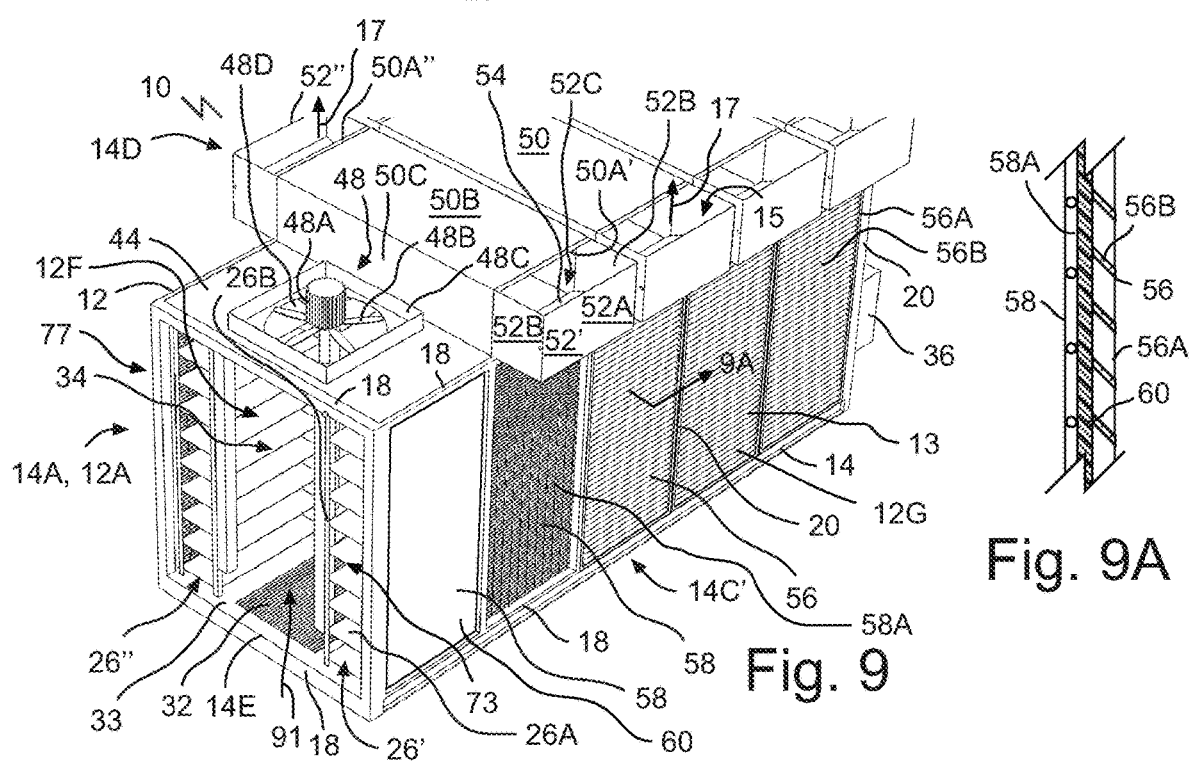

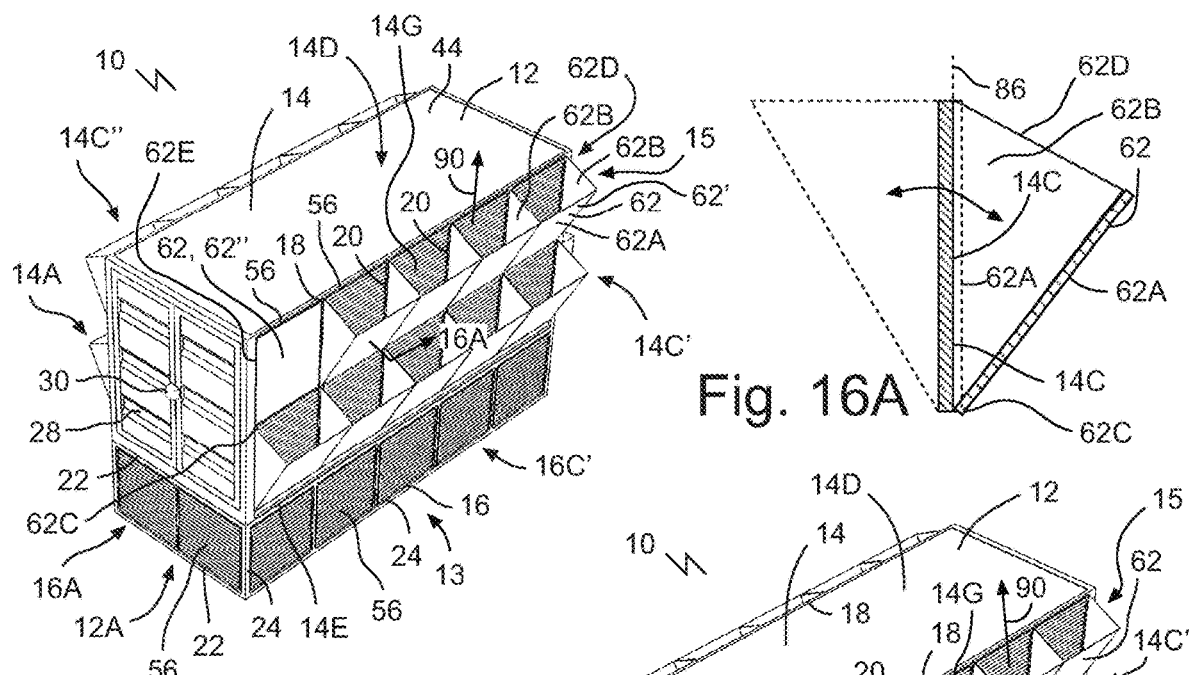
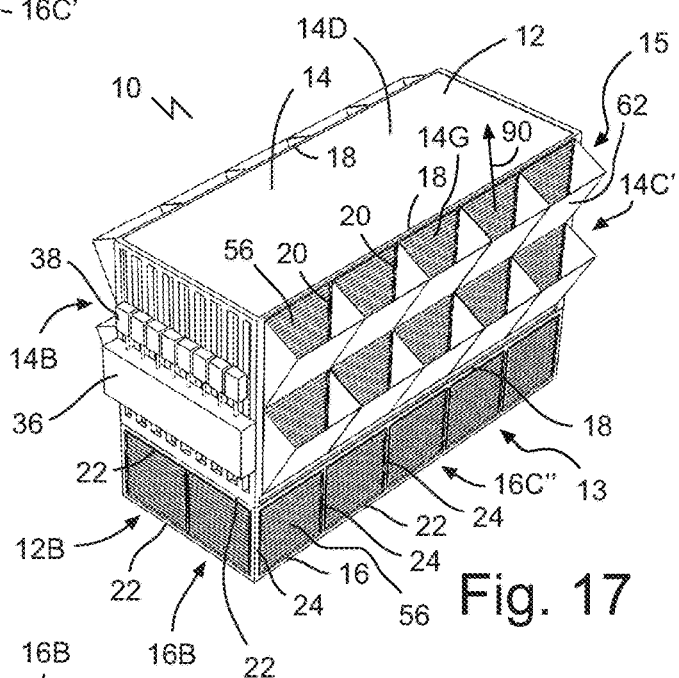
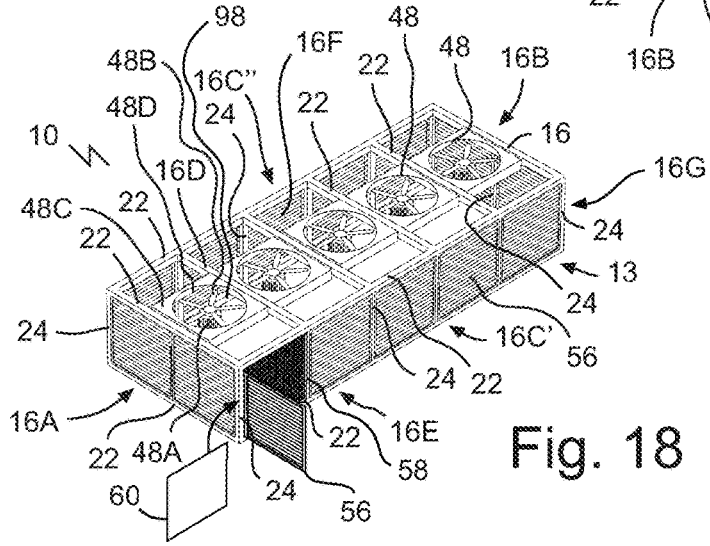

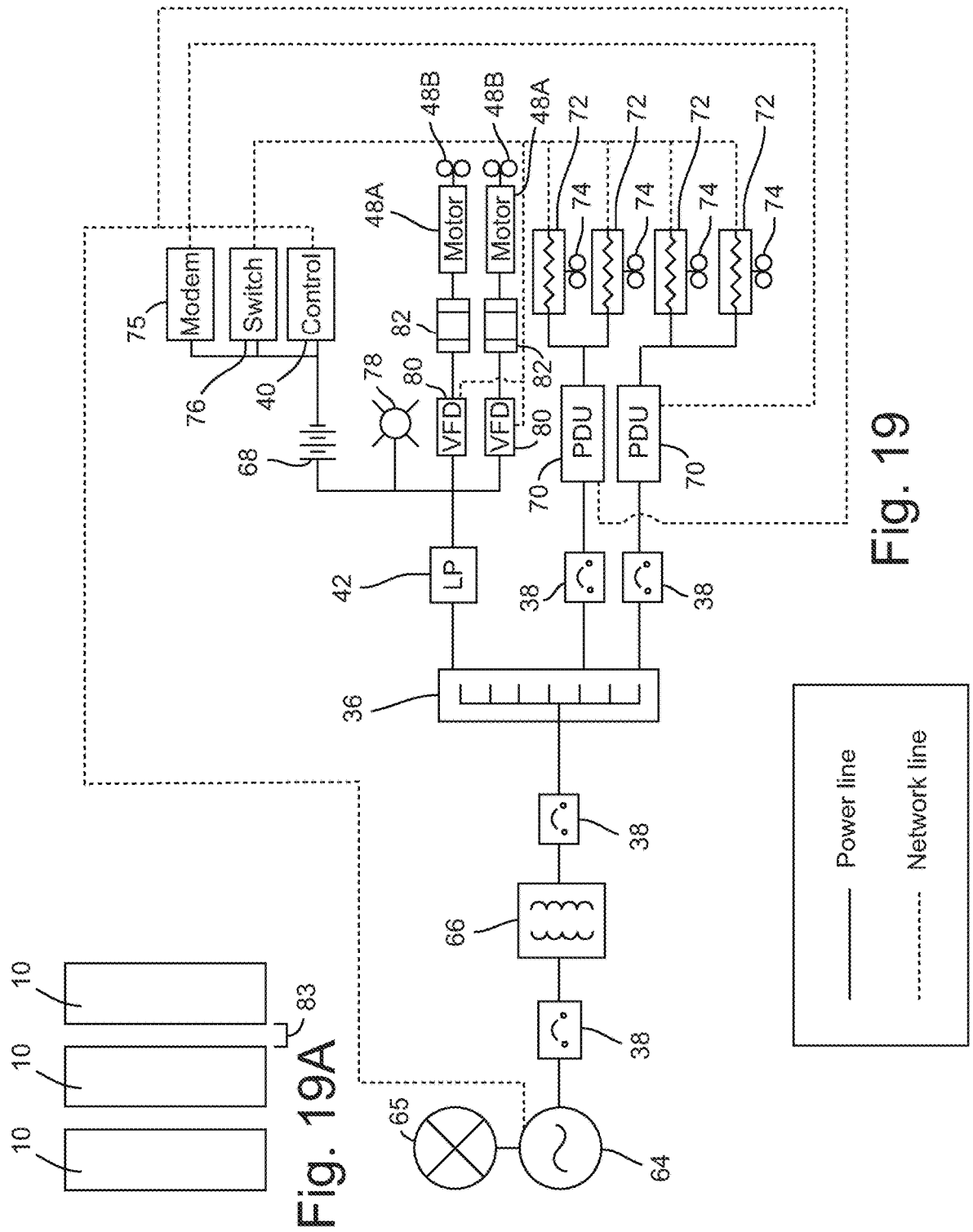

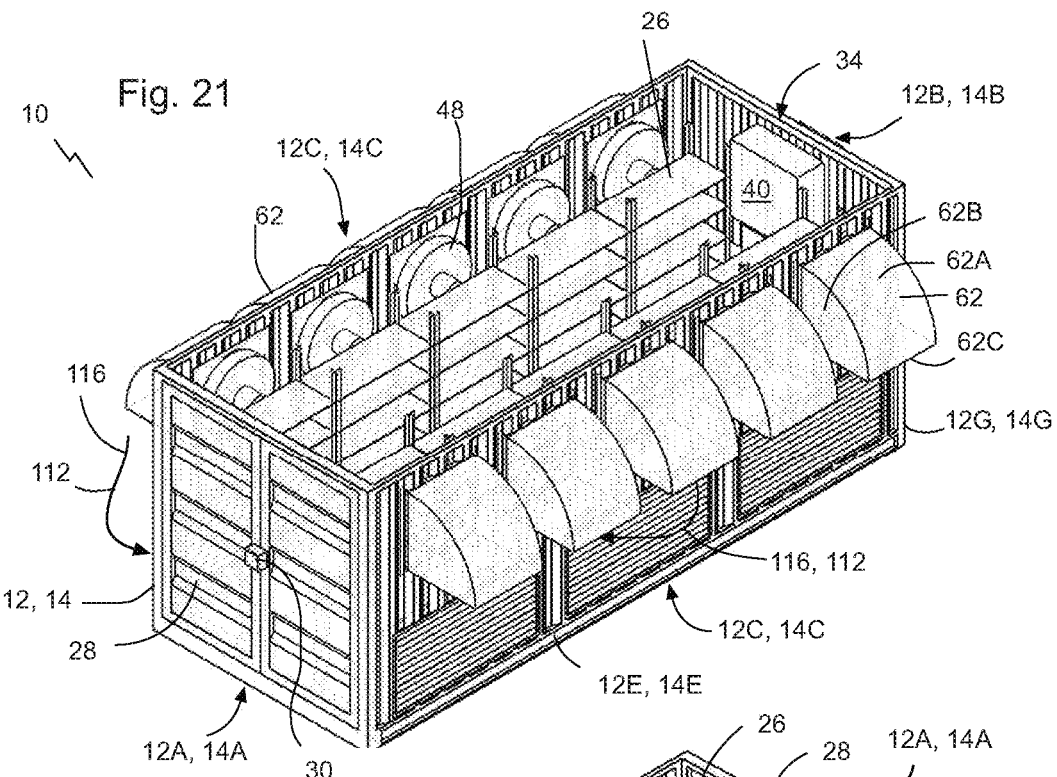
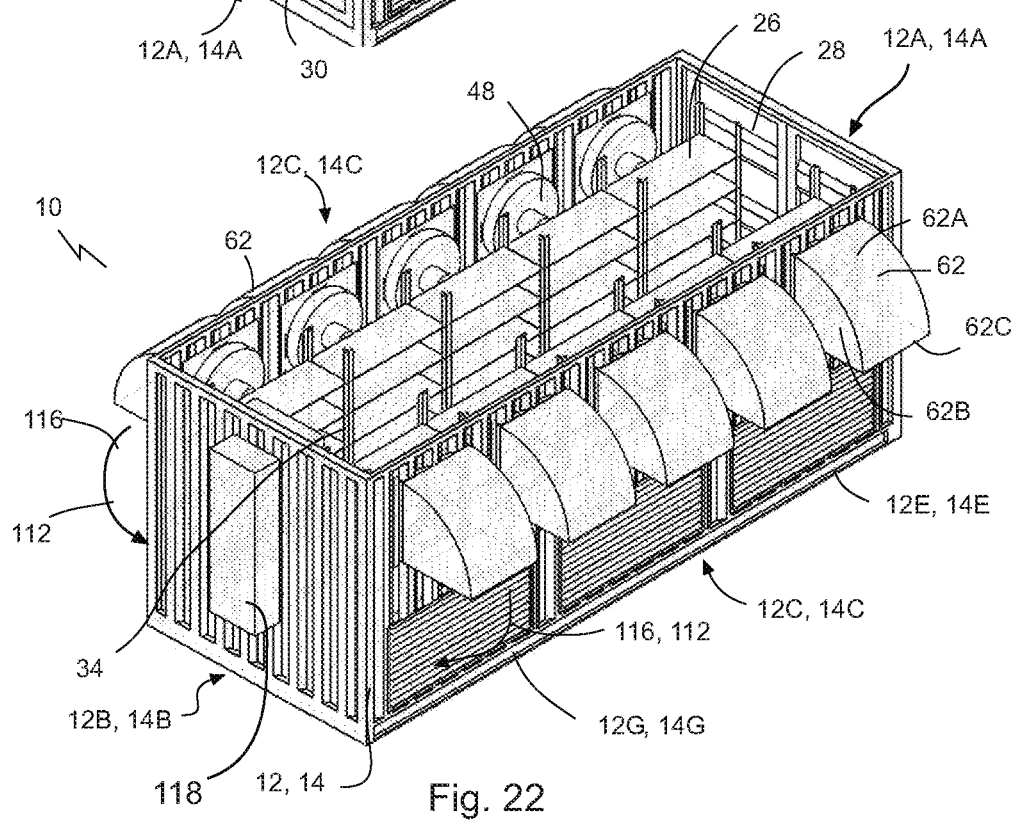

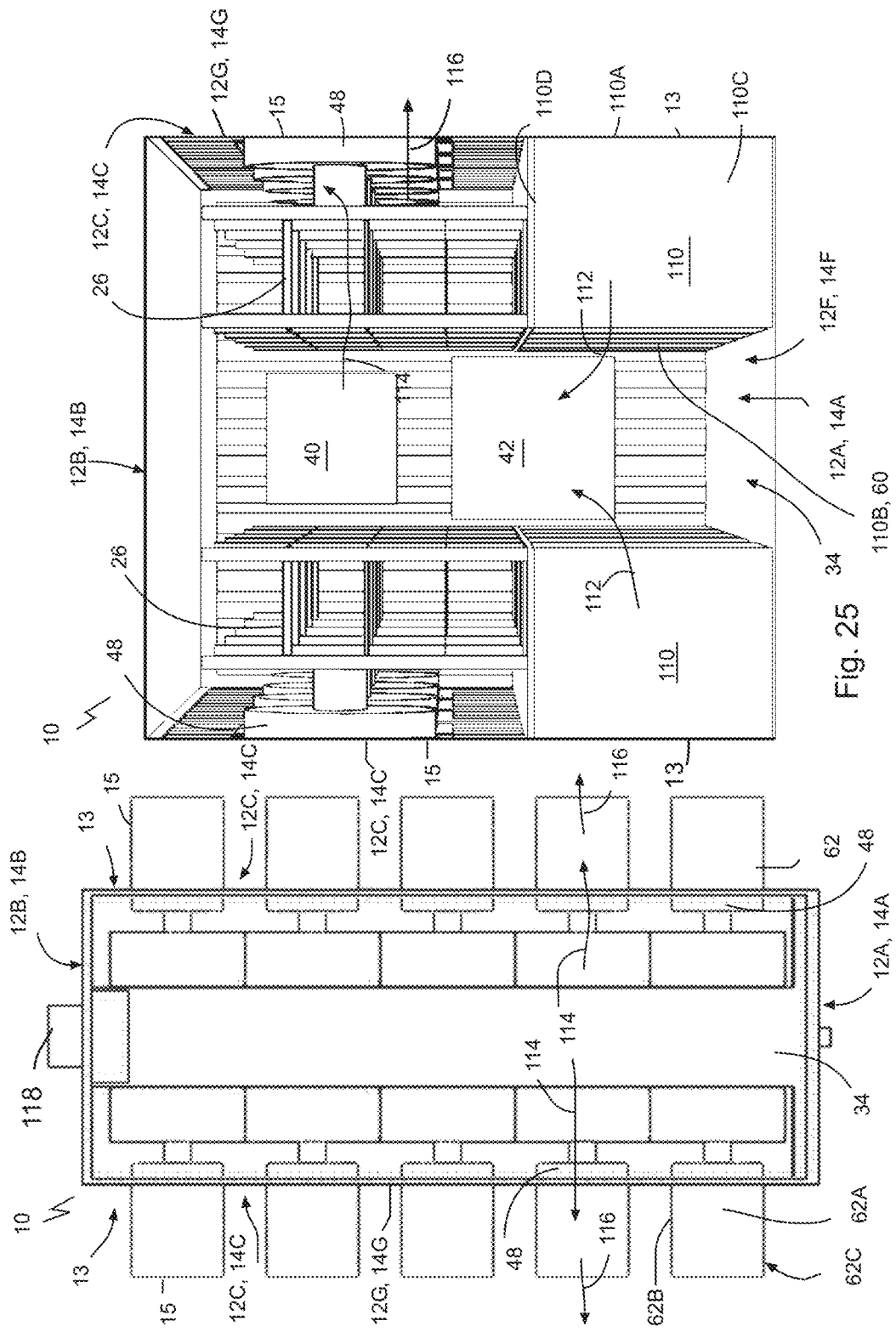

PORTABLE BLOCKCHAIN MINING SYSTEM AND METHODS OF USE

TECHNICAL FIELD

This document relates to portable blockchain mining systems and methods of use.

BACKGROUND

Intermodal transport container units are known to be used to house plural cryptocurrency mining processors connected through the internet to verify cryptocurrency transactions. Such units consume enormous amounts of electricity and generate excessive heat as a result.

SUMMARY

A portable blockchain mining system is disclosed comprising: a portable building; a plurality of blockchain mining processors mounted within, or a plurality of blockchain mining processor mounts located within, an interior of the portable building; an air inlet defined in the portable building; an air outlet defined in the portable building above the air inlet and oriented to direct exhaust air in, for example an upward direction, out of the portable building; and a cooling fan connected to convey air through the air inlet, across the plurality of blockchain mining processors and out the air outlet.

A plurality of the portable blockchain mining systems may be positioned laterally adjacent one another in close proximity.

A system is disclosed comprising a portable blockchain mining system and a power source connected to supply power to the portable blockchain mining system.

A method is disclosed comprising operating the plurality of blockchain mining processors of the portable blockchain mining system.

A method is disclosed comprising: operating a plurality of blockchain mining processors mounted within an interior of a portable building; and operating a cooling fan to convey air in sequence: through an air inlet into the interior of the portable building; across the plurality of blockchain mining processors; and out of the portable building through an air outlet that is above the air inlet.

A portable Bitcoin mining data center is disclosed comprising:
a. Two racks/shelves of Bitcoin ASICs separated by an aisle,
b. Airflow from ASICs pointed toward the aisle,
c. Fans drawing negative pressure (below ambient pressure), with fans mounted above the interior, and air drawn in through the side walls through filters, through the intake of the ASICs and out the discharge, into the aisle, upward into the fan intake and discharged into ducting, with air directed out of the building, and the ability to change whether exhausted air is directed upward and away and/or downward toward the intake, by an adjustable baffle or similar mechanism,
d. optionally the floor is breathable,
e. optionally the portable mining data center building is a seacan,
f. the intake louvers are removable & filters are replaceable from the outside,
g. the side walls are reinforced with a strong, secure and breathable material such as steel grating,
h. two or more portable mining datacenters can be placed in close proximity without warm air entering the other datacenter's intake.

A portable Bitcoin mining data center is disclosed comprising:
a. two racks/shelves of Bitcoin ASICs separated by an aisle,
b. airflow from ASICs is pointed away from the aisle,
c. the floor is elevated from the ground level, air drawn in through the lower side wall through filters, up through fans mounted under the breathable floor, up into the mining datacenter room creating positive pressure, through the intake of the ASICs on both aisles and out the discharge, out of exhaust louvers, and exhausted upwards and away from datacenter via ducts,
d. optionally the portable mining data center building is a seacan,
e. the intake louvers are removable & filters are replaceable from the outside,
f. the side walls are reinforced with a strong, secure and breathable material such as a steel grating to increase difficulty of break-in,
g. two or more portable mining datacenters can be placed in close proximity without warm air entering the other datacenter's intake,
h. the pusher fans are integral to the mining datacenter, and
i. the pusher fans are integral to a separate skid base stand for the mining datacenter.

In various embodiments, there may be included any one or more of the following features: The air outlet is oriented to direct exhaust air in an upward direction out of the portable building. A first group of the plurality of blockchain mining processors are mounted adjacent a first side wall of the portable building. A second group of the plurality of blockchain mining processors are mounted adjacent a second side wall of the portable building, the second side wall opposed to the first side wall, with an aisle defined between the first group and the second group. The first group and the second group are mounted on a first rack and a second rack, respectively, with the aisle defined between the first rack and the second rack. The air inlet is defined in a side wall of the portable building. Each blockchain mining processor has associated with it a processor fan, which is oriented to direct air from the air inlet laterally across the respective blockchain mining processor and toward a center of the interior of the portable building. A security grating defining the air inlet in the side wall. The security grating is one of a plurality of metal security grating panels that collectively define the air inlet; the side wall is formed of a structural frame of beams and columns; and the plurality of metal security grating panels are mounted between the beams and columns. An air filter positioned across the security grating. The air filter is mounted adjacent an exterior of the security grating, with the portable blockchain mining system structured to permit access to the air filter from outside the portable blockchain mining system. A gate securing the air filter adjacent the exterior of the security grating. The gate comprises a louver panel. At least 75% of a total external surface area of the side wall forms the air inlet. The side wall is a first side wall, and the air inlet is also defined in a second side wall of the portable building, the second side wall being opposed to the first side wall. The air outlet and the air inlet are defined in the same side wall or side walls of the portable building. The plurality of blockchain mining processors are mounted adjacent the air outlet above the air inlet. In which the portable building is structured such that in use air moves in sequence:

into the portable building through the air inlet; below the plurality of blockchain processors toward a center of an interior of the portable building; and up and laterally over the plurality of blockchain processors and out the air outlet in the side wall. The air outlet and the air inlet are oriented to recirculate air exhausted from the air outlet back into the air inlet. The cooling fan is mounted adjacent the air outlet to pull air through the interior to the air outlet. A roof of the portable building defines an air outlet or a roof air passage to the air outlet. A plenum is mounted on the roof and defines the air outlet. The plenum comprises ducting that extends along the roof to over a lateral side of the portable building where the air outlet is defined by the ducting. The ducting has an open lateral end, and an exhaust guide is mounted for telescopic lateral movement in the open lateral end between a retracted, closed position, and an extended, open position. In the retracted, closed position, the exhaust guide is inset within a plane defined by a respective side wall directly below the open lateral end; and in the extended, open position, the exhaust guide extends laterally away from the side wall and beyond the plane. The exhaust guide has an upper exhaust and a lower exhaust that direct exhaust air in the upward direction and a downward direction, respectively. The exhaust guide has a baffle that is structured to move between: a recirculation position where exhaust air is directed in the downward direction to the air inlet; and a regular position where exhaust air is directed in the upward direction. The baffle has an intermediate position where exhaust air is directed in both the downward direction and the upward direction. The cooling fan is mounted adjacent the roof to pull air through the interior to the air outlet. At least 20% of a total external surface area of the roof forms the air inlet or the roof air passage to the air outlet. A floor of the portable building defines the air inlet or a floor air passage to the air inlet. A floor of the portable building defines the air inlet or a floor air passage to the air inlet. The portable building comprises an upper frame and a lower frame separated by the floor, with the plurality of blockchain mining processors mounted within the upper frame. The cooling fan is mounted adjacent the floor to push air through the air inlet or floor air passage into the interior. The air inlet is defined in a side wall of the lower frame. A security grating defining the air inlet in the side wall. The security grating is one of a plurality of metal security grating panels that collectively define the air inlet; the side wall is formed of a structural frame of beams and columns; and the plurality of metal security grating panels are mounted between the beams and columns. An air filter positioned across the security grating. The air filter is mounted adjacent an exterior of the security grating, with the portable blockchain mining system structured to permit access to the air filter from outside the portable blockchain mining system. A gate securing the air filter adjacent the exterior of the security grating. The gate comprises a louver panel. At least 75% of a total external surface area of the side wall forms the air inlet. The side wall is a first side wall, and the air inlet is also defined in a second side wall of the lower frame, the second side wall being opposed to the first side wall. The air inlet is also defined in a first end wall and a second end wall of the lower frame, the second end wall being opposed to the first end wall. The air outlet is defined in a side wall of the upper frame. Each blockchain mining processor has associated with it a processor fan, which is oriented to direct air from a center of the interior laterally across the respective blockchain mining processor and toward the air outlet in the side wall of the upper frame. A security grating defining the air outlet in the side wall of the upper frame. The security grating is one of a plurality of metal security grating panels that collectively define the air outlet; the side wall of the upper frame is formed of a structural frame of beams and columns; and the plurality of metal security grating panels are mounted between the beams and columns of the side wall of the upper frame. The side wall of the upper frame comprises a louver panel across the air outlet. At least 75% of a total external surface area of the side wall of the upper frame forms the air outlet. The side wall of the upper frame is a first side wall, and the air outlet is also defined in a second side wall of the upper frame, the second side wall of the upper frame being opposed to the first side wall of the upper frame. An exhaust guide mounted to an exterior of the side wall of the upper frame to direct exhaust air in an upward direction. The exhaust guide comprises a scoop that extends laterally outward from the exterior of the side wall of the upper frame and has an open top end that defines the air outlet. The exhaust guide is moveable between an open position, and a closed position where the exhaust guide is laterally retracted adjacent or into the exterior of the side wall of the upper frame. The exhaust guide is moveable between: an upward position where the exhaust guide directs exhaust air in an upward direction; and a recirculation position where the exhaust guide directs exhaust air in a downward direction toward the air inlet. The air outlet directs exhausted air to recirculate back into the interior of the portable building through the air outlet. The method is carried out in winter. The power source comprises: a source of combustible gas produced from an oil production, storage, or processing facility; and a generator connected to the source of combustible gas. The power source comprises a source of power from other than an oil or gas well, for example the power source comprises grid or other utility power. The blockchain mining processor has a network interface; the network interface is connected to receive and transmit data through the internet to a network that stores or has access to a blockchain database; and the mining processor is connected to the network interface and adapted to mine transactions into blocks associated with the blockchain database and to communicate with the blockchain database. The network is a peer to peer network; the blockchain database is a distributed database stored on plural nodes in the peer to peer network; and the blockchain database stores transactional information for a digital currency. A controller is connected to operate a ventilation, heating and cooling system to maintain the blockchain mining processor within a predetermined operating range of temperature. The blockchain mining system is mounted on a skid or trailer. The skid or trailer comprises a generator driven by an engine, which is connected to the source of combustible gas. The engine comprises a turbine. The generator and engine may be mounted integral to the skid, trailer, or blockchain mining system. The blockchain mining system comprises an intermodal transport container as the portable building. Operating the blockchain mining system to: mine transactions with the blockchain mining system, for example by mining the most recent block on the blockchain with the blockchain mining system; and communicate wirelessly through the internet to communicate with a blockchain database. The network interfaces comprise one or more of a satellite, cellular, or radio antenna, connected to a modem. Successfully mining a block by a mining processor provides a reward of the digital currency, and the reward is assigned to a digital wallet or address stored on a computer readable medium. The system may run on polyphase (three phase) power or single-phase power.

These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which:

FIGS. 8 and 9 are upper perspective views of a rear end of the portable blockchain mining system of FIG. 1, with FIG. 9 differing from FIG. 8 in that in FIG. 9 one of the plenums is removed to illustrate the location of the cooling fan. FIG. 9A is a cross-sectional view taken along the 9A section lines from FIG. 9.

FIG. 16 is an upper perspective view of a rear end of the blockchain mining system of FIG. 12, illustrating the left most exhaust guide in the closed position.

FIG. 16A is a section view taken along the 16A section lines in FIG. 16, showing the exhaust guide in the open position (solid lines) and closed position (dashed lines).

FIG. 17 is an upper perspective view of a front end of the blockchain mining system of FIG. 12.

FIG. 18 is an upper perspective view of a front end of a lower frame of the blockchain mining system of FIG. 12, with one of the louver gates open and a replacement air filter being inserted.

FIG. 19 is a schematic of the electrical and network components of the blockchain mining system of FIGS. 1 and 12.

FIG. 19A is a top plan view of a plurality of blockchain mining systems in close lateral proximity at a location.

FIGS. 21 and 22 are front and rear perspective view, respectively, of the system of FIG. 20 with the roof removed and made partially transparent to show the interior components.

FIG. 24 is a simplified front elevation view of the system of FIG. 20 with the front door and rear wall removed for clarity.

FIG. 25 is a simplified front elevation view of the system of FIG. 20 with the front door and exhaust guides removed for clarity.

DETAILED DESCRIPTION

Figure 1:
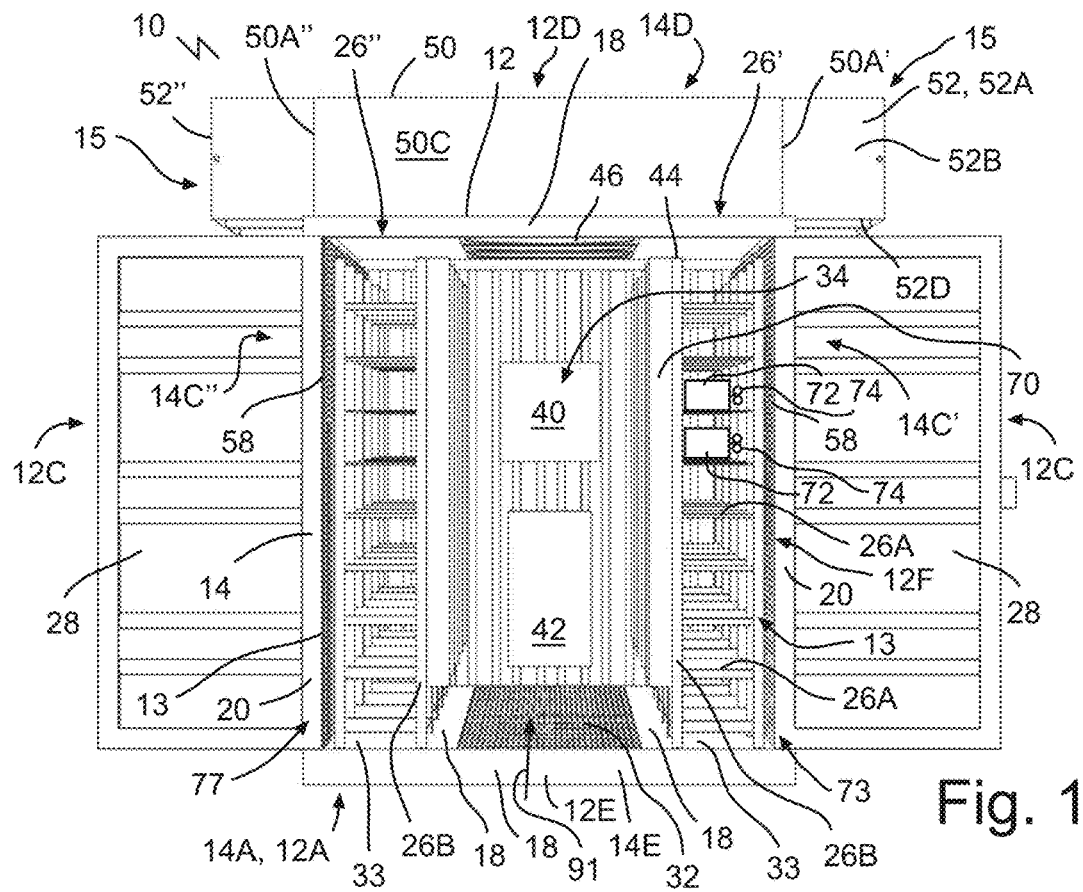
FIG. 1 is a perspective rear end view of a portable blockchain mining system.

Immaterial modifications may be made to the embodiments described here without departing from what is covered by the claims.

A cryptocurrency (or crypto currency) is a digital asset designed to work as a medium of exchange that uses strong cryptography to secure financial transactions, control the creation of additional units, and verify the transfer of assets. Cryptocurrencies use decentralized control as opposed to centralized digital currency and central banking systems. The decentralized control of each cryptocurrency works through distributed ledger technology, typically a blockchain that serves as a public financial transaction database.

A blockchain is a form of database, which may be saved as a distributed ledger in a network of nodes that maintains a continuously-growing list of records called blocks. Each block contains a timestamp and a link to a previous block. The data in a block cannot be altered retrospectively without significant computational effort and majority consensus of the network. The first blockchain was conceptualized by Satoshi Nakamoto in 2008 and implemented the following year as a core component of the digital currency, Bitcoin where it serves as the public ledger for all transactions. Through the use of a peer-to-peer network and a distributed timestamping server, a blockchain database is managed autonomously. The administration of Bitcoin currency is currently the primary use for blockchain technology, but there are other use cases for blockchain technology to maintain accurate, tamper-proof databases. Examples include maintaining records of land titles and historical events. While the potential in blockchain technology is vast, Bitcoin remains the most widely used today.

Altcoins are cryptocurrencies other than Bitcoin. The majority of altcoins are forks of Bitcoin with small uninteresting changes. There are various ways of which altcoins differ from standard Bitcoin processing or structure. For example, altcoins may differ from Bitcoin by having one or more of a) a different proof-of-work algorithm, b) a proof of stake model, or c) an application that either is not itself a currency or is built on top of a cryptocurrency, such as asset tracking in a supply chain system, or a digital contract system. Since the release of Bitcoin, over 4,000 altcoins have been created.

By design blockchains are inherently resistant (and assumed to be effectively impervious) to modification of the data—once recorded, the data in a block cannot be altered retroactively without network consensus. Blockchains are an open, distributed ledger that can record transactions between two parties efficiently and in a verifiable and permanent way. The ledger itself can also be programmed to trigger transactions automatically. Blockchains are secure by design and an example of a distributed computing system with high *byzantine* fault tolerance. Decentralized consensus can therefore be achieved with a blockchain. This makes the blockchain model suitable for the recording of events, medical records, and other records management activities, identity management, transaction processing and proving provenance. This offers the potential of mass disintermediation and vast repercussions for how global trade is conducted.

A blockchain facilitates secure online transactions. A blockchain is a decentralized digital ledger that records transactions on thousands of computers globally in such a way that the registered transactions cannot be altered retrospectively. This allows the participants to verify and audit transactions in an inexpensive manner Transactions are authenticated by mass collaboration powered by collective self-interests. The result is a robust workflow where participants' uncertainty regarding data security is marginal. The use of a blockchain removes the characteristic of infinite reproducibility from a digital asset. It confirms that each unit of digital cash was spent only once, solving the long-standing problem of double spending. Blockchains have been described as a value-exchange protocol. This exchange of value can be completed more quickly, more safely and more cheaply with a blockchain A blockchain can assign title rights because it provides a record that compels offer and acceptance. From the technical point of view a blockchain is a hashchain inside another hashchain.

A blockchain database may comprise two kinds of records: transactions and blocks. Blocks may hold batches of valid transactions that are hashed and encoded into a Merkle tree. Each block may include the hash of the prior block in the blockchain, linking the two. Variants of this format were used previously, for example in Git, and may not by itself be sufficient to qualify as a blockchain. The linked blocks form a chain. This iterative process confirms the integrity of the previous block, all the way back to the original genesis block. Some blockchains create a new block as frequently as every five or fewer seconds. As blockchains age they are said to grow in height. Blocks are structured by division into layers.

Sometimes separate blocks may be validated concurrently, creating a temporary fork. In addition to a secure hash based history, each blockchain has a specified algorithm for scoring different versions of the history so that one with a higher value can be selected over others. Blocks that are not selected for inclusion in the chain are called orphan blocks. Peers supporting the database don't have exactly the same version of the history at all times, rather they keep the highest scoring version of the database that they currently know of Whenever a peer receives a higher scoring version (usually the old version with a single new block added) they extend or overwrite their own database and retransmit the improvement to their peers. There is never an absolute guarantee that any particular entry will remain in the best version of the history forever, but because blockchains are typically built to add the score of new blocks onto old blocks and there are incentives to only work on extending with new blocks rather than overwriting old blocks, the probability of an entry becoming superseded goes down exponentially as more blocks are built on top of it, eventually becoming very low. For example, in a blockchain using the proof-of-work system, the chain with the most cumulative proof-of-work is always considered the valid one by the network. In practice there are a number of methods that can demonstrate a sufficient level of computation. Within a blockchain the computation is carried out redundantly rather than in the traditional segregated and parallel manner.

Maintaining a blockchain database is referred to as mining, which refers to the distributed computational review process performed on each block of data in a block-chain. This allows for achievement of consensus in an environment where neither party knows or trusts each other. Those engaged in Bitcoin mining are rewarded for their effort with newly created Bitcoins and transaction fees, which may be transferred to a digital wallet of a user upon completion of a designated task. Bitcoin miners may be located anywhere globally and may be operated by anyone. The mining hardware is tied to the blockchain network via an internet connection. Thus, little infrastructure is needed to operate and contribute to the system. All that is required to become a Bitcoin miner is the appropriate computer hardware, an internet connection and low cost electricity. The cheaper the electricity the more reward the miner will receive relative to competition, other miners.

Mining also includes the process of adding transaction records to Bitcoin's public ledger of past transactions. This ledger of past transactions is referred to as the blockchain as it is essentially a chain of blocks. The blockchain serves to confirm transactions to the rest of the network as having taken place. Bitcoin nodes use the blockchain to distinguish legitimate Bitcoin transactions from attempts to re-spend coins that have already been spent elsewhere Mining may be intentionally designed to be resource-intensive and difficult so that the number of blocks found each day by miners remains steady. Individual blocks may be required to contain a proof-of-work to be considered valid. This proof-of-work is verified by other Bitcoin nodes each time they receive a block. Bitcoin presently uses the hashcash proof-of-work function.

One purpose of mining is to allow Bitcoin nodes to reach a secure, tamper-resistant consensus. Mining may also be the mechanism used to introduce Bitcoins into the system: Miners are paid any transaction fees as well as a subsidy of newly created coins. This both serves the purpose of disseminating new coins in a decentralized manner as well as motivating people to provide security for the system. Bitcoin mining is so called because it resembles the mining of other commodities: it requires exertion and it slowly makes new currency available at a rate that resembles the rate at which commodities like gold are mined from the ground.

Mining requires computational effort in the form of CPU cycles (CPU=central processing unit or central processor) to run a cryptographic hashing algorithm associated with the particular blockchain protocol. For a given mining processor, one can modify the computational effort through changing the core voltage or the clock rate of the processor. Doing so may result in more or less power consumed by the mining processor, and in some embodiments within this document such changes are described as changing the mining activity, or hashrate.

As the total network computational effort (or hashrate) increases on a blockchain over time, the probability for an individual miner to find a block and receive a reward diminishes. Today the Bitcoin network is so large that most individuals engaged in mining Bitcoin typically mine in pools using protocols such as the Stratum Mining Protocol. Pooling resources allows individual miners to increase their reward frequency as a trade-off for splitting the block reward with the rest of the pool. Miners who are pool mining do not need the associated equipment needed to run a mining node as they only need compute and submit proof-of-work shares issued by the mining pool.

Since the energy cost of running blockchain mining equipment is its primary operating cost, a trend towards mining on low-cost hydroelectric power has become prevalent. This trend has promoted the centralization of blockchain miners in specific countries with abundant hydroelectric power, as miners who do not have access to cheap hydroelectricity cannot mine profitably because they are competing with the miners who do have access. Bitcoin mining centralization has been occurring in China where there is abundant low cost hydroelectric power. Centralization in blockchain mining is undesirable because the premise behind the blockchain innovation is not to have to trust a third party and to have inherent confidence and security through a decentralized, distributed network. Thus, there exists a need to further decentralize Bitcoin and other blockchain mining through a more decentralized source of low-cost power.

An intermodal transport container is a large standardized shipping container, designed and built for intermodal freight transport, meaning these containers can be used across different modes of transport—from ship to rail to truck—without unloading and reloading their cargo. Intermodal containers are primarily used to store and transport materials and products efficiently and securely in the global containerized intermodal freight transport system, but smaller numbers are in regional use as well. These containers are known under a number of names, such as simply container, cargo or freight container, ISO container, shipping, sea or ocean container, sea van or (Conex) box, sea can or C can.

Intermodal transport containers exist in many types and a number of standardized sizes, but ninety percent of the global container fleet are so-called "dry freight" or "general purpose" containers, durable closed steel boxes, mostly of either twenty or forty feet standard length, although other lengths may be used. In some cases transport containers have a range of lengths from eight to sixty feet. Common heights are eight feet six inches and nine feet six inches, with the latter often referred to as High Cube or Hi-Cube containers, although other heights may be used. Common widths are eight feet, although other widths may be used such as six foot three inches, eight foot six inches, or larger or smaller. Transport containers are a means to bundle cargo and goods into larger, unitized loads, that can be easily handled, moved, and stacked, and that will pack tightly in a ship or yard. Intermodal containers share a number of key construction features to withstand the stresses of intermodal shipping, to facilitate their handling and to allow stacking, as well as being identifiable through their individual, unique ISO 6346 reporting mark.

Transport containers may be transferred between rail, truck, and ship by container cranes at container terminals. Forklifts, reach stackers, straddle carriers, and cranes may be used to load and unload trucks or trains outside of container terminals. Swap bodies, sidelifters, tilt deck trucks, and hook trucks may allow transfer to and from trucks with no extra equipment. ISO-standard containers can be handled and lifted in a variety of ways by their corner fixtures, but the structure and strength of forty five-foot (type E) containers limits their tolerance of side-lifting, nor can they be forklifted, based on ISO 3874 (1997).

Transport containers can be transported by container ship, truck and freight trains as part of a single journey without unpacking. Transport containers often include corrugated walls for strength. Each corner of the container may include a twistlock fitting or other fitting for securing the container to other containers and to various transportation devices such as a container trailer for a road-based tractor unit. Reinforcing beams may span the edges of the container, for example the vertical columns that make up the four corners between sidewalls, and the horizontal beams that make up the longitudinal and lateral side edges of the base of the container.

Half the containers that enter the United States are believed to leave empty. The value of such containers in the U.S. is thus lower than in China, and such containers are thus available for use with non-freight-related purposes. For example, the U.S. military often used its Conex containers as on-site storage, or easily transportable housing for command staff and medical clinics. Repurposing used shipping containers offers a practical solution to both social and ecological problems.

A transport container may be used to provide a modular data center system, which is a portable method of deploying data center capacity at a remote location. A modular data center may be placed anywhere data capacity is needed. A modular data center system may include purpose-engineered modules and components to offer scalable data center capacity with multiple power and cooling options. Modules may be shipped to be added, integrated or retrofitted into an existing data center or combined into a system of modules. Modular data centers typically consist of standardized components. A modular data center may fit data center equipment (servers, storage and networking equipment) into a standard shipping container, which is then transported to a desired location. A containerized data center may come outfitted with its own cooling system.

Figure 2:
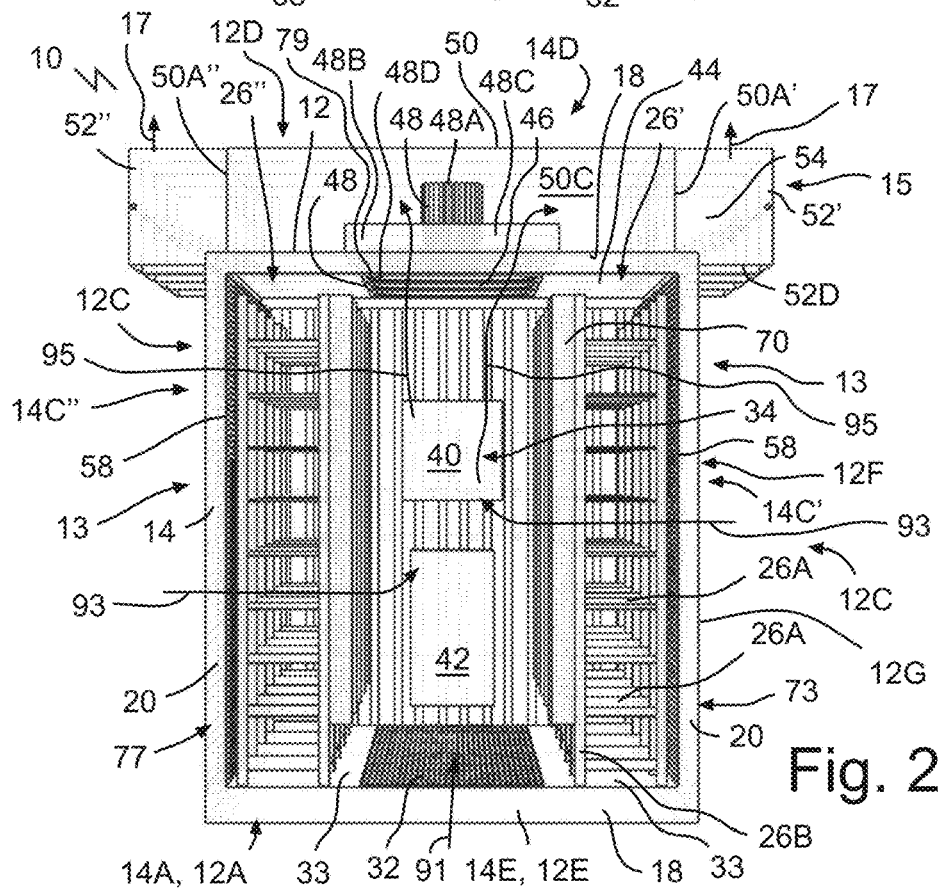
FIG. 2 is a perspective rear end view of the portable blockchain mining system of FIG. 1 with the doors removed and the internal fans and plenums shown in dashed lines.

Referring to FIGS. 1-11, a portable blockchain mining system 10 is disclosed, comprising a portable building, such as a transport container 12, an air inlet 13, an air outlet 15, and a cooling fan 48. The portable building/portable system 10 may be a self-contained unit that can be moved by truck, trailer, railcar, forklift, container lifter, or other suitable method of lifting an intermodal shipping container, and placed on a ground surface at a suitable remote location, with the ability to operate fully self-contained or only requiring a source of power to be connected (although other connections may be made such as connections to internet lines, utility lines, and others). Referring to FIG. 1, system 10 a plurality of mounts (such as racks 26) suitable for blockchain mining processors 72 may be structured within interior 12F. In some embodiments the racks 26 or other mounts are vacant, and in some cases a plurality of processors 72 may themselves be mounted within an interior 12F of the transport container 12. Referring to FIGS. 1, 2, 10, and 11, the transport container 12 may have a front end wall 12A, a rear end wall 12B, side walls 12C, a roof 12D, and a base 12E, which may collectively define interior 12F. In this document, the suffixes and "may be appended to reference characters to indicate that there are more than one of the respective part, for example there are two side walls 12C' and 12C'', and it should be understood that a reference to a part name without the suffix in one of the description or drawings may refer to a part name with the respective suffix in the other of the description or drawings. The air inlet 13 and air outlet 15 may be defined in the transport container 12. For example inlet 13 may be defined by side walls 12C, and the outlet 15 may be defined by roof 12D. Referring to FIGS. 2 and 9, the cooling fan 48 may be connected to convey air through the air inlet 13 (for example into interior 12F), across the plurality of blockchain mining processors 72 (FIG. 1) and out the air outlet 15. The air outlet 15 may be defined above the air inlet 13 (when the base 12E is resting on a horizontal ground surface as shown) and oriented to direct exhaust air out of the transport container 12, for example in an upward direction 17.

Figure 4:
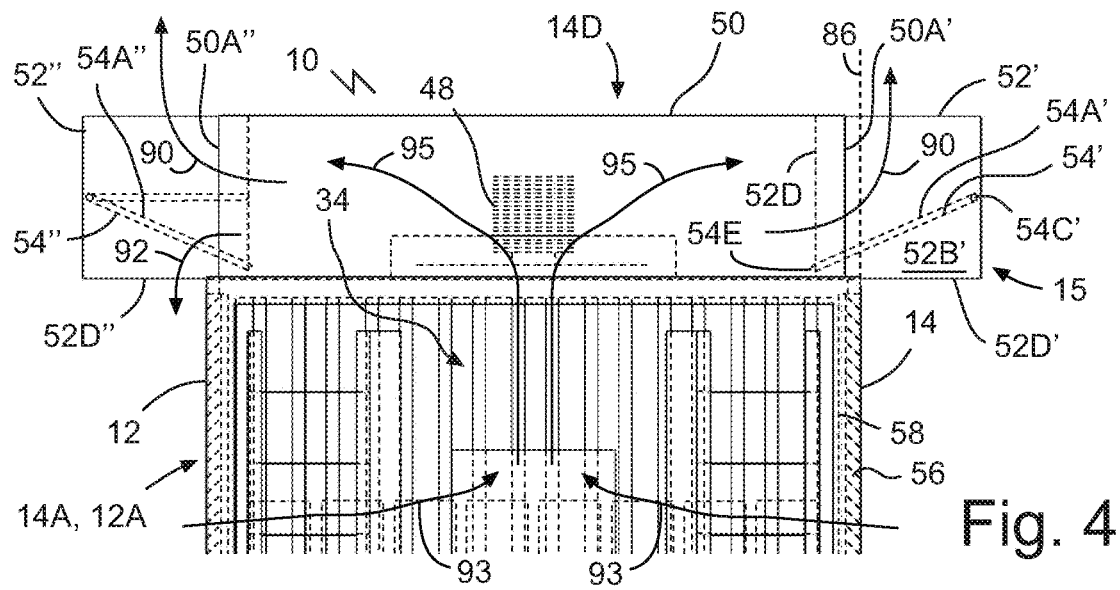
FIG. 4 is a rear end view of the portable blockchain mining system of FIG. 1 with the exhaust guides of the plenum extended, and dashed lines used to indicate the position of a baffle within the plenum oriented to direct exhaust air upward (the guide on the right) and upward and downward (the guide on the left).
Figure 5:
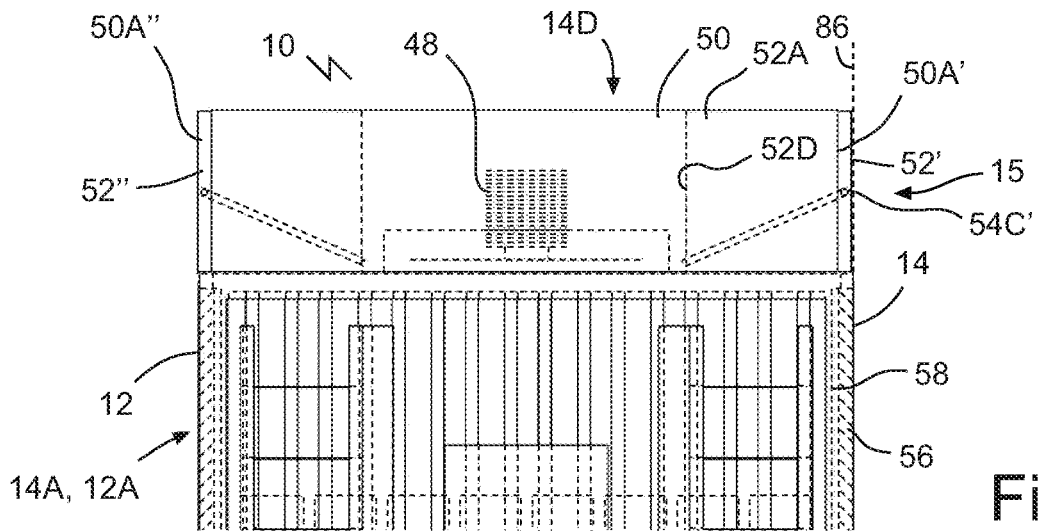
FIG. 5 is a rear end view of the portable blockchain mining system of FIG. 1 with the exhaust guides of the plenum retracted in a transport mode.
Figure 6:
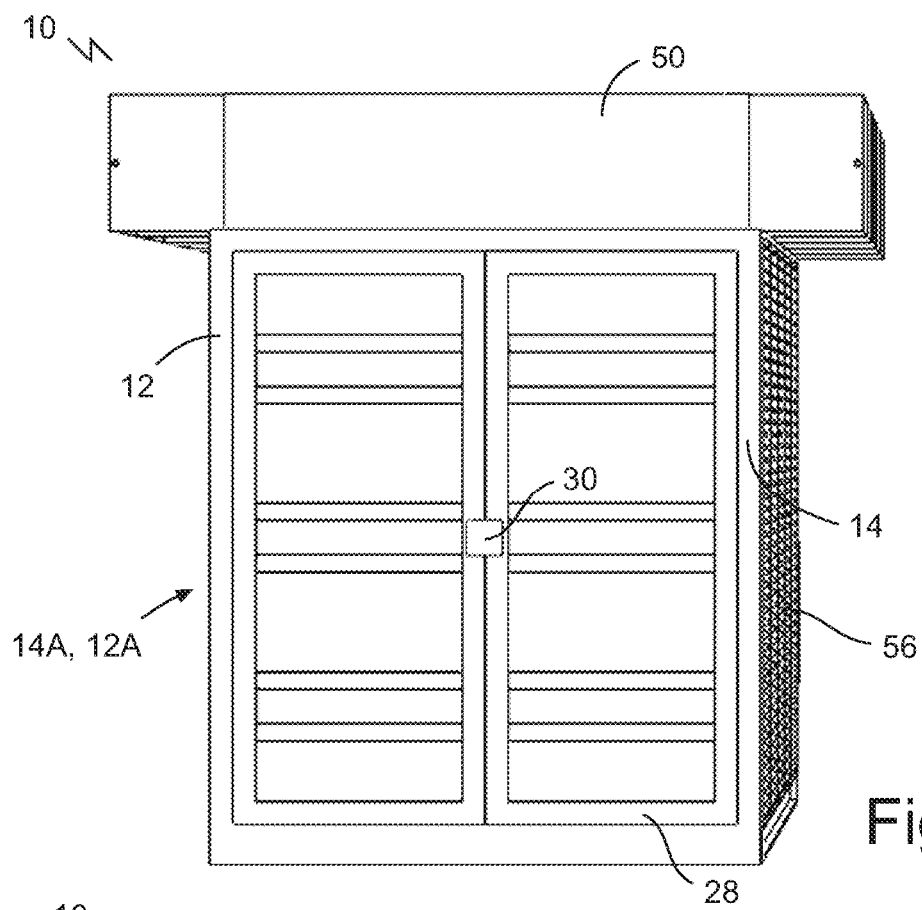
FIGS. 6 and 7 are different rear end perspective views of the portable blockchain mining system of FIG. 1 with the doors closed.
Figure 7:
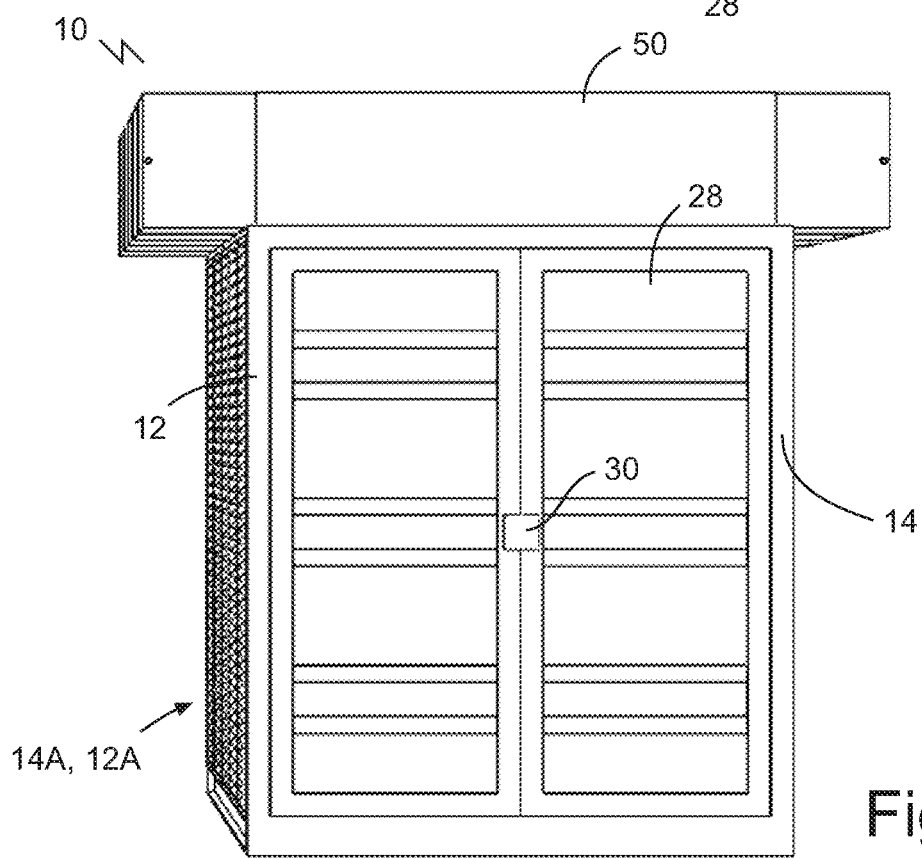

Referring to FIGS. 1-2, 8-9, and 11, the container 12 may be formed by a structural frame 14. Frame 14 may have a front end wall 14A, a rear end wall 14B, side walls 14C, a roof 14D, and a base (floor 14E), which may collectively define interior 12F of container 12. In the example of FIGS. 1-11, at least end walls 12A and 14A, end walls 12B and 14B, side walls 12C and 14C, and base 12E and floor 14E, respectively, are effectively the same parts, however, such parts may be different in the example of FIGS. 12-18 where the container 12 includes a lower structural frame 16 below the upper frame 14 as will be discussed below in further detail. References to characteristics of walls 14C or 12C may be applicable to the other of walls 12C and 14C. Referring to FIGS. 1-2, 8-9, and 11, frame 14 may be formed by a network of beams 18 and columns 20, for example horizontal beams 18 and vertical columns 20 as shown. Beams 18 and columns 20 may support a suitable cladding, such as doors, metal gratings (such as steel grating panels 32, 46, and 58 discussed further below) and panels (such as corrugated rear end panel 19 discussed further below) that may collectively define the exterior 12G of the container 12. Columns and beams may be formed by suitable structural components, such as metal planks, box-beams, I-beams, angle-beams, or C-beams, made of sufficient rigidity and strength to support the frame 14 and parts mounted thereon in use. The transport container 12 may be an intermodal transport container, or may be a modified intermodal transport container, or may have the dimensions of an intermodal transport container. Referring to FIGS. 1 and 6-7, container 12 may provide a suitable mechanism to access the interior of the container 12. Container 12 may mount a door or doors 28. In the example shown doors 28 secure open rear end 12A to selectively permit or restrict access to the interior 12F. Doors 28 may include a suitable lock 30 to secure the interior 12F from unwanted intrusion. Other surfaces, such as end wall 12B may themselves form part of the cladding envelope of the container (such as if end wall 12B was one of the corrugated steel walls of a transport container as shown) or be covered by cladding panels.

Referring to FIGS. 1-2 and 8-9, suitable racks 26 or other mounts may be provided to mount processors 72 within interior 12F of container 12. In the example shown one or more racks 26 may be used to mount the processors 72. Each rack 26 may have a suitable structural frame, for example made of shelves 26A and columns 26B. Beams (not shown) may be used for each rack 26. Suitable computing infrastructure may be provided, such as power distribution units (PDUs) 70 that may be used to bus cabling between electrical and network equipment. Processors 72 (FIG. 1) may be mounted in a suitable fashion, such as fastened by fasteners to racks 26, or may rest by gravity upon shelves 26A. Shelves 26A and other processor mounts may be stacked horizontally and vertically to efficiently populate the interior 12F of container 12, for example shelves 26A may run substantially or entirely from end 12A to end wall 12B, and from floor 14E to roof 14D.

Referring to FIGS. 1-2 and 8-9, processors 72 may be arranged in a suitable fashion within interior 12F. A group 73, such as a first group, of the plurality of blockchain mining processors 72 may be mounted adjacent a first wall, such as side wall 14C'. A second group 77 of processors 72 may be mounted adjacent a second wall, such as side wall 14C" opposed to wall 14C'. An aisle 34 may be defined between the first group 73 and the second group 77 (for example between racks 26' and 26'). The aisle 34 may be of sufficient width to permit a user to access all the processors 72 of either group 73 or 77. Processors 72 in each rack 26 may be mounted in a suitable series of rows, such as a vertical stack of plural rows each a single processor 72 deep laterally between aisle 34 and respective wall 14C. Racks 26 may be designed to maximize air flow laterally across each shelf 26A for maximum cooling of each processor 72.

Referring to FIGS. 2, 8, and 9, the air inlet 13 may be defined in a side wall 12C, such as wall 14C, of the transport container 12. By forming the inlet 13 in wall 14C, airflow may travel from exterior 12G of container 12, through wall 14C, and laterally across processors 72, absorbing heat from processors 72 in the process. Referring to FIG. 2, each blockchain mining processor 72 may have associated with it a processor fan 74, which is oriented to direct air from the air inlet 13 laterally (for example horizontally) across the respective blockchain mining processor 72 and toward a center aisle 34 of the interior 12F of the transport container 12.

Figure 10:
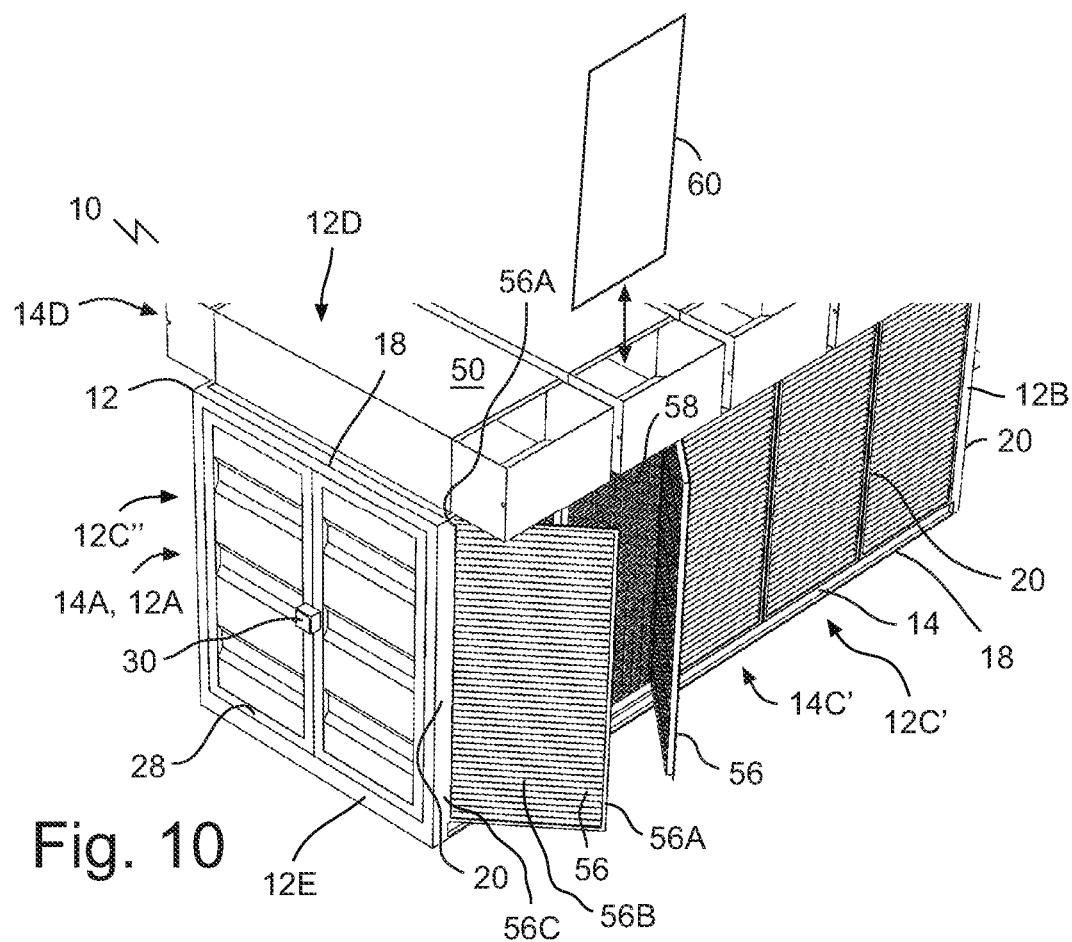
FIG. 10 is an upper perspective view of a rear end of the blockchain mining system of FIG. 1 with two of the louver gates open and a replacement air filter being inserted.

Referring to FIGS. 2, 9, and 10, the system 10 may incorporate a mechanism for securing the air inlet 13 in the side walls 14C from unwanted intrusion, whilst permitting sufficient airflow therethrough. A security grating panel 58 may define the air inlet 13 in the side wall 14C. The security grating panel 58 may be one of a plurality of metal security grating panels 58 that collectively define the air inlet 13 as shown. The plurality of metal security grating panels 58 may be mounted across gaps between a lattice of beams 18 and columns 20 of frame 14. Suitable metal grating panels may comprise chain link fence panels, forming air gaps structured to have maximum lateral dimensions of insufficient size to permit unwanted entry into interior 12F of a limb of a potential thief.

Referring to FIGS. 2, 9, and 10, the air inlet 13 may be defined in more than one side surface of container 12, for example the air inlet 13 may be defined in opposed side walls 14C, and in some cases in one or both end walls 14A and 14B. The air inlet 13 may be structured to provide sufficient breathability to adequately cool the processors 72 operating within interior 12F. For example, at least 75%, for example 90% or higher, of a total external surface area of side wall 14C, for example side walls 14C' and 14C", may form the air inlet 13. In the example shown the only part of the total external surface area of each side wall 14C that is not breathable are the portions attributable to beams and columns 18 and 20, respectively. The inlet 13 may be structured with uniform porosity or pressure drop across the breathable surface area of the inlet 13 to maximize the chance of uniform and consistent air flow across each processor 72 regardless of location of the processor 72 adjacent the side wall 14C.

Referring to FIGS. 2 and 8-10, air inlet 13 may be provided with a suitable air filter 60 to remove unwanted contaminants from incoming air flow. Unwanted contaminants include dirt, oil, smoke, debris, and some chemicals, all of which may otherwise damage over time processors 72 or other network or electrical equipment operating within container 12. A suitable air filter may comprise a porous foam filter, such as comparable to a cabin air filter in a vehicle, or a furnace filter for a home or commercial furnace. In some cases, a fiberglass or hair filter may be used, such as a blue hogs hair style filter roll (synthetic). The filter may be cut to fit and breathable. The air filter 60 may be positioned across the security grating panel 58, for example in use a plurality of filters 60 may be positioned across the plurality of panels 58 (only one filter 60 is shown in FIGS. 9 and 10 but each inlet 13 defined between beams 18 and columns 20 may locate a respective filter 60).

Referring to FIGS. 2, 8-9, 9A, and 10, each air filter 60 may be mounted to permit access to the air filter 60 from outside the portable blockchain mining system 10. Each air filter 60 may be mounted adjacent a security grating panel 58, for example adjacent an exterior face 58A of the security grating panel 58. A gate, such as a louver panel 56, may secure the air filter 60 adjacent the exterior face 58A of the security grating panel 58. A louver panel 56 may comprise a suitable frame 56A mounting rows of louvers 56B, which in some cases are adjustable as to pitch (for example if the louvers are mounted to pivot about axial hinges—in some cases an actuator is provided to control all or groups of louvers). In other cases, a grating panel, an open perimeter frame, or another suitable securing mechanism may be used to secure the air filter 60 to the container 12. A lock (not shown) may be provided on each such gate to secure same in the closed position to prevent unwanted removal of the air filter 60. By permitting access to air filter 60 from outside the system 10, maintenance can be carried out on the system 10 (i.e. filter replacement, see FIG. 10), without requiring access to the interior 12F. Referring to FIG. 10, each gate, such as louver panels 56, may be mounted to open and close, for example to swing about a hinge 56C as shown, or to be removable for example by sliding out of a retainer frame (not shown) on side wall 14C to gain access to filters 60. Louver panels may form rain guards (for example when louvers 56 are pointed downward in a direction moving away from the container 12) that keep moisture and other elements out of contact with grating panels.

Referring to FIGS. 2 and 8-9, a roof 12D of the transport container 12 may be structured to pass exhaust air from interior 12F to outside the container 12. For example, the roof 12D may define air outlet 15 or a roof air passage 79 to the air outlet 15. The roof 12D may comprising one or more grating panels (not shown) or other openings to define roof air passage 79. In the example shown roof 12D defines circular openings 48D arranged in a series down the center of the roof 12D from end 12A to end wall 12B. Each opening 48D may mount a respective cooling fan 48 (in the example shown there are five fans 48 each located at a respective opening 48D) from end 12A to end wall 12B. The roof 12D (which is also the roof 14D of frame 14 in the example) may be formed with non-breathable panels 44, for example on either side of the series of fans 48. The fans 48 are shown mounted on top of the roof 12D, but could be mounted to an underside of the roof 12D, or otherwise adjacent the roof 12D above or below the roof 12D at a suitable location. The roof 12D may form an air flow passage 79 or air outlet 15 of sufficient cross-sectional area to minimize drag on exhaust air and improve cooling and efficiency. In one case at least 20% or higher, such as at least 33%, 50%, 75%, or higher, of a total external surface area of the roof 12D forms the air outlet 15 or the roof air passage 79 to the air outlet 15. Total external surface areas in this document refer to the area of an external face of the part referenced.

Figure 3:
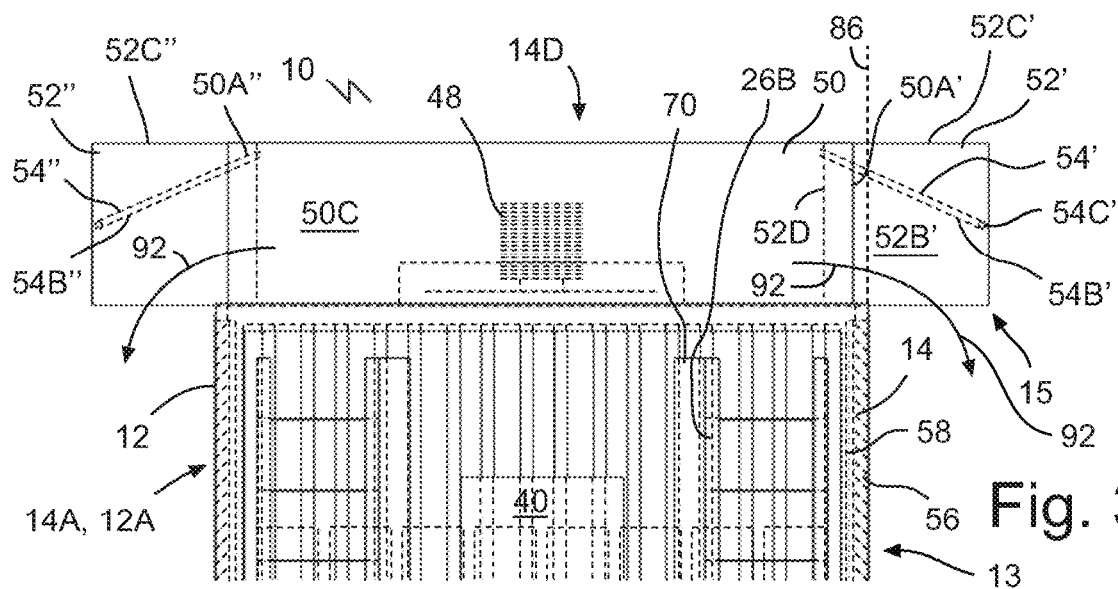
FIG. 3 is a rear end view of the portable blockchain mining system of FIG. 1 with the exhaust guides of the plenum extended, and dashed lines used to indicate the position of a baffle within the plenum oriented to direct exhaust air downward.

Referring to FIGS. 2, 3, and 9, each cooling fan 48 may be mounted adjacent the roof 12D to pull air through the interior 12F to the air outlet 15. In some cases, the fans 48 may themselves define the outlet 15, for example if plenum 50 were omitted (plenum 50 is discussed further below). With an air outlet 15 in the roof 12D, or adjacent or above the roof 12D, heated exhaust air is discharged from a relatively higher position than intake air is drawn into container 12, reducing the chance of unwanted recirculation of heated exhaust air into the inlets of adjacent systems 10, thus reducing a minimum lateral separation distance between laterally adjacent systems 10. By mounting fan 48 downstream of processors 72, the fans 48 create negative pressure in the data center (interior 12F). Referring to FIG. 19, an example top plan schematic is shown to illustrate the lateral spacing distances 83 possible between adjacent systems 10. In some cases, an acceptable spacing distance 83 may be five feet, ten feet, or greater between adjacent side walls 14C. In some cases, spacing distances 83 are four to six feet.

Referring to FIG. 9, each fan 48 may have a suitable structure. In the example shown the fan 48 is an axial fan, with a motor 48A and a propeller 48B attached thereto. The propeller 48B is mounted to rotate within a suitable frame 48C, which may define a circular axial opening 48D. A grating panel (not shown) may be provided across the opening 48D for safety or to otherwise protect the fan 48 and prevent inadvertent contact with the operating fan 48. Other types of fans 48 may be used, such as a centrifugal fan (not shown).

Referring to FIGS. 2-5 and 8-9, ducting may be provided to selectively guide exhaust air out of container 12. In the example shown a plenum 50 is mounted on the roof 12D and defines the air outlet 15. The plenum 50 may comprise (for example form as shown) ducting that extends along the roof 12D to direct exhaust air out (from an outlet 15 defined) at a location above a lateral side or side walls 12C of the transport container 12. Each plenum 50 may have a top wall 50B, rear and front walls 50C, and lateral ends 50A, which may be open ends as shown. Thus, in the example shown, exhaust air passes upward from interior 12F through passage 79, into plenum 50, and out toward lateral ends 50A. Ducting may be made of suitable materials such as sheet metal.

Referring to FIGS. 3 and 9, the lateral end or ends 50A may guide exhaust air selectively up, down, or both up and down as the user may select or desire depending on context. One or both lateral ends 50A may be open ended or otherwise structured to exhaust air. Referring to FIGS. 3-5, an exhaust guide 52 may be mounted or structured in each open lateral end 50A. In the example shown each guide 52 has a lateral end wall 52A bounded by side walls 52B, and with an open top end 52C defining the air outlet 15. Thus, as exhaust air travels through shroud or plenum 50, such air may exit plenum 50 via open top end 52C.

Referring to FIGS. 3-5, guide 52 may be structured to extend and retract. In the example shown each guide 52 is telescopically moveable relative to (for example with an interior of, plenum 50, between a retracted, closed position (FIG. 5), and an extended, open position (FIGS. 3-4). The retracted, closed position (FIG. 5) may be used for transport or while the system 10 is non-operational, or another suitable time. In some cases, some of the guides 52 may be closed and some opened, for example all the guides 52 on one side of the container may be closed and the guides on the other side open. The extended, open position (FIGS. 3-4 may be used while the system 10 is operating. Referring to FIG. 5, while in the retracted, closed position, the exhaust guide 52 may be inset within a plane 86 defined by a respective side wall 12C directly below the open lateral end 50A. Referring to FIGS. 3-4, while in the extended, open position, the exhaust guide 52 may extend laterally away from the side wall 12C and beyond the plane 86.

Referring to FIGS. 3-4, each guide 52 (or another suitable part of plenum 50 or roof 12D) may be structured to selectively recirculate warmed exhaust air into the air inlet 13. Referring to FIG. 4, in a regular mode/regular position, the guide 52 may be oriented to direct exhaust air in an upward direction 90. Such direction may be achieved using a suitable part such as a baffle 54. The baffle 54 may be mounted to adjust orientation, for example the baffle 54 may be pivotally mounted to end wall 52A at a pivot hinge 54C. By pointing a tip end 54E of baffle 54 downward onto a base of plenum 50 or a top of roof 12D, exhaust air travels up the slope of baffle 54 and exits open top end 52C of guide 52. Referring to FIG. 3, in a recirculation mode/recirculation position, the guide 52 may be oriented to direct exhaust air in a downward direction 92, for example toward inlet 13. In order to achieve selective exhausting as previously described, the exhaust guide 52 may have an upper exhaust (open top end 52C), and a lower exhaust (open base end 52D) that direct exhaust air in the upward direction and a downward direction, respectively. With the baffle 54 adjusted such that the tip end 54E contacts or is adjacent an underside of top wall 50B of plenum 50, exhaust air travels down the slope of baffle 54 and exits open bottom end 52D of guide 52. Because guides 52 are shown located above inlet 13, by directing air downward, warmed exhaust air recirculates into inlet 13. Recirculating exhaust air into the air inlet 13 may seem counterintuitive, however, such may be advantageous in colder weather, where the ambient temperature is below a threshold temperature, such as minus twenty degrees Celsius, of desired operation of the processors 72. If the intake air is too cold, it may cause damage or lowered functionality of processors 72, and may frost up and block the air inlet 13.

The baffle 54 or other suitable selective air direction control may be controlled by suitable means. The baffle 54 may be adjusted by manual, mechanical, or electronic means, and may be done on demand or automatically according to a schedule. A controller, such as controller 40 (FIG. 19) may be used to adjust the position of baffle 54. In one case, the container 12 mounts a thermometer (not shown), and the controller 40 adjusts baffle 54 in response to signals from the thermometer, for example to increase recirculation as temperature drops or crosses a threshold temperature. Referring to FIG. 4, in the example shown, the baffle 54 may have an intermediate position (shown in the dashed lines on the left most baffle 54) where the baffle 54 exhausts heated air in upward and downward directions 90, 92, respectively. The intermediate position may comprise a range of positions and may the precise position of the baffle 54 may be selected to optimize operation of processors 72. Adjustable baffles may allow air to be efficiently moved back to the intake without requiring a secondary fan or blower, or more complicated apparatus.

Referring to FIGS. 1, 2, and 8, a floor of the container 12 may be structured to pass air into the interior 12F. For example, the floor 14E may be made to be breathable as shown. Thus, the floor 14E may function as an air inlet 13, for example a secondary inlet in the case of the embodiment shown. The floor 14E may comprise one or more grating panels 32 or other openings. In the example shown floor 14E may form an air flow passage 91 or air inlet 13 of sufficient cross-sectional area to minimize drag on intake air and improve cooling and efficiency. In one case at least 20% or higher, such as at least 33%, 50%, 75%, or higher, of a total external surface area of the floor 14E forms the air inlet 13 or the air passage 91 from the air inlet 13. The base 12E (which is also the floor 14E of frame 14 in the example) may be formed with non-breathable panels 33, for example on either side of grating panel 32. A breathable floor may be advantageous in a negative pressure cooling example (as shown) by reducing the possibility of a deleterious pressure drop (that would otherwise result in stoppage of air circulation) within the interior 12F caused by a blockage at one or more inlets 13.

Referring to FIG. 19, a schematic is illustrated for carrying out a method of mining a blockchain A power source 64, such as a generator (or generator set or grid/utility power source) is connected to provide electricity to plurality of blockchain mining processors 72. One example of a power source 64 is provided by a generator connected to use a source of fuel, such as combustible gas produced from an oil production, storage, or processing facility, such as a production well 65, to supply generator (power source 64). Electricity may travel from power source 64 through suitable components, such as overload protection systems such as breakers 38 and/or fusible disconnects. A transformer 66 may be provided to modify the incoming voltage and current as desired. The incoming current may pass through a splitter 36, for example a busgutter that splits power along various busbars. The incoming electricity may be used for various functions. For example, electricity passes from splitter 36 into processors 72, optionally passing through breakers 38 and power distribution units 70 (PDU) as desired. Each processor 72, such as an ASIC (application specific integrated circuit) or GPU (graphic processing unit) unit, may have an onboard fan 74 associated with the processor 72 for cooling the processor 72. Each PDU 70 may power one or a group of more than one processor 72. Each processor 72 carries out a mining-related calculation or other suitable process, and communicates with the internet via a suitable system, such as a modem 75. Suitable componentry such as a transmitter/receiver (satellite or otherwise, including components that are connected to the internet via wireless or wired methods) may be provided to permit communication between the modem 75 and internet.

Referring to FIG. 19, various control or monitoring devices may be used, such as switch 76 and controller 40, to regulate operation of processors 72, PDUs 70, power source 64, breakers, fans, and/or to permit remote or on-site operation and control of each processor 72. The splitter 36 may power such components, including modem 75, in a suitable fashion. Power (electricity) may travel to a lighting panel 42 (such as a panelboard), and provide power to various components. Power may travel from panel 42 to a battery 68 (which may form an uninterrupted power supply) that powers modem 75, switch(es) 76 and controller 40 as needed, to maintain operations even in the event of a power outage. Other backup power sources may be provided, such as a secondary generator, which may be programmed or controlled to start up in the event of an outage. Panel 42 may also control various basic functions in container 12, such as operation of lighting systems 78 or heating or cooling systems. Fans 48 may be controlled, for example by passing power to one or more variable frequency drives 80 to control fan speed, with such drives 80 each being connected, for example via a fuse 82 or fuse box, to a respective fan motor 48A, to operate and rotate a respective set of fan propeller 48B.

Figure 11:
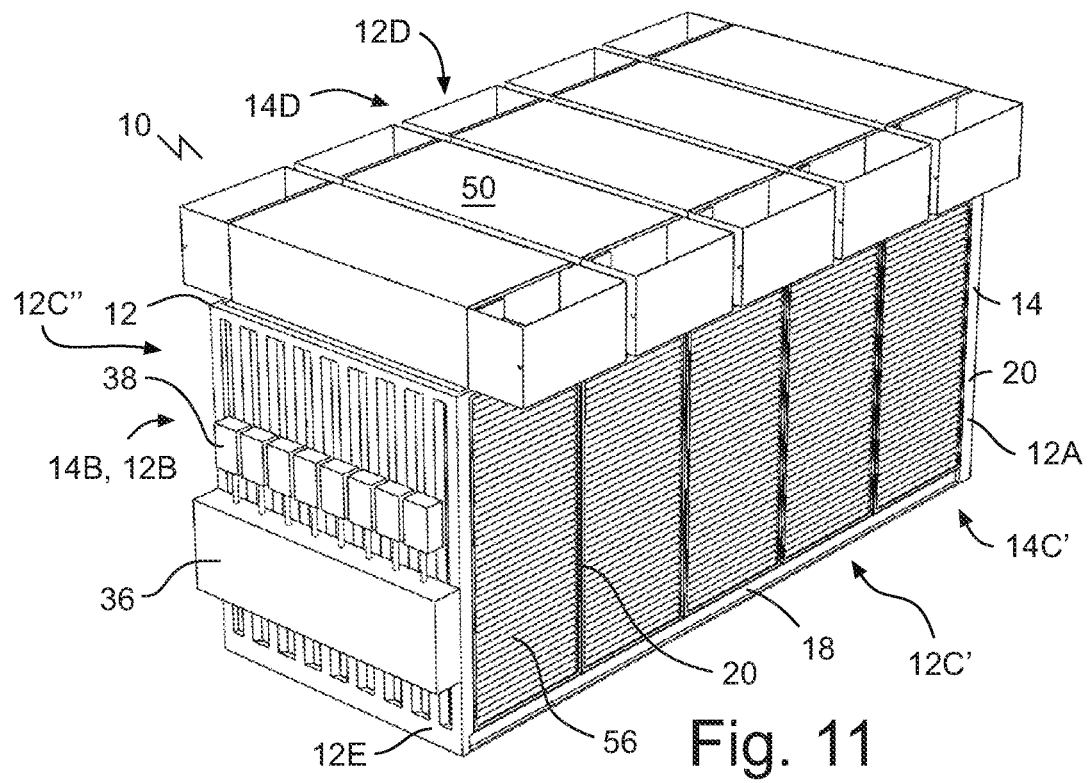
FIG. 11 is an upper perspective view of a front end of the blockchain mining system of FIG. 1.

Referring to FIGS. 1 and 11, electrical and network components may be mounted at suitable locations on or in the container 12. For example, referring to FIG. 1, controller 40 and lighting panel 42 may be mounted to front end wall 12B in interior 12F, to be accessible only within interior 12F. Referring to FIG. 11, various other components may be suitable to mount to the exterior of the container 12. For example, splitter 36 and fuses or breakers 38 may be mounted to front end 12B of container 12. Power and network cables may be run about the interior 12F and exterior of the container 12 as is required to make the container 12 operational and connect the device to an external power source. In some cases, a power source is provided on board, for example a generator mounted on the container 12 (not shown).

Referring to FIGS. 1-2, 4, and 8, and 19, a method of operation of the embodiment shown is now described. Referring to FIG. 19, with the system 10 turned on and power connected from power source 64 to operate processors 72, processors 72 may carry out a blockchain mining operation or other data processing or computational task. The blockchain mining processors 72 may be used to mine transactions, and communicate through the internet with a blockchain database, such as the Bitcoin public ledger. While the processors 72 are operating, they generate heat, which must be dissipated to ensure maximum longevity and optimal operation of processors 72. Thus, fans 48 are operated to draw air into interior 12F through air inlets 13 in side walls 14C. Cool air enters container 12 laterally through opposed side walls 14C and crosses laterally past processors 72 via direction lines 93, where the air is directed toward center aisle 34, with additional energy provided to incoming air via fans 74 on each processor 72. The air has now been warmed by contact with processors 72, and the warm exhaust air passes along direction lines 95 through roof 12D past the fans 48 into plenum 50, towards lateral ends 50A of plenum 50.

Referring to FIGS. 1-2, 4, and 8, once in plenum 50, the warmed exhaust air is directed upward by baffles 54 and exits guides 52 in upward directions 90. Referring to FIG. 3, if it is desired to recirculate any of the warmed exhaust air back through the inlet 13, for example if the external ambient temperature has dropped below a threshold low temperature, then baffle 54 may be adjusted such that, at the end of the circulation cycle, warmed exhaust air exits guides 52 in downward directions 92 toward inlets 13. Referring to FIG. 4, if only some recirculation is desired, for example at ambient temperatures within a range of temperatures above the threshold low temperature but below a threshold high temperature (above which the baffle 54 would exhaust fully in the upward direction 90), then baffle 54 is adjusted to an intermediate position to permit an intermediate proportion of recirculation of warmed exhaust air. Sensors (not shown) may monitor internal temperature in the container 12 and/or processors 72, and fan 48 speed and proportion of recirculation may be adjusted to maintain such temperatures within a desired range of acceptable operating temperatures.

Referring to FIGS. 12-17, another embodiment of a portable blockchain mining system 10 is disclosed, comprising a transport container 12, an air inlet 13, an air outlet 15, and a cooling fan 48. System 10 of FIGS. 12-17 incorporates many of the components and operates according to many of the same principles as system 10 of FIGS. 1-11, with some exceptions discussed below. The primary distinction between the two example systems 10 is that both systems operate via a different air flow process.

Figure 12:
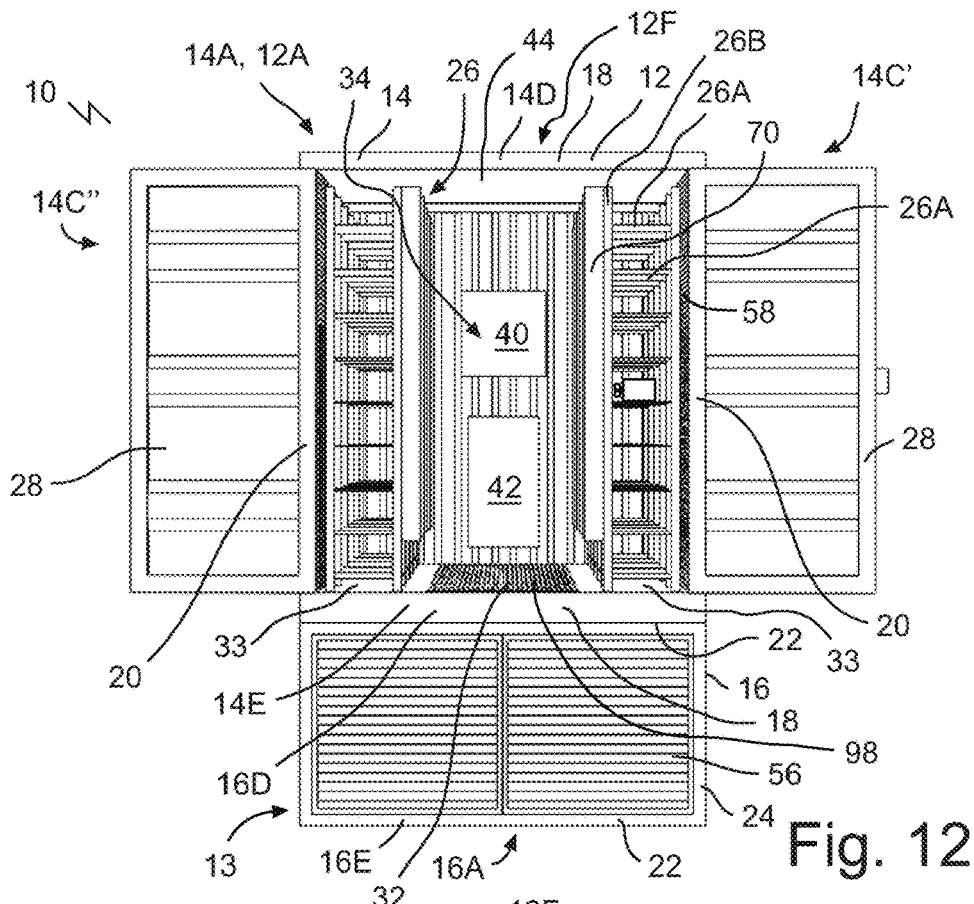
FIG. 12 is a rear end perspective view of a second embodiment of a blockchain mining system.
Figure 13:
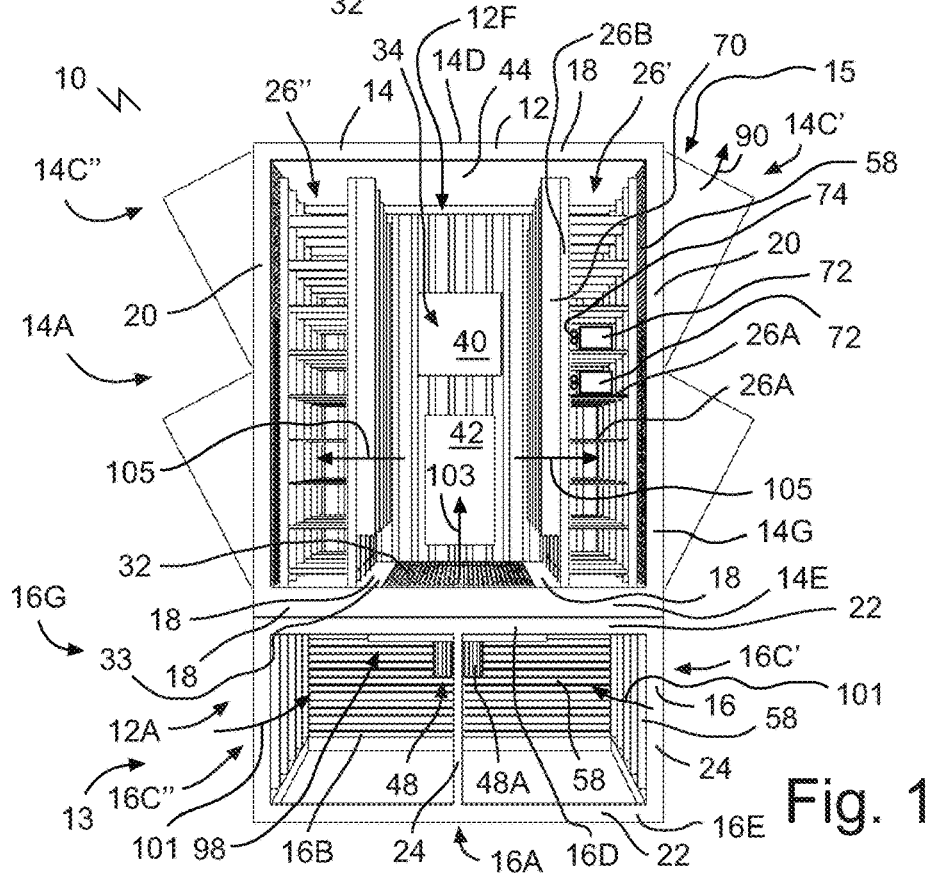
FIG. 13 is a rear end perspective view of the blockchain mining system of FIG. 12 with the doors and the rear wall of the lower frame removed.
Figure 14:
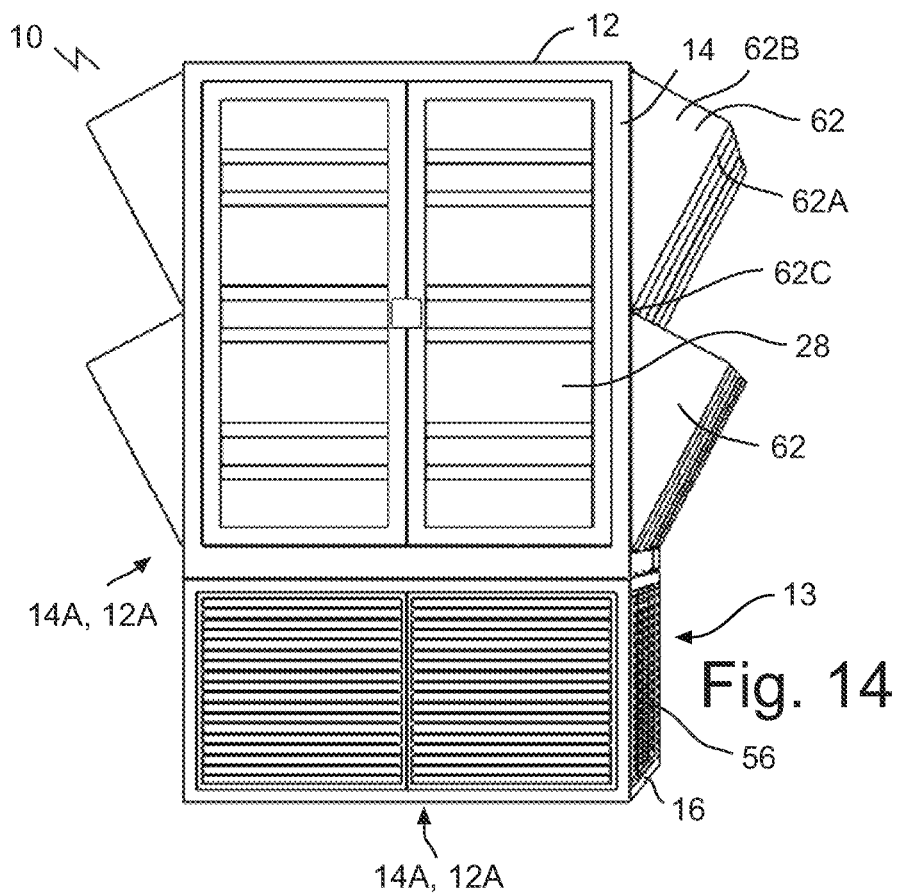
FIGS. 14-15 are rear end perspective views of the blockchain mining system of FIG. 12.
Figure 15:
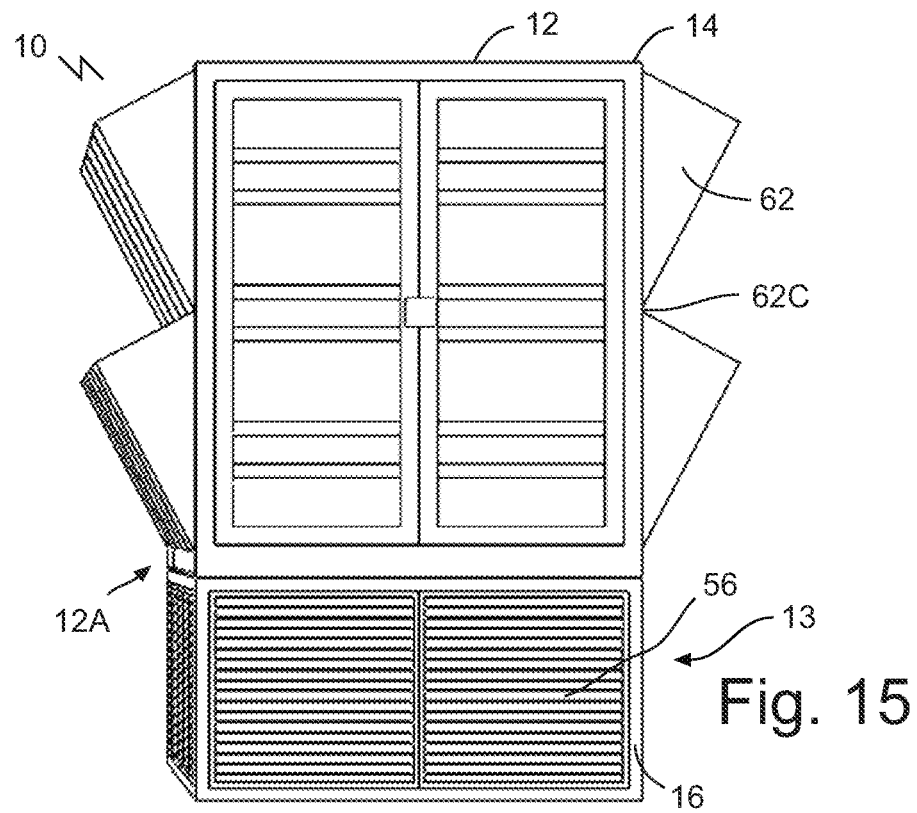
Figure 20:
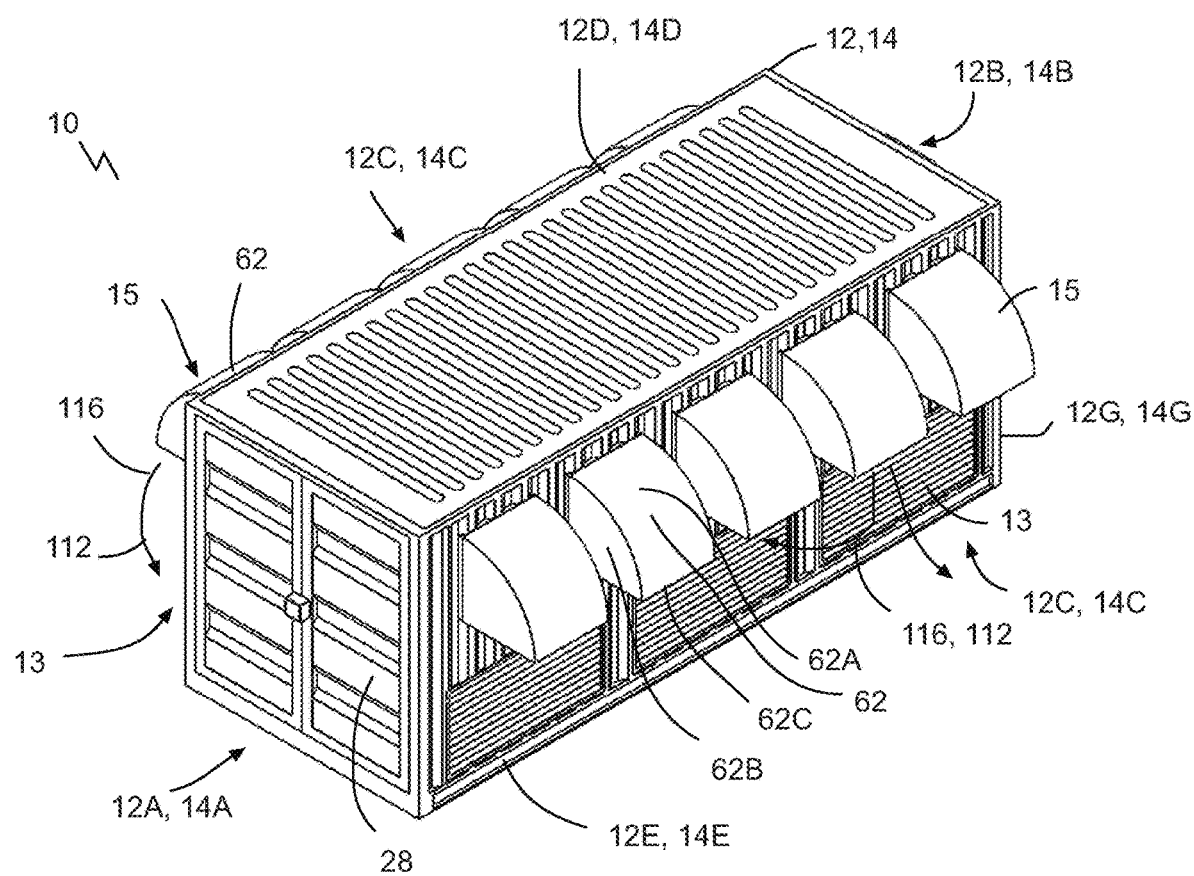
FIG. 20 is a front perspective view of a further embodiment of a blockchain mining system, with air inlets and outlets on the same side wall and ducting to guide exhaust to recirculate back into the air inlets.

Referring to FIGS. 12-13, a floor of the container 12 may be structured to pass air into the interior 12F. A floor of the transport container 12 may define the air inlet 13 or a floor air passage 98 to the air inlet 13. In the example shown, floor 14E defines a floor air passage 98. In the example shown, the transport container 12 comprises an upper frame 14 and a lower frame 16 separated by a floor 14E. The plurality of blockchain mining processors 72 may be mounted within the upper frame 14.

Referring to FIGS. 13 and 18, the cooling fan 48 may be located at a suitable position. The cooling fan 48 may be mounted adjacent the floor 14E to push air through the air inlet 13 or floor air passage 98 into the interior 12F. In the example shown the fan 48 is mounted to an underside of floor 14E, although in other cases fan 48 may be mounted to a top side of floor 14E, or otherwise adjacent floor 14E. By mounting fan 48 upstream of processors 72, the fans 48 create positive pressure in the data center (interior 12F). Positive pressure may be advantageous over negative pressure as higher air pressure means increased air density and relatively more heat exchange, and thus higher potential power consumption by processors 72.

Referring to FIGS. 13 and 18, lower frame 16 may have a suitable structure. Frame 16 may be formed as a ground skid or other structural framework for elevating (boosting) frame 14 a suitable distance, such as between one to three feet or more or less off of the ground in use. Structural frame 16 may be formed by a network of beams 22 and columns 24, for example horizontal beams 22 and vertical columns 24 as shown. Beams 22 and columns 24 may have any of the characteristics and incorporate any of the features as described above for beams 18 and columns 20, respectively, of upper frame 14, and frame 16 may have any of the characteristics and incorporate any of the features as frame 14 as described above. Frame 16 may support a suitable cladding, such as doors, metal gratings (such as gratings 32, 46, and 58 discussed elsewhere) and panels (such as a corrugated panel discussed elsewhere) that may collectively define an exterior 16G of the frame 16. Suitable gratings include steel or aluminum square or rectangular grating, such as walkway panel grating.

Referring to FIGS. 13 and 18, the air inlet 13 may be defined in a side wall 16C of frame 16. Similar to as described above for the embodiment of FIG. 1, the system 10 of FIGS. 13 and 18 may incorporate a mechanism for securing the air inlet 13 in the side walls 16C from unwanted intrusion, whilst permitting sufficient airflow therethrough. Referring to FIG. 18, a security grating panel 58 may define the air inlet 13 in the side wall 16C. The security grating panel 58 may be one of a plurality of metal security grating panels 58 that collectively define the air inlet 13 as shown. The plurality of metal security grating panels 58 may be mounted across gaps between a lattice of beams 22 and columns 24 of frame 16. Suitable metal grating panels may comprise chain link fence panels, forming air gaps structured to have maximum lateral dimensions of insufficient size to permit unwanted entry into interior 16F of a limb of a potential thief. In some cases, no security panels or security features are used to protect the interior 16F due to the fact that there is no expensive equipment (computers, network equipment) present within interior 16F if such is the case.

Referring to FIG. 13, the air inlet 13 may be defined in more than one side surface of frame 16, for example the air inlet 13 may be defined in opposed side walls 16C, and in some cases in one or both end walls 16A and 16B of frame 16. The air inlet 13 may be structured to provide sufficient breathability to adequately cool the processors 72 operating within interior 12F. For example, at least 75%, for example 90% or higher, of a total external surface area of side wall 16C, for example side walls 16C' and 16C", may form the air inlet 13. In the example shown the only part of the total external surface area of each side wall 16C that is not breathable are the portions attributable to beams and columns 22 and 24, respectively. The inlet 13 may be structured with uniform porosity or pressure drop across the breathable surface area of the inlet 13 to maximize the chance of uniform and consistent air flow across the walls 16A-C.

Referring to FIG. 18, air inlet 13 may be provided with a suitable air filter 60 to remove unwanted contaminants from incoming air flow. A suitable air filter may comprise a porous foam filter, such as comparable to a cabin air filter in a vehicle, or a furnace filter for a home or commercial furnace. The air filter 60 may be positioned across the security grating panel 58, for example in use a plurality of filters 60 may be positioned across the plurality of panels 58.

Referring to FIG. 18, each air filter 60 may be mounted to permit access to the air filter 60 from outside the portable blockchain mining system 10. Each air filter 60 may be mounted adjacent a security grating panel 58, for example adjacent an exterior face 58A of the security grating panel 58. A gate, such as a louver panel 56, may secure the air filter 60 adjacent the exterior face 58A of the security grating panel 58. A lock (not shown) may be provided on each such gate to secure same in the closed position to prevent unwanted removal of the air filter 60. By permitting access to air filter 60 from outside the system 10, maintenance can be carried out on the system 10 (i.e. filter replacement, see FIG. 10), without requiring access to the interior 16F. Each gate, such as louver panels 56, may be mounted to open and close, or to be removable for example by sliding out of a retainer frame.

Referring to FIGS. 12-13 and 16-17, the air outlet 15 may be defined in a side wall 14C of the upper frame 14. Referring to FIGS. 12 and 13, the fans 74 of each blockchain mining processor 72 may be oriented to direct air from a center of the interior 12F laterally across the respective blockchain mining processor 72 and toward the air outlet 15 in the side wall 14C of the upper frame 14. Similar to as described above for the embodiment of FIG. 1, the system 10 of FIGS. 12-13 and 16, the side walls 14C may incorporate a mechanism for securing the air outlet 15 in the side walls 14C from unwanted intrusion, whilst permitting sufficient airflow therethrough. In the example shown, side walls 14C mount security grating panels 58 whose exterior faces are covered by louver panels 56. The side walls 14C may be formed with any of the characteristics and features of the side walls 14C of the embodiment of FIG. 1, although in the example shown no air filter 60 is required (though one may be used) on the air outlet 15, i.e. over the grating panels 58.

Referring to FIGS. 13 and 16, the air outlet 15 may be defined in more than one side surface of frame 14, for example the air outlet 15 may be defined in opposed side walls 14C, and in some cases in one or both end walls 14A and 14B of frame 14. The air outlet 15 may be structured to provide sufficient breathability to adequately cool the processors 72 operating within interior 12F. For example, at least 75%, for example 90% or higher, of a total external surface area of side wall 14C, for example side walls 14C' and 14C", may form the air outlet 15. In the example shown the only part of the total external surface area of each side wall 14C that is not breathable are the portions attributable to beams and columns 18 and 20, respectively. The outlet 15 may be structured with uniform porosity or pressure drop across the breathable surface area of the outlet 15 to maximize the chance of uniform and consistent air flow across the walls 14A-C. End walls 14A and/or 14B may be made to be breathable in a similar fashion as side walls 14C, and/or end walls 14A and/or 14B may be breathable whereas one or both of side walls 14C may not be.

Referring to FIGS. 13, 16, and 16A, an exhaust guide 62, such as a plurality of exhaust guides 62, may be mounted to an exterior 14G of the side wall 14C of the upper frame 14 to direct exhaust air in an upward direction 90. The exhaust guide or guides 62 may each comprise a scoop or baffle (for example made of sheet metal) that extends laterally outward from the exterior 14G of the side wall 14C of the upper frame 14. Each scoop may have an opening, such as an open top end 62D that defines the air outlet 15. The scoop or guide 62 may have an end wall 62A and opposed side walls 62B. Referring to FIGS. 16 and 16A, the exhaust guide 62 may be moveable between an open position (guide 62' in FIG. 16, solid lines in FIG. 16A), and a closed position (guide 62" in FIG. 16, dashed lines in FIG. 16A) where the exhaust guide is laterally retracted adjacent or into (for example inset within plane 86 of side wall 14C) the exterior 14G of the upper frame 14. The guide 62 may be pivotally mounted to side wall 14C, for example by a hinge 62C, with side walls 62B mounted to extend out of and retract into respective slots 62E in side wall 14C to open and close the guide 62. The guide 62 may be closed at suitable times such as when the system 10 is not operating, or when system 10 is being transported. Guides 62 may also be removed in such circumstances or when not need. Guides 62 assist in direction warmed exhaust gases upward. Guides 62 may also assist in preventing recirculation of warmed exhaust air back into interior 12F through side walls 14C.

Referring to FIGS. 12-13, and 16-19, a method of operation of the embodiment shown is now described, although only distinctions from the operation of the embodiment of FIG. 1 are described. Referring to FIG. 13, fans 48 are operated to draw air into interior 16F through air inlets 13 in side walls 16C. Cool air enters frame 16 laterally through opposed side walls 16C and end walls 16A and 16B, via direction lines 101, where the air is directed upward via direction lines 103 through passage 98 across floor 14E. The air flow travels into aisle 34 of interior 12F, and then changes direction and passes laterally across processors 72 via direction lines 105, with additional energy provided to incoming air via fans 74 on each processor 72. The air has now been warmed by contact with processors 72, and the warm exhaust air passes along direction lines 90 through side walls 14C and guides 62. The embodiment of FIGS. 12-18 may be advantageously used in warm ambient temperatures, as the system 10 is designed to avoid recirculation of exhaust air into the inlets 13 or the inlets of other portable mining systems in close proximity to system 10.

Figure 23:
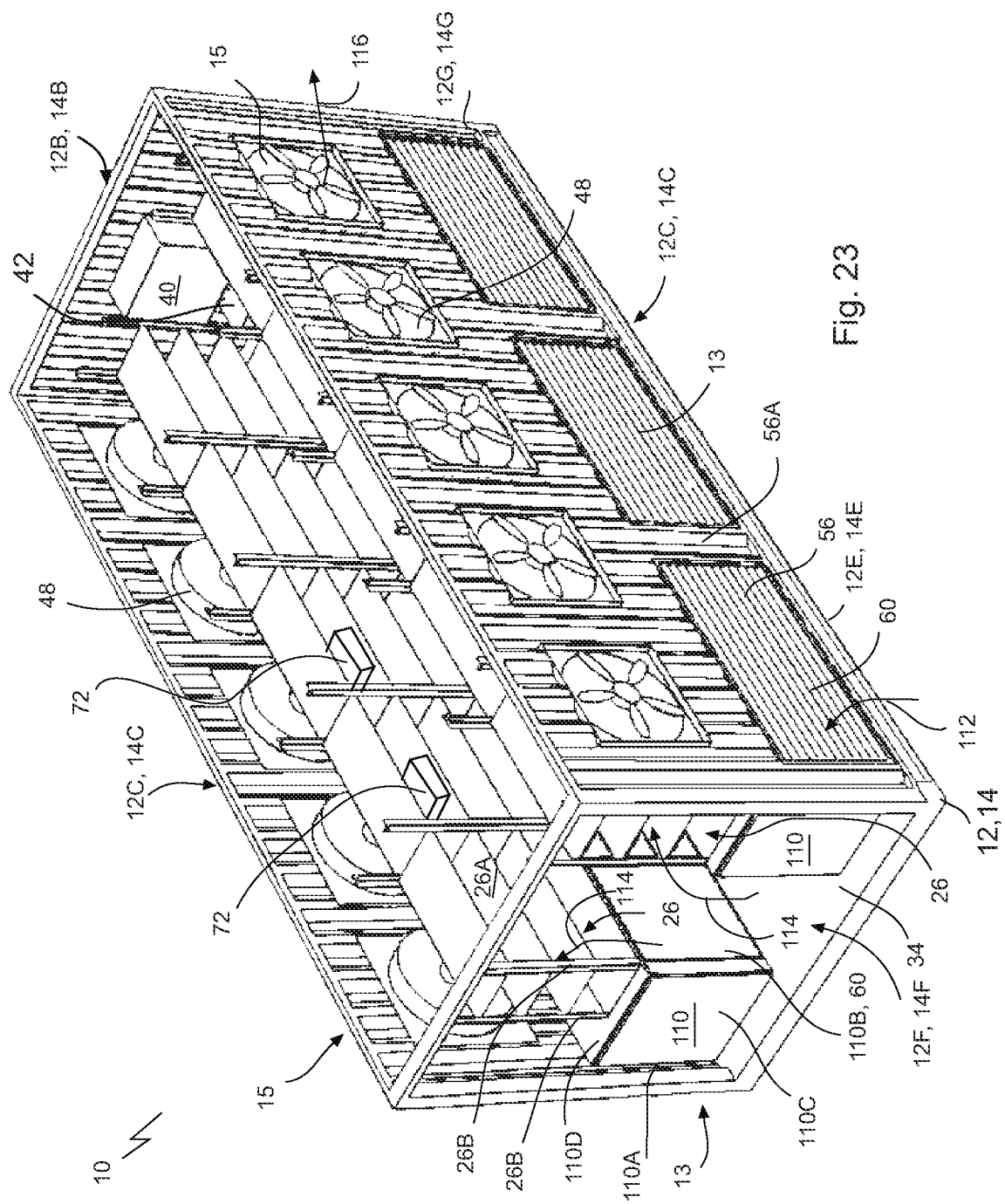
FIG. 23 is a front perspective view of the system of FIG. 20 with the roof, door, and exhaust guides removed.

Referring to FIGS. 20-27, another embodiment of a blockchain mining system is illustrated, with an air inlet 13 and air outlet 15 on the same side wall 12C or (in the example shown) the same side walls 12C. The system 10 may comprise a portable building 12, a plurality of blockchain mining processors 72 (two are shown in FIG. 23 for reference), and one or more exhaust guides 62. As above, the air outlet 15 and the air inlet 13 may be defined in the same side wall or side walls of the portable building. The processors 72, which in the examples shown would be mounted on the racks 26 on one or both sides of the interior 12F of the container 12, may be mounted adjacent the air outlet 15 above the air inlet 13. The cooling fan 48 or fans 48 may be mounted adjacent the air outlet 15 (for example mounted on the side walls 12C between the processors 72 and the outlet 15 or defining the outlet 15) to pull air through the interior 12F to the air outlet 15. In other cases pusher fans may be used, such as intake fans (not shown).

Referring to FIGS. 20-27, the system 10 may draw in and move cooling air through the interior 12F and over the processors 72 in a suitable fashion. The portable building 12 may be structured such that in use air moves through a suitable sequence of travel. In one case air first moves into the portable building through the air inlet 13, for example in direction lines 112. The cooling air may pass below the plurality of blockchain processors 72 toward a center (in the example shown the aisle 34) of the interior 12F of the portable building. The air may then move up and laterally over the plurality of blockchain processors 72 and out the air outlet 15 in the side wall 12C, for example following direction lines 114 and 116.

Referring to FIGS. 20-27, air may be guided into the interior 12F through the inlet 13 via a suitable guiding mechanism. In the example shown, ducting via inlet guides 110 or manifolds is provided. Each guide 110 (which may form a base shelf or filter housing) may have an entry end 110A structured to receive incoming air via the air inlet 13. The inlet 13 may have louvers 56 (for example fixed louvers that cannot be removed) and filters 60 as above. The entry end 110A may secure to the inlet 13. Side walls 110C and a top wall 110D may guide air toward an exit end 110B that opens into the interior 12F, for example laterally into the aisle 34. A filter 60 may be positioned on the exit end 110B or at another suitable point in the guide such as at end 110A. The guides 110 may form a framework upon which the processors 72 are raised and sit upon, as an example of a way to raise the processors 72 above the inlet 13.

Referring to FIGS. 20-22, 24, and 26-27, the system 10 may be structured to exhaust cooling air via a suitable mechanism. In the example shown, the system 10 incorporates one more exhaust guides 62 to direct exhaust air out of the building. The guides 62 may be mounted on the side wall or side walls 12C, or at other suitable locations on or as part of the air outlet 15. The guides 62 may form ducting that has one or more of opposed side walls 62B, a top wall 62A, and an open end 62D. The guides 62 may be angled to direct exhaust air in a particular direction.

Referring to FIGS. 20-22 and 26, the guide 62 may be one or both structured or oriented to recirculate exhaust air back into the interior 12F. In the example shown the guides 62 are oriented to exhaust warmed cooling air in a downward direction. Since the inlet 13 and outlet 15 are on the same side walls 12C, some or all of the downwardly exhausted air then recirculates back into the interior 12F via the inlet 13. Recirculating warmed cooling air may be advantageous in winter or in relatively cold ambient temperatures. In some cases, the ambient air temperature may be sufficiently low that the processors 72 may become damaged upon long or short term exposure to a continual supply of incoming fresh air at ambient temperature. The ability to recirculate may also reduce or prevent snow from blocking the intake (inlet 13) or from getting inside the datacenter and damaging computers (processors 72) on the racks. Because the processors are raised above the inlet, for example on raised racks above the intake, even if the snow gets through the filter panels 60 on the guides 110 that are below the racks, then the snow (such as fine snow) is unlikely to be lifted up into the processors 72. Thus, the ability to recirculate may increase the operating efficiency of the system 10 in cold climates while also preventing snow or rain from damaging the processors. Also, having both discharge (outlet 15) and intake (inlet 13) on the same wall may allow for each side wall 12C to be made symmetrical, meaning that the interior 12F may be arranged with computer racks 34 on each wall 12C for more space-effective structuring of the interior components.

Figure 26:
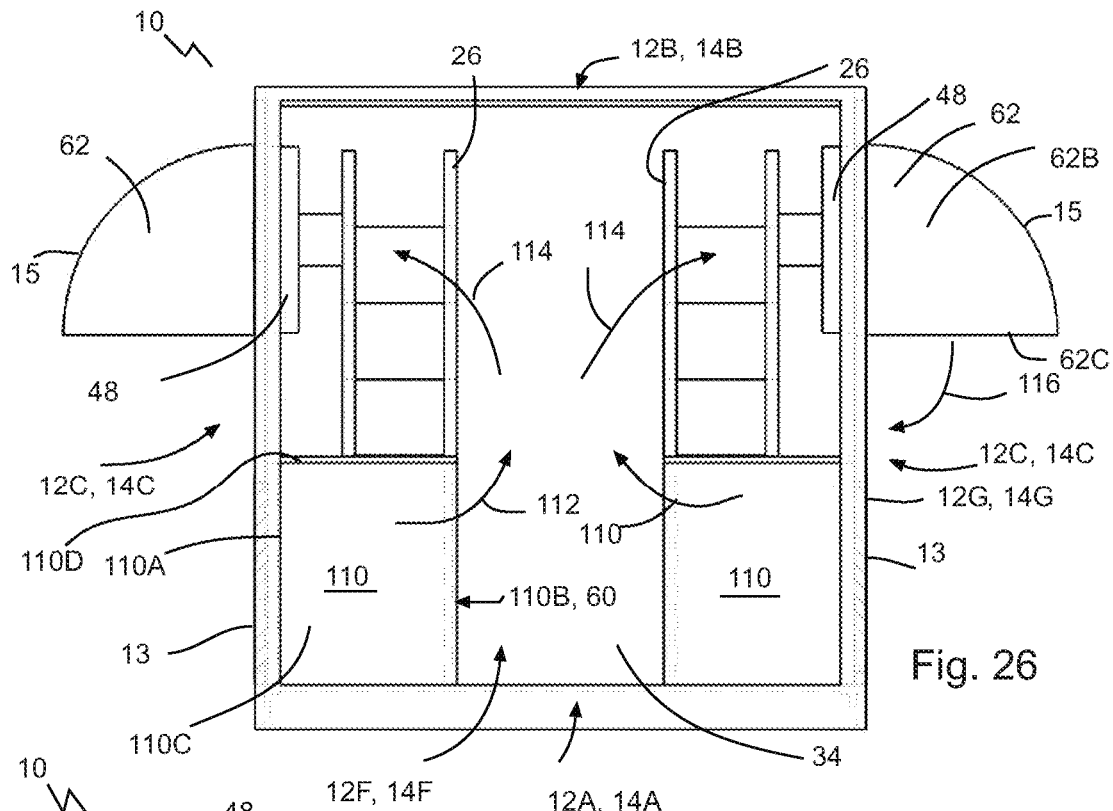
FIGS. 26 and 27 are simplified front elevation views of the system of FIG. 20 with the front door and rear walls removed, and with the exhaust guides in an upward exhaust mode and a downward, recirculating exhaust mode, respectively, that may be used for summer and winter operation.
Figure 27:
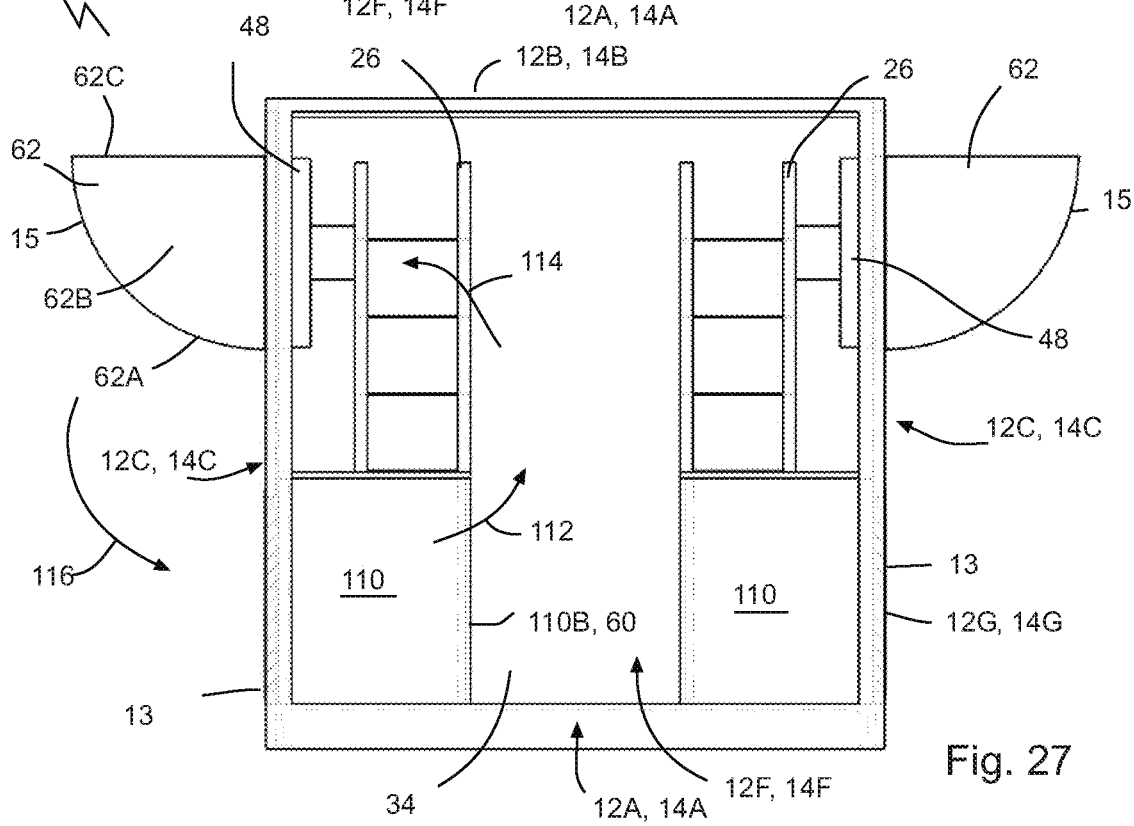

Referring to FIGS. 26 and 27, the system 10 may provide a user with the opportunity to selectively control the level of recirculation of expelled cooling air. The system 10 shown provides flexibility to allow the unit to be used in a normal exhaust mode (FIG. 27) or a recirculating exhaust mode (FIG. 26). The modes may be selected by rotating the guides 62 to point up or down. In other cases, a baffle or other system may be used such as above with exhaust guides 52) to direct air to one or more of upward, laterally outward, or downward paths of travel. The controller 40 may control the orientation or operation of the guides 62. In some cases, the guides 62 are oriented to direct some air upward and some air downward. The extent of recirculation may be selected to maintain the processors 72 or interior 12F to within a desired range of operating temperature. The system may be feedback controlled, such that if the temperature rises, the extent of recirculation is decreased, and if the temperature drops, the extent of recirculation increases.

Overall, FIGS. 20-27 are an example of a portable building that may incorporate an air intake low, a discharge up high, and puller fans in the side wall. For a datacenter of this style the walls of the building may have an access door 28, intake/discharge/computer racks on the long side walls, and an end wall with the electrical, control and networking equipment. The electrical panel 118 may be on the exterior 12G of the seacan, with the inside housing the control panel (controller 40) and the contactor/relay panel 42.

The network equipment used may provide a source of internet connection. A satellite/cellular/and/or radio antenna or other network communication equipment may be fitted on the mining system and connected to a modem. The modem may feed a network switch that has Ethernet ports. Each mining processor controller may have one Ethernet port. The network connection may also feed a controller, which may be a programmable logic controller (PLC), or other, which may be accessed remotely. The controller may be connected to at least a thermocouple (temperature sensor) within the mining system, to allow the controller to control the ventilation and chilling loads within the enclosure. The controller may control the contactor panel switches to open and close circuits to add or remove mining processors from operation. Each mining processor may have a variety of configurations, but generally may include at least a power supply, a controller board and mining circuitry, such as an ASIC circuit. Various mining circuitry examples include CPU (central processing unit), GPU (graphics processing unit), FPGA (Field-Programmable Gate Array), and ASIC (application specific integrated circuit). The components of an ASIC mining processor include the hash boards (each board has numerous chips that is doing the hashing), a controller (to communicate with the network and optimize the mining processors chip frequency and fans for cooling), and a power supply (typically converts AC input power to DC power for the ASIC). Each mining processor may be positioned on racks or shelving units.

The blockchain mining system may comprise a controller connected to operate one or more aspects of the blockchain mining processor. The controller may be connected to operate a cooling system, for example having a ventilation fan and a chiller, to maintain the mining processors within a predetermined operating range of temperature. For example, if the internal temperature within the mining system spikes above a predetermined maximum predetermined temperature, the air ventilation system may initiate or ramp up, and if the temperature contains past a second, relatively higher maximum predetermined temperature, the chilling unit may initiate or ramp up to achieve an air-conditioning effect. Similarly, if the temperature drops below a minimum predetermined temperature, a heating system (not shown) or recirculation system may initiate that may or may not leverage the air ventilation infrastructure to distribute heat. Plural controllers may be incorporated, for example to carry out different tasks, for example one controller for temperature control and another for mining processor control. The enclosure (interior 12F) may be structured to insulate its contents from the elements. The container may have a back-up heating device such as a space heater (not shown), for example to be used to heat the enclosure in case of shut down in cold weather.

In both embodiments disclosed here, air moves laterally across processors either into or out of adjacent side walls of the container. Also, in both embodiments, air flow changes direction from vertical to horizontal, thus permitting the outlet to be located above the inlet to avoid recirculation of warmed exhaust gases (unless same is desired, for example as described above). Such bidirectional flow may more efficiently cool processors 72 within the context that the processors 72 are located (processors 72 mounted horizontally within racks, with processors 72 vertically stacked one above the other), than would unidirectional flow, particularly in an embodiment where plural racks of processors 72 are located within interior 12F.

Relative words such as front and rear, sides, left and right, up and down are arbitrary and do not refer to absolute orientations unless context dictates otherwise. For example, although the description refers to rear and front ends, it should be understood that this orientation could be reversed. Similarly, side walls need not be the walls with the longest lateral dimensions (although in many cases they will be), for example in the case of a cube container. Features in various embodiments may be interchanged, for example to provide an air inlet in the floor and an outlet in the roof. The system 10 may form a skid, or may form a wheeled or tracked unit, such as a trailer. In some cases, system 10 may incorporate a motor to drive the system 10 to different locations. A reference to a floor may refer to a base of a component, or it may refer to a floor above a base. Stairs may lead up to the double doors and on the opposite end to the Splitter and Breakers/Disconnects. The booster skid (frame 16) with the fans is shown as a separate component in which the seacan sits on top but it can also be built into the skid.

In the claims, the word "comprising" is used in its inclusive sense and does not exclude other elements being present. The indefinite articles "a" and "an" before a claim feature do not exclude more than one of the feature being present. Each one of the individual features described here may be used in one or more embodiments and is not, by virtue only of being described here, to be construed as essential to all embodiments as defined by the claims.

The invention claimed is:

1. A portable blockchain mining system comprising:
a portable building;
a plurality of blockchain mining processors mounted within an interior of the portable building;
an air inlet defined in the portable building;
an air outlet defined in at least one side wall of the portable building above the air inlet and oriented to direct exhaust air out of the portable building;
a cooling fan connected to convey air through the air inlet, across the plurality of blockchain mining processors and out the air outlet; and
an exhaust guide mounted to an exterior of, or forming part of, the at least one side wall and adjacent to the air outlet;
in which the exhaust guide is configurable between:
an upward position where the exhaust guide directs the exhaust air in an upward direction; and
a recirculation position where the exhaust guide directs the exhaust air in a downward direction toward the air inlet.

2. The portable blockchain mining system of claim 1 in which the air outlet is oriented to direct the exhaust air in an upward direction out of the portable building.

3. The portable blockchain mining system of claim 1 in which:
a first group of the plurality of blockchain mining processors are mounted adjacent a first side wall of the at least one side wall of the portable building;
a second group of the plurality of blockchain mining processors are mounted adjacent a second side wall of the at least one side wall of the portable building, the second side wall opposed to the first side wall, with an aisle defined between the first group and the second group; and
the first group and the second group are mounted on a first rack and a second rack, respectively, with the aisle defined between the first rack and the second rack.

4. The portable blockchain mining system of claim 1 in which the air inlet is defined in the at least one side wall or another side wall of the portable building.

5. The portable blockchain mining system of claim 4 in which the air outlet is defined in the at least one side wall of the portable building, and the cooling fan comprises a plurality of processor fans, with each blockchain mining processor of the plurality of blockchain mining processors having associated with it a processor fan of the plurality of processor fans, which are oriented to direct the air from a center of the interior of the portable building laterally across the respective blockchain mining processor of the plurality of blockchain mining processors and toward the air outlet in the at least one side wall.

6. The portable blockchain mining system of claim 4 further comprising a security grating defining the air inlet in the at least one side wall or the another side wall, and an air filter positioned across the security grating; and
the air filter is mounted adjacent an exterior of the security grating, with the portable blockchain mining system structured to permit access to the air filter from outside the portable blockchain mining system.

7. The portable blockchain mining system of claim 4 in which the air outlet and the air inlet are defined in a same side wall or side walls of the at least one side wall of the portable building.

8. The portable blockchain mining system of claim 7 in which the plurality of blockchain mining processors are mounted adjacent the air outlet above the air inlet.

9. The portable blockchain mining system of claim 7 in which the portable building is structured such that in use the air moves in sequence:
into the portable building through the air inlet;
below the plurality of blockchain mining processors toward a center of the interior of the portable building; and
up and laterally over the plurality of blockchain mining processors and out the air outlet in the at least one side wall.

10. The portable blockchain mining system of claim 9 in which the air outlet and the air inlet are oriented in the recirculation position to recirculate the exhaust air from the air outlet back into the air inlet.

11. The portable blockchain mining system of claim 7 in which the cooling fan is mounted adjacent the air outlet to pull the air through the interior to the air outlet.

12. The portable blockchain mining system of claim 7 in which the cooling fan is mounted adjacent the air inlet to push the air through the interior to the air outlet.

13. The portable blockchain mining system of claim 1 in which a roof of the portable building defines a second air outlet or a roof air passage to the second air outlet.

14. The portable blockchain mining system of claim 13 in which a floor of the portable building defines the air inlet or a floor air passage to the air inlet.

15. The portable blockchain mining system of claim 1 in which:
a floor of the portable building defines the air inlet or a floor air passage to the air inlet; and
the portable building comprises an upper frame and a lower frame separated by the floor, with the plurality of blockchain mining processors mounted within the upper frame.

16. The portable blockchain mining system of claim 15 in which the cooling fan is mounted adjacent the floor to push air through the air inlet or the floor air passage into the interior.

17. The portable blockchain mining system of claim 15 in which the air inlet is defined in a side wall of the lower frame.

18. The portable blockchain mining system of claim 17 in which the side wall of the lower frame is a first side wall, and a second air inlet is defined in a second side wall of the lower frame, the second side wall being opposed to the first side wall.

19. The portable blockchain mining system of claim 15 in which the air outlet is defined in at least one side wall of the upper frame.

20. The portable blockchain mining system of claim 19 in which each of the blockchain mining processors has associated with it a processor fan, which is oriented to direct air from a center of the interior laterally across a respective one of the blockchain mining processors and toward the air outlet in the at least one side wall of the upper frame.

21. The portable blockchain mining system of claim 19 in which the at least one side wall of the upper frame comprises a louver panel across the air outlet.

22. The portable blockchain mining system of claim 19 in which at least 75% of a total external surface area of the at least one side wall of the upper frame forms the air outlet.

23. The portable blockchain mining system of claim 19 in which the at least one side wall of the upper frame is a first side wall, and a second air outlet is defined in a second side wall of the of the upper frame, the second side wall of the upper frame being opposed to the first side wall of the upper frame.

24. The portable blockchain mining system of claim 1 in which at least 20% of a total external surface area of a floor of the portable building, or the at least one side wall or another side wall, forms the air inlet.

25. The portable blockchain mining system of claim 1 in which the exhaust guide comprises a scoop or baffle that extends laterally outward from the exterior of the at least one side wall and has an open top end that defines the air outlet.

26. The portable blockchain mining system of claim 25 in which the exhaust guide is further configurable to be moveable between an open position, and a closed position where the exhaust guide is laterally retracted adjacent or into the exterior of the at least one side wall.

27. A plurality of the portable blockchain mining systems of claim 1 positioned laterally adjacent one another in close proximity.

28. The portable blockchain mining system of claim 1 in which the cooling fan comprises a plurality of processor fans, with each blockchain mining processor of the plurality of blockchain mining processors having associated with it a processor fan of the plurality of processor fans.

29. A system comprising the portable blockchain mining system of claim 1, and a power source connected to supply power to the portable blockchain mining system.

30. The system of claim 29 in which:
the power source comprises:
a source of combustible gas produced from an oil production, storage, or processing facility; and
a generator connected to the source of combustible gas.

31. A method comprising operating the plurality of blockchain mining processors of the portable blockchain mining system of claim 1 to process mining transactions.

32. A modular data center comprising a plurality of the portable blockchain mining systems of claim 1.

33. A method comprising:
operating a plurality of blockchain mining processors mounted within an interior of a portable building; and
operating a cooling fan to convey air in sequence:
through an air inlet into the interior of the portable building;
across the plurality of blockchain mining processors; and
out of the portable building through an air outlet that is above the air inlet, in which an exhaust guide is mounted to an exterior of, or forms part of, a side wall of the portable building and adjacent to the air outlet, in which the exhaust guide is configurable between:
an upward position where the exhaust guide directs the air in an upward direction; and
a recirculation position where the exhaust guide directs the air in a downward direction toward the air inlet.

34. The method of claim 33 in which the exhaust guide is positioned in the upward position to convey the air through the air outlet and in the upward direction outside of and away from the portable building.

35. The method of claim 33 in which the exhaust guide is positioned in the recirculation position to direct the air to recirculate back into the interior of the portable building through the air inlet.

\* \* \* \* \*